(12) United States Patent
Jeon et al.

(10) Patent No.: US 12,336,375 B2
(45) Date of Patent: Jun. 17, 2025

(54) DISPLAY DEVICE AND METHOD FOR PROVIDING THE SAME

(71) Applicant: Samsung Display Co., LTD., Yongin-si (KR)

(72) Inventors: Yong Chan Jeon, Cheonan-si (KR); Hirotsugu Kishimoto, Hwaseong-si (KR); Da Som Gu, Asan-si (KR); Jeong Il Yoo, Seoul (KR); Jang Doo Lee, Hwaseong-si (KR); Chul Ho Jeong, Seoul (KR); Hyun Been Hwang, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 659 days.

(21) Appl. No.: 17/472,911

(22) Filed: Sep. 13, 2021

(65) Prior Publication Data
US 2022/0271253 A1   Aug. 25, 2022

(30) Foreign Application Priority Data
Feb. 25, 2021   (KR) .................. 10-2021-0025304

(51) Int. Cl.
*H10K 102/00*   (2023.01)
*B32B 3/04*   (2006.01)
(Continued)

(52) U.S. Cl.
CPC .............. *H10K 50/841* (2023.02); *B32B 3/04* (2013.01); *B32B 3/08* (2013.01); *B32B 7/022* (2019.01);
(Continued)

(58) Field of Classification Search
CPC .. B32B 7/022; B32B 7/12; B32B 3/04; B32B 3/08; B32B 2307/51; B32B 2457/20;
(Continued)

(56) References Cited

U.S. PATENT DOCUMENTS

| 10,211,421 B2 | 2/2019 | Lee et al. |
| 2017/0179424 A1 | 6/2017 | Lee et al. |

(Continued)

FOREIGN PATENT DOCUMENTS

| KR | 1020150125971 A | 11/2015 |
| KR | 1020160088524 A | 7/2016 |
| KR | 1020190058491 A | 5/2019 |

*Primary Examiner* — Laura C Powers
(74) *Attorney, Agent, or Firm* — CANTOR COLBURN LLP

(57) ABSTRACT

A display device includes a display area and a non-display area which is adjacent to the display area. The display device includes a display panel, and a cover window structure which is on the display panel. The cover window structure includes a cover window including a first surface facing the display panel, a second surface opposite to the first surface, and a third surface connecting the first surface with the second surface, and a first window protection layer on the cover window. The first window protection layer includes a first protection portion on the first surface of the cover window and a second protection portion on the third surface of the cover window, where the second protection portion is in the non-display area.

16 Claims, 50 Drawing Sheets

(51) Int. Cl.
  *H10K 50/84* (2023.01)
  *H10K 59/80* (2023.01)
  *B32B 3/08* (2006.01)
  *B32B 7/022* (2019.01)
  *B32B 7/12* (2006.01)

(52) U.S. Cl.
  CPC ............. *B32B 7/12* (2013.01); *B32B 2307/51* (2013.01); *B32B 2457/20* (2013.01); *H10K 59/87* (2023.02); *H10K 2102/311* (2023.02)

(58) Field of Classification Search
  CPC .. H01K 2102/311; H01K 59/87; G09F 9/301; G06F 1/1652
  See application file for complete search history.

(56) References Cited

U.S. PATENT DOCUMENTS

| | | | |
|---|---|---|---|
| 2019/0050027 A1 | 2/2019 | Chang et al. | |
| 2019/0377386 A1* | 12/2019 | Heo | G06F 1/1637 |
| 2021/0289648 A1* | 9/2021 | Lee | H05K 5/03 |
| 2021/0360809 A1* | 11/2021 | Ahn | H05K 5/0017 |

\* cited by examiner

230: 231, 232, 233
CWS: 220, 230

230_1: 231_1, 232_1, 233_1
CWS_1: 220, 230_1

230_2: 231_2, 232_2, 233_2, 234_2, 235_2
CWS_2: 220, 230_2

230_3: 231_3, 232_3, 233_3
CWS_3: 220, 230_3

230_3: 231_3, 232_3, 233_3
CWS_3: 220, 230_3

230a_4: 231a_4, 232a_4, 233a_4
230b_4: 231b_4, 232b_4, 233b_4
230_4: 230a_4, 230b_4, 230c_4

230a_5: 231a_5, 232a_5, 233a_5
230b_5: 231b_5, 233b_5
230_5: 230a_5, 230b_5, 230c_5

230a_6: 231a_6, 232a_6, 233a_6
230b_6: 231b_6, 232b_6, 233b_6
230_6: 230a_6, 230b_6, 230c_6

DISPLAY DEVICE AND METHOD FOR PROVIDING THE SAME

This application claims priority to Korean Patent Application No. 10-2021-0025304, filed on Feb. 25, 2021, and all the benefits accruing therefrom under 35 U.S.C. § 119, the disclosure of which is incorporated herein by reference in its entirety.

BACKGROUND

1. Field

The present disclosure relates to a display device, and a method of providing the same.

2. Description of the Related Art

Display devices become more and more important as multimedia technology evolves. Accordingly, a variety of types of display devices such as organic light-emitting display (OLED) devices and liquid-crystal display (LCD) devices have been developed. Such display devices find a variety of applications including mobile electronic devices, e.g., portable electronic devices such as smart phones, smart watches and tablet personal computers (PCs).

A foldable display device is attracting attention as having a wide screen and ease of portability. A foldable display device has shock resistance to protect a cover window of the display device from an external shock.

SUMMARY

Embodiments of the present disclosure provide a display device having a structure capable of effectively protecting a cover window from an external shock via a thermocompression bonding process, and a method for fabricating the display device.

According to one or more embodiment of the present disclosure, it is possible to effectively protect a cover window in a display device by using a cover window protection layer covering the upper surface and at least a part of the side surface of the cover window. In addition, the cover window and the cover window protection layer can be coupled with each other via a simpler thermocompression bonding process.

A display device includes a display area and a non-display area which is adjacent to the display area, a display panel in both the display area and the non-display area, and a cover window structure facing the display panel, the cover window structure in both the display area and the non-display area. The cover window includes a cover window including a first surface, a second surface which is opposite to the first surface and closer to the display panel than the first surface, and a third surface which is in the non-display area and connects the first surface with the second surface, and a first window protection layer on the cover window. The first window protection layer includes a first protection portion on the first surface of the cover window, and a second protection portion on the third surface of the cover window which is in the non-display area.

A display device includes a display area and a non-display area which is adjacent to the display area, a display panel in both the display area and the non-display area, and a cover window structure facing the display pane. The cover window structure is in both the display area and the non-display area and includes a cover window including a first surface, a second surface which is opposite to the first surface and closer to the display panel than the first surface, and a third surface which is in the non-display area and connects the first surface with the second surface, a first window protection layer on the first surface of the cover window, a second window protection layer on the second surface of the cover window and facing the first window protection layer with the cover window therebetween, and a third window protection layer which is in the non-display area and surrounds the cover window in a plan view. The third window protection layer is in contact with the third surface of the cover window and includes a material different from that of the first window protection layer and the second window protection layer.

A method for providing a display device includes providing a cover window including an upper surface and a side surface which extends from the upper surface, providing a cover window structure of the display device by thermocompression bonding of a cover window protection material to the cover window to provide a cover window protection layer which is thermocompression bonded to the cover window, and providing the cover window structure attached to a display panel of the display device. The thermocompression bonding provides the cover window protection layer covering the side surface of the cover window within the cover window structure.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the invention will become more apparent by describing in detail embodiments thereof with reference to the attached drawings, in which.

DETAILED DESCRIPTION

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that when a layer is referred to as being related to another element such as being "on" another layer or substrate, it can be directly on the other layer or substrate, or intervening layers may also be present. In contrast, when an element is referred to as being related to another element such as being "directly on" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Hereinafter, embodiments will be described with reference to the accompanying drawings.

Figure 1:
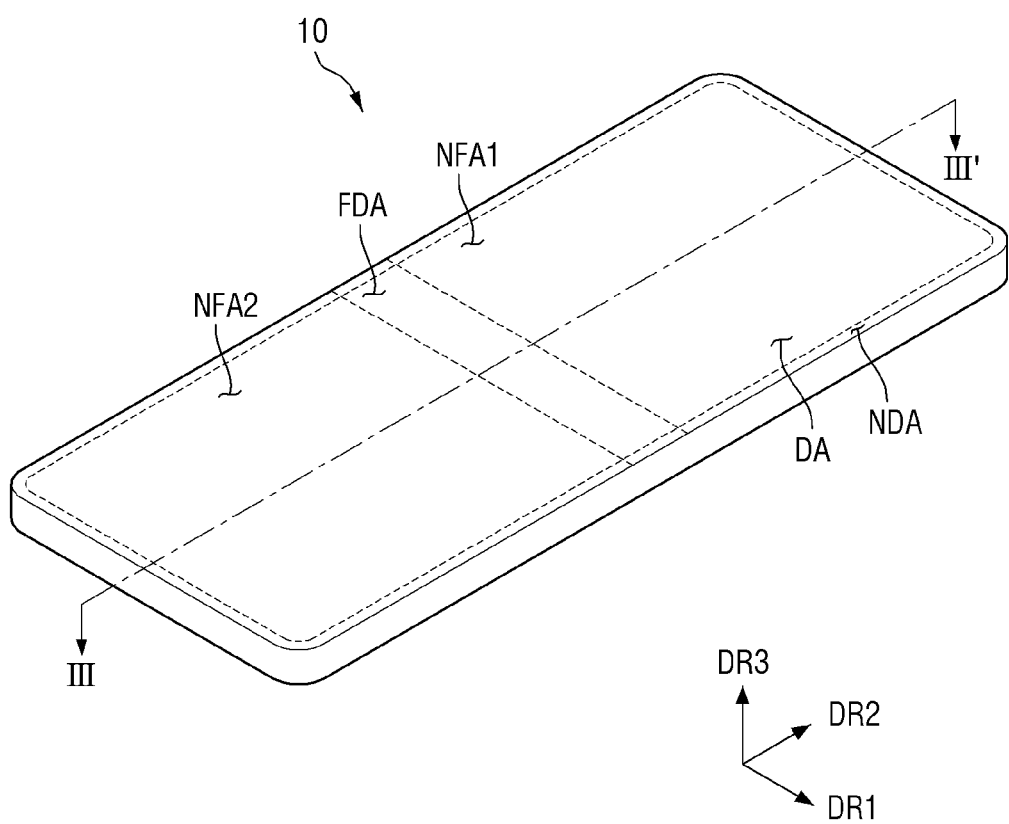
FIG. 1 is a perspective view of an embodiment of a display device which is unfolded.
Figure 2:
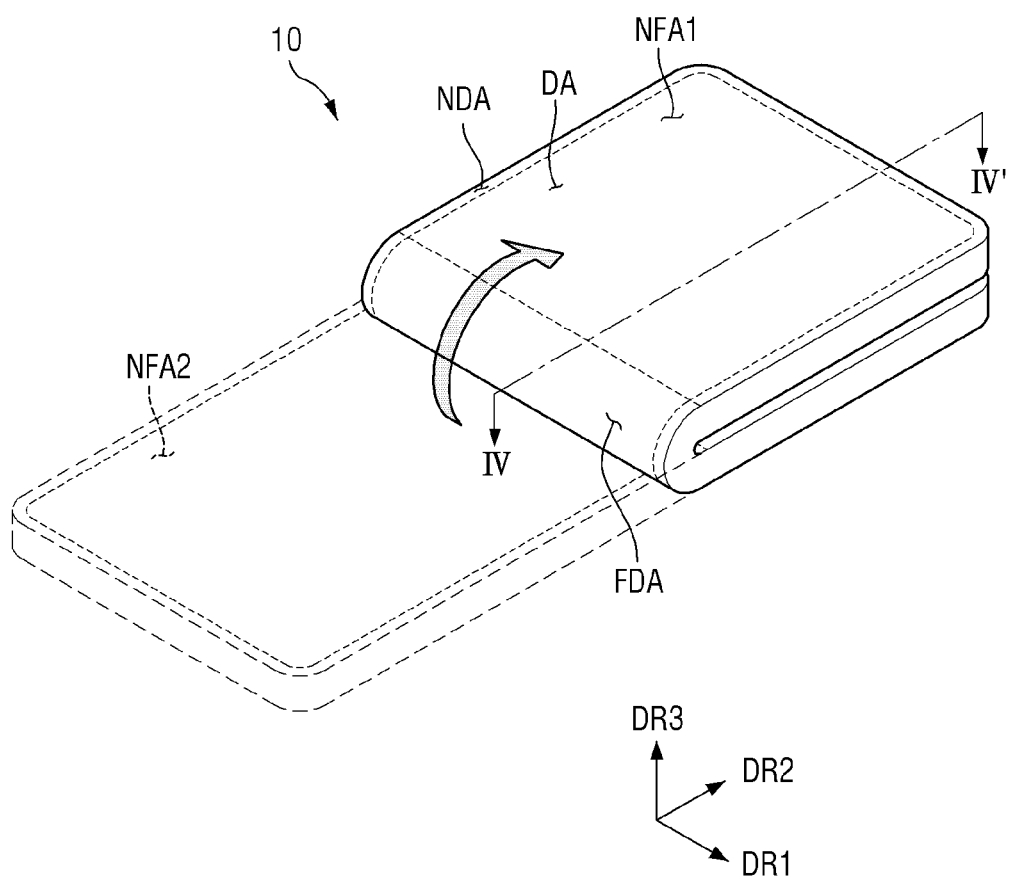
FIG. 2 is a perspective view of an embodiment of the display device which is folded.

FIG. 1 is a perspective view of an embodiment of a display device 10 which is unfolded. FIG. 2 is a perspective view of an embodiment of the display device 10 which is folded.

Referring to FIG. 1, a display device 10 may be a foldable display device. In the example shown in the drawings, the display device 10 is employed by a smartphone, but the disclosure is not limited thereto. In an embodiment, for example, the display device 10 may be applied to a mobile phone, a tablet personal computer (PC), a personal digital assistant (PDA), a portable multimedia player (PMP), a television set, a game machine, a wristwatch-type electronic device, a head-mounted display, a personal computer monitor, a laptop computer, a car navigation system, a car instrument cluster, a digital camera, a camcorder, an outdoor billboard, an electronic billboard, various medical apparatuses, various home appliances such as a refrigerator and a laundry machine, Internet of things (IoT) devices, etc., in addition to a smart phone. Hereinafter, embodiments will be described with reference to the accompanying drawings.

As shown in FIGS. 1 and 2, a first direction DR1 may refer to a direction parallel to a first side of the display device 10, for example, the horizontal direction of the display device 10 when viewed from the top. A second direction DR2 may refer to a direction parallel to a second side of the display device 10 that meets the first side of the display device 10, for example, the vertical direction of the display device 10 when viewed from the top. A third direction DR3 may refer to a thickness direction of the display device 10, for example, a view from the top (e.g., a plan view).

According to an embodiment, the display device 10 may have a rectangular shape when viewed from the top. The display device 10 may have a rectangular shape with sharp corners (e.g., sides meet at approximately 90 degrees) or a rectangular shape with rounded corners when viewed from the top. The display device 10 may include two shorter sides extended in or along the first direction DR1 and two longer sides extended in or along the second direction DR2, when viewed from the top.

The display device 10 includes a display area DA and a non-display area NDA. The planar shape of the display area DA may conform or correspond to the planar shape of the display device 10 when viewed from the top. In an embodiment, for example, when the display device 10 is rectangular when viewed from the top, the display area DA may also be rectangular.

The display area DA may include a plurality of pixels to display images (e.g., display pixel or display element). The plurality of pixels may be arranged in a matrix pattern. A planar shape of a pixel among the plurality of pixels may be, but is not limited to, a rectangle, a diamond, or a square when viewed from the top. In an embodiment, for example, a planar shape of pixels among the plurality of pixels may be a quadrangle other than a rectangle, a diamond or a rectangle, a polygon other than a quadrangle, a circle, or an ellipse when viewed from the top.

The non-display area NDA may not include pixels and thus may not display images. The non-display area NDA may be disposed adjacent to or around the display area DA. The non-display area NDA may be disposed to surround the display area DA as shown in FIGS. 1 and 2, but is not limited thereto. The display area DA may be partially surrounded by the non-display area NDA.

The display device 10 includes an uppermost surface (e.g., display surface) which is a surface furthest along the third direction DR3 in FIG. 1, and a lowermost surface opposite to the display surface. According to an embodiment, the display device 10 may be foldable and unfoldable and remain folded as well as unfolded. The display device 10 may be folded inward (in-folding manner) so that the display area DA is located inside, as shown in FIG. 2. When the display device 10 is folded inward (in-folding), a part of the uppermost surface of the display device 10 may face another part thereof. As another example, the display device 10 may be folded outward (out-folding) so that the display area DA is located outside. When the display device 10 is folded outward, a part of the lowermost surface of the display device 10 may face another part thereof.

According to an embodiment, the display device 10 may be a foldable device. As used herein, a foldable device refers to a display device 10 that can be folded (e.g., is foldable) and can be switched between a folded state and an unfolded state. When a device is folded, the device is typically folded at an angle of approximately 180 degrees)(°, however, is not limited thereto. In an embodiment, for example, when a device is folded at an angle greater than or less than 180°, e.g., at an angle of 90° or more but less than 180° or an angle of 120° or more and less than 180°, the device is also referred to as being folded. In addition, even when a device is not completely folded, the device may be referred to as being folded if the device is not unfolded but is somewhat bent. In an embodiment, for example, even if a device is bent at an angle of 90 degrees or less, the device may be referred to as being folded in order to distinguish it from being unfolded as long as the maximum folding angle is 90 degrees or more. When the display device 10 is folded, the radius of curvature may be approximately 5 millimeters (mm) or less, such as in the range of approximately 1 millimeter (mm) to approximately 2 mm, or may be approximately 1.5 mm. It should be understood that the invention is not limited thereto.

According to an embodiment, the display device 10 may include a folding area FDA, and a non-folding area provided in plural including a first non-folding area NFA1 and a second non-folding area NFA2. The display device 10 is foldable at the folding area FDA, and may be unfoldable at the first non-folding area NFA1 and the second non-folding area NFA2.

The first non-folding area NFA1 may be disposed on one side, for example, the upper side of the folding area FDA. The second non-folding area NFA2 may be disposed on the other side (e.g., an opposing side), for example, the lower side of the folding area FDA. The display device 10 which is folded may define the folding area FDA as a curved area with a predetermined curvature.

According to an embodiment, the position of the folding area FDA in the display device 10 may be determined. In the display device 10, one or more folding areas FDA may be located at various positions. According to another embodiment, the position of the folding area FDA may not be determined in the display device 10 but may be freely determined (e.g., variable) at different areas.

According to an embodiment, the display device 10 may be foldable in the second direction DR2 with respect to a folding axis which is extended along the first direction DR1. Accordingly, the length of the display device 10 in the second direction DR2 may be reduced to about half, so that the display device 10 is easy to carry.

According to an embodiment, the folding direction of the display device 10 is not limited to the second direction DR2. In an embodiment, for example, the display device 10 may be foldable in the first direction DR1 with respect to a folding axis which is extended along the second direction DR2. In such case, the length of the display device 10 in the first direction DR1 may be reduced to about half.

In FIGS. 1 and 2, each of the display area DA and the non-display area NDA overlaps the folding area FDA, the first non-folding area NFA1 and the second non-folding area NFA2, however, is not limited thereto. In an embodiment, for example, each of the display area DA and the non-display area NDA may overlap at least one of the folding area FDA, the first non-folding area NFA1, and the second non-folding area NFA2.

Figure 3:
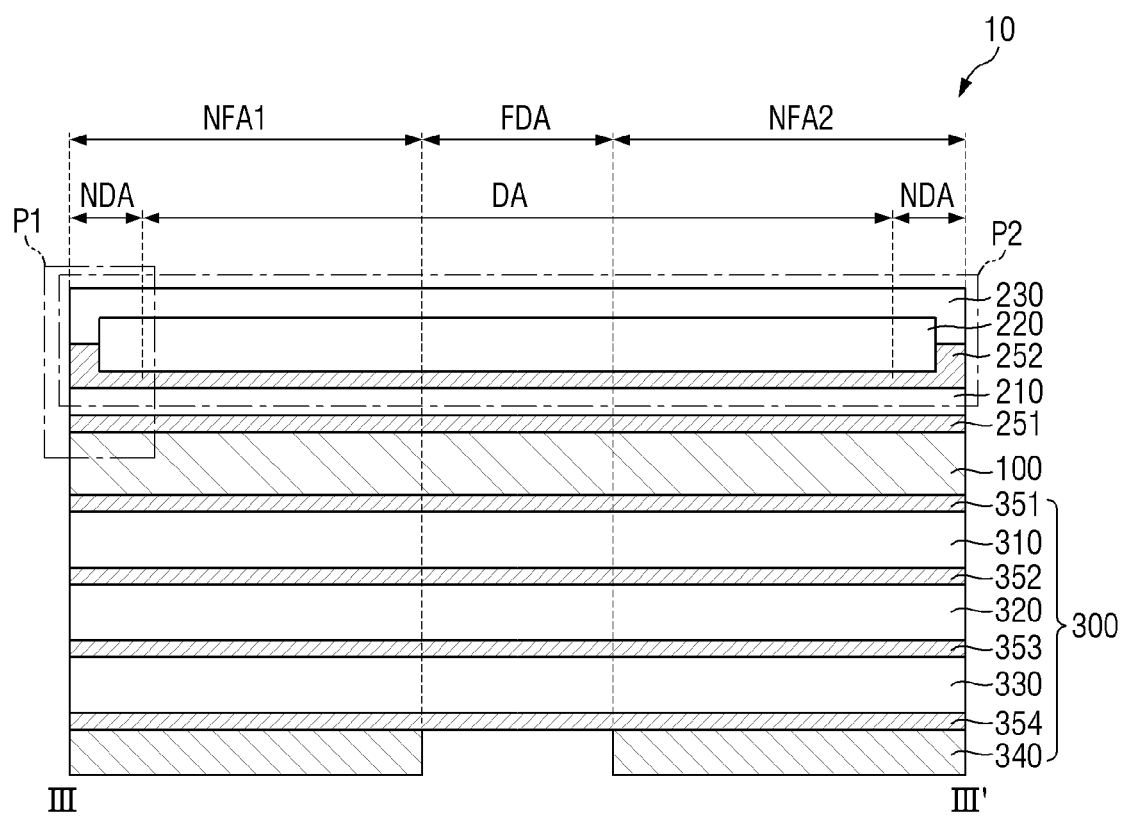
FIG. 3 is a cross-sectional view taken along line III-III' of FIG. 1.
Figure 4:
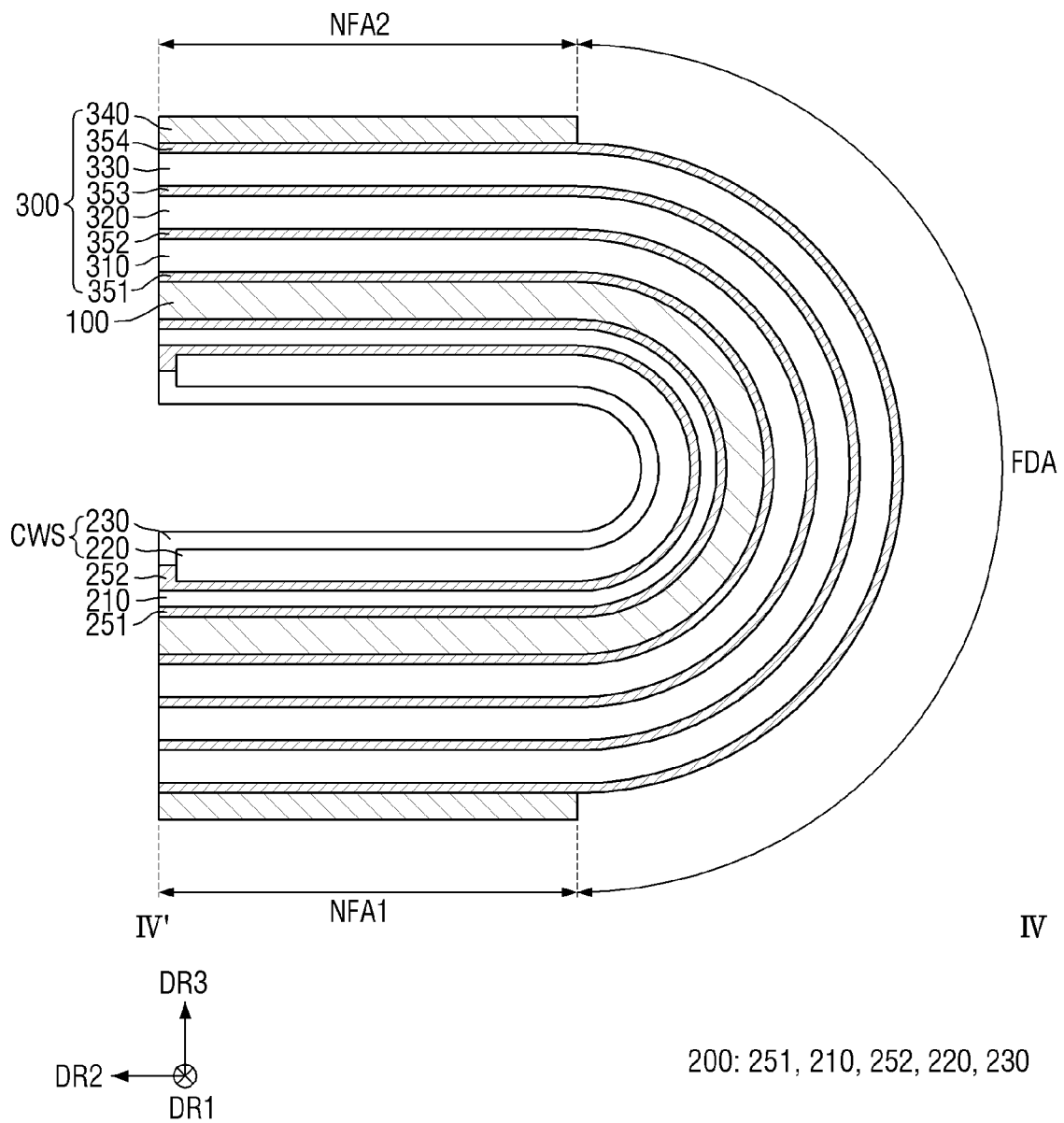
FIG. 4 is a cross-sectional view taken along line IV-IV' of FIG. 2.

FIG. 3 is a cross-sectional view taken along line III-III' of FIG. 1. FIG. 4 is a cross-sectional view taken along line IV-IV' of FIG. 2. Specifically, FIG. 3 is a cross-sectional view of a display device 10 which is unfolded. FIG. 4 is a cross-sectional view of a display device 10 which is folded.

Referring to FIGS. 3 and 4, the display device 10 may include a display panel 100, a front stack structure 200 disposed on the front side of the display panel 100, and a rear stack structure 300 disposed on the rear side of the display panel 100. Each of the stack structures 200 and 300 may include one or more coupling members 251, 252, and 351 to 354. As used herein, the front side of the display panel 100 refers to the side where the display panel 100 displays images such as including the display screen, while the rear side thereof refers to the side opposite to the front side. A first surface of the display panel 100 is located on the front side, while a second surface of the display panel 100 is located on the rear side.

The display panel 100 displays images and may include a self-luminous display panel such as an organic light-emitting display panel (OLED), an inorganic light-emitting display panel (inorganic ELD), a quantum-dot light-emitting display panel (QED), a micro light emitting diode display panel (micro-LED), a nano LED display panel (nano-LED), a plasma display panel (PDP), a field emission display panel (FED) and a cathode ray display panel (CRT), as well as a light-receiving display panel such as a liquid-crystal display panel (LCD) and an electrophoretic display panel (EPD). In the following description, an organic light-emitting display panel will be described as an example of the display panel 100, and the organic light-emitting display panel will be simply referred to as the display panel 100 unless it is necessary to distinguish them. It is, however, to be understood that the embodiments are not limited to the organic light-emitting display panel, and any other display panel listed above or well known in the art may be employed without departing from the scope of the invention.

Figure 5:
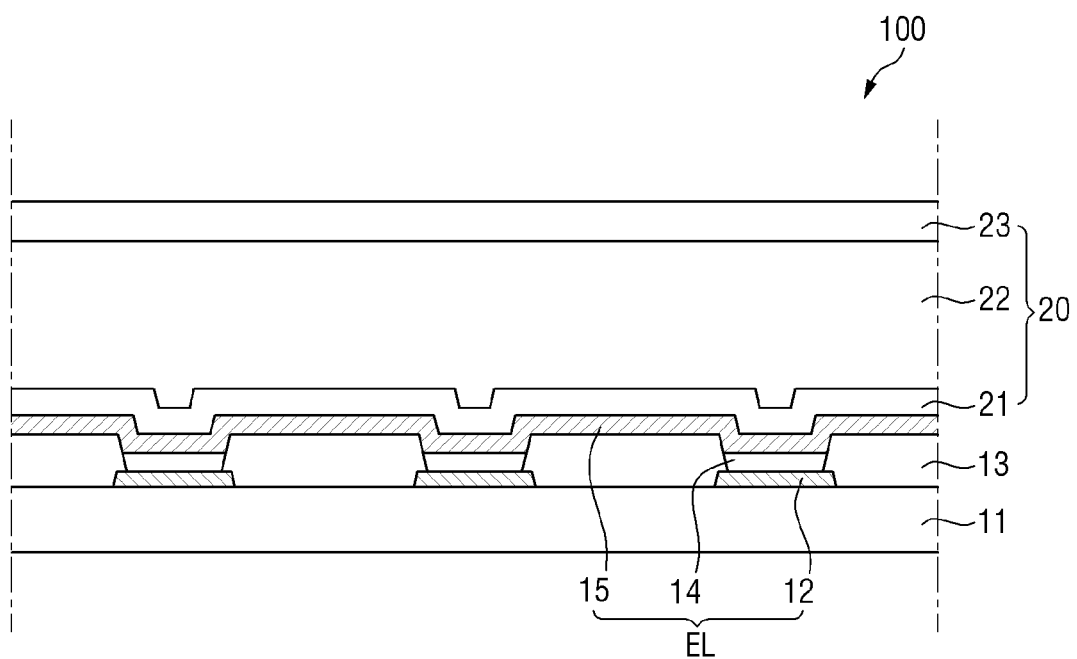
FIG. 5 is a cross-sectional view of an embodiment of a display panel.

FIG. 5 is a cross-sectional view of an embodiment of a display panel 100.

Referring to FIG. 5, the display device 10 may include a display panel 100. The display panel 100 may include a base substrate 11, a first electrode 12, a pixel-defining layer 13, an emission layer 14, a second electrode 15, and an encapsulation layer 20.

The base substrate 11 may be an insulating substrate. The base substrate 11 may be flexible and may include a polymer material having flexibility.

The first electrode 12 may be disposed on the base substrate 11. According to an embodiment, the first electrode 12 may be an anode electrode. Although not shown in the drawings, a plurality of elements may be further disposed between the base substrate 11 and the first electrode 12. In an embodiment, for example, the elements may include a buffer layer, a plurality of conductive wirings, an insulating layer, a plurality of thin-film transistors, etc.

The pixel-defining layer 13 may be disposed on the first electrode 12. The pixel-defining layer 13 may include or define an opening exposing at least a portion of the first electrode 12.

The emission layer 14 may be disposed on the first electrode 12. The emission layer 14 may be, but is not limited to, an organic emission layer including or made up of a single layer or multiple layers.

The second electrode 15 may be disposed on the emission layer 14 and the pixel-defining layer 13. In an embodiment, for example, the second electrode 15 may be disposed on an entirety of the emission layer 14 and the pixel-defining layer 13. In some embodiments, the second electrode 15 may be a cathode electrode.

The first electrode 12, the second electrode 15 and the emission layer 14 may form a light-emitting element EL.

The encapsulation layer 20 may be disposed on the light-emitting element EL. The encapsulation layer 20 can seal the light-emitting element EL and reduce or effectively prevent moisture or the like from permeating into the light-emitting element EL from outside the light-emitting element EL. According to an embodiment, the encapsulation layer 20 may be implemented as a thin-film encapsulation layer and may include one or more organic layers and one or more inorganic layers. In an embodiment, for example, the encapsulation layer 20 may include a first inorganic layer 21 disposed on the second electrode 15, an organic layer 22 disposed on the first inorganic layer 21, and a second inorganic layer 23 disposed on the organic layer 22.

Referring again to FIGS. 3 and 4, the front stack structure 200 may be disposed on the front side of the display panel 100. The front stack structure 200 may include a polarizing member 210, a cover window 220 and a cover window protection layer 230 (e.g., first window protection layer) sequentially stacked on one another from the display panel 100 toward the front side. The cover window 220 and the cover window protection layer 230 may form a cover window structure CWS.

The polarizing member 210 may polarize the light passing therethrough. The polarizing member 210 can reduce the reflection of external light. In an embodiment, the polarizing member 210 may be a polarizing film. The polarizing film may include protective substrates and a polarizing layer which is sandwiched between the protective substrates. The polarizing layer may include a polyvinyl alcohol film.

The cover window 220 may be disposed on the front side of the polarizing member 210. The cover window 220 serves to protect the display panel 100. The cover window 220 may be made of a transparent material. The cover window 220 may include, for example, ultra-thin glass (UTG) or thin glass. Ultra-thin glass (UTG) may be tempered to have a certain stress profile therein. The tempered ultra-thin glass (UTG) can better reduce or effectively prevent cracks from occurring and propagating, breakage due to external shock, etc., compared to the ultra-thin glass (UTG) before it is tempered. The ultra-thin glass (UTG) tempered via a tempering process may have different stresses for different regions.

When the glass is formed as ultra-thin glass or thin glass, it may have flexibility and may be curvable, bendable, foldable or rollable. The thickness of the glass may be, for example, in the range of approximately 10 micrometers (μm) to approximately 300 μm, such as approximately 10 μm to approximately 100 μm or approximately 50 μm.

The glass of the cover window 220 may include soda lime glass, alkali alumino silicate glass, borosilicate glass, or lithium alumina silicate glass. The glass of the cover window 220 may include chemically or thermally tempered glass to have a high strength.

A cover window protection layer 230 may be disposed on the front side of the cover window 220. The cover window protection layer 230 may perform at least one of functions of anti-scattering when the cover window 220 is broken, shock absorption, anti-scratch, anti-fingerprint, and anti-glare. The cover window protection layer 230 may include a transparent polymer film. The transparent polymer film may include at least one of an epoxy resin, polyurethane, polyester, polyethylene terephthalate, polyethylene naphthalate, polyimide, polyarylate, polycarbonate, polymethyl methacrylate, ethyl vinyl acetate, and polyamide resin.

The cover window 220 and the cover window protection layer 230 may be coupled with each other via a thermo-compression bonding process. That is to say, a bonding force may be provided or formed between the cover window 220 and the cover window protection layer 230 by the thermo-compression bonding process. The bonding force between the cover window 220 and the cover window protection layer 230, e.g., the adhesive force of the cover window protection layer 230 to the cover window 220 may be approximately 1,500 grams force per inch (gf/inch) to approximately 5,000 gf/inch.

The front stack structure 200 may include front coupling members 251 and 252 each respectively coupling adjacent elements to one another. A first coupling member 251 may be disposed between the polarizing member 210 and the display panel 100 to couple these adjacent elements to each other. A second coupling member 252 may be disposed between the polarizing member 210 and the cover window 220 to couple these adjacent elements to each other. That is to say, the front coupling members 251 and 252 are for attaching the layers to the first surface of the display panel 100. The first coupling member 251 may be a polarizing member coupling member for attaching the polarizing member 210, and the second coupling member 252 may be a window coupling member for attaching the cover window 220. All of the front coupling members 251 and 252 may be optically transparent.

Although the edge of the cover window 220 is positioned inside the edge of the display panel 100 (e.g., spaced apart from the edge of the display panel 100) in the example shown in FIG. 3 for convenience of illustration, the edge of the cover window 220 may protrude further than the edge of the display panel 100.

The rear stack structure 300 is disposed on the rear side of the display panel 100. The rear stack structure 300 may include a polymer film layer 310, a cushion layer 320, a plate 330, and a heat dissipation member 340 sequentially stacked from the display panel 100 toward the rear side.

The polymer film layer 310 may include a polymer film. The polymer film layer 310 may include a functional layer on at least one surface. The functional layer may include, e.g., a light-absorbing layer. The light-absorbing layer may include a light-absorbing material such as a black pigment and dye.

The cushion layer 320 may be disposed on the rear side of the polymer film layer 310. The cushion layer 320 may absorb an external shock to reduce or effectively prevent the display panel 100 from being damaged. The cushion layer 320 may be made up of a single layer or multiple layers stacked on one another. The cushion layer 320 may include a material having elasticity.

The plate 330 may be disposed on the rear side of the cushion layer 320. The plate 330 may be a support member for coupling the display device 10 with a case. The plate 330 may include a material having rigidity. According to an embodiment, the plate 330 may be made of a single metal or a metal alloy such as stainless steel (SUS).

The heat dissipation member 340 may be disposed on the rear side of the plate 330. The heat dissipation member 340 serves to diffuse heat generated from the display panel 100 or other elements of the display device 10. The heat dissipation member 340 may include a metal plate. The metal plate may include, for example, a metal having excellent thermal conductivity such as copper and silver. The heat dissipation member 340 may be a heat dissipation sheet including graphite or carbon nanotubes.

Although not limited thereto, the heat dissipation member 340 may be disconnected at the folding area FDA in order to facilitate the folding of the display device 10 as shown in FIGS. 3 and 4. In an embodiment, for example, a first metal plate may be disposed in the first non-folding area NFA1, and a second metal plate may be disposed in the second non-folding area NFA2. The first metal plate and the second metal plate may be physically spaced apart from each other with respect to the folding area FDA.

The rear stack structure 300 may include rear coupling members 351 to 354 that couple adjacent elements to one another. In an embodiment, for example, a third coupling member 351 may be disposed between the display panel 100 and the polymer film layer 310 to couple these adjacent elements to each other, a fourth coupling member 352 may be disposed between the polymer film layer 310 and the cushion layer 320 to combine them, a fifth coupling member 353 may be disposed between the cushion layer 320 and the plate 330 to couple these adjacent elements to each other, and a sixth coupling member 354 may be disposed between the plate 330 and the heat dissipation member 340 to couple these adjacent elements to each other. That is to say, the rear coupling members 351 to 354 may be the elements for attaching the layers to the second surface of the display panel 100, the third coupling member 351 may be a polymer film coupling member for attaching the polymer film layer 310, the fourth coupling member 352 may be a cushion layer coupling member for attaching the cushion layer 320, the fifth coupling member 353 may be a plate coupling member for attaching the plate 330, and the sixth coupling member 354 may be a heat dissipation member coupling member for attaching the heat dissipation member 340. When the heat dissipation member 340 is disconnected at the folding area FDA, the sixth coupling member 354 may also be disconnected in the same manner, but as shown in FIG. 3, the non-folding areas NFA1 and NFA2 may be connected as a single piece by other layers.

When the display device 10 displays images only at the front side, the rear coupling members 351 to 354 may not necessarily be optically transparent, unlike the front coupling members 251 and 252.

Each of the front coupling members 251 and 252 and the rear coupling members 351 to 354 described above may include an adhesive material. Each of the coupling members may include an optically clear resin (OCR). The coupling members may have the same composition or may have different compositions depending on their positions and the elements to couple.

Figure 6:
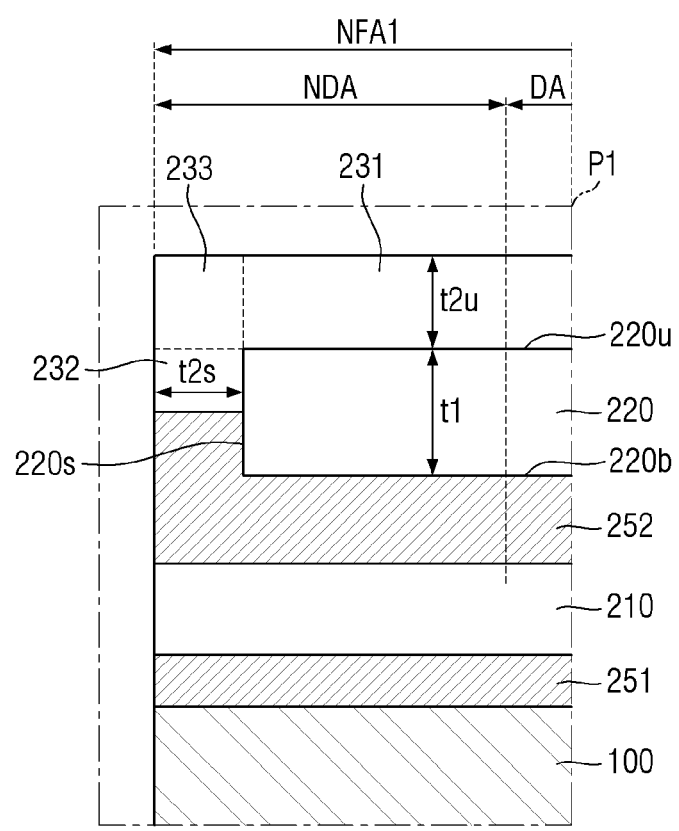
FIG. 6 is an enlarged view of an embodiment of area P1 of FIG. 3.

FIG. 6 is an enlarged view of an area P1 of FIG. 3.

Referring to FIG. 6 in conjunction with FIG. 3, the cover window 220 may include an upper surface 220u (e.g., cover window upper surface) disposed toward the front side, a lower surface 220b (e.g., cover window lower surface) that is opposite to the upper surface 220u, and a side surface 220s (e.g., cover window side surface) that connects the upper surface 220u with the lower surface 220b. The upper surface 220u (e.g., first surface) and the side surface 220s (e.g., third surface) meet each other at a corner of the cover window 220. The lower surface 220b (e.g., second surface) and the side surface 220s (e.g., third surface) meet at an edge of the cover window 220. The upper surface 220u and the lower surface 220b of the cover window 220 may face the display panel 100. The upper surface 220u and the lower surface 220b of the cover window 220 may be parallel to a plane of the display panel 100, such as a plane defined by the first direction DR1 and the second direction DR2 which cross each other.

The thickness t1 (e.g., first thickness) of the cover window 220 may be, for example, in the range of approximately 10 µm to approximately 300 µm, such as in the range of 25 approximately µm to approximately 125 µm.

According to an embodiment, the cover window protection layer 230 may be disposed along the upper surface 220u and along the side surface 220s of the cover window 220. Specifically, the cover window protection layer 230 may be disposed to cover the upper surface 220u and a portion of the side surface 220s of the cover window 220. As used herein, the phrase an element covers another element may mean not only that they are in contact with each other but also that they overlap each other in a direction perpendicular to the surface at which they are in contact with each other. As being in contact, elements may form an interface therebetween, without being limited thereto.

The cover window protection layer 230 may include a top protection portion 231 overlapping the upper surface 220u of the cover window 220, a side protection portion 232 overlapping the side surface 220s, and a corner protection portion 233 disposed between the top protection portion 231 and the side protection portion 232 in a direction along surfaces of the cover window 220. The corner protection portion 233 may define an upper edge of the display device 10 where a top surface and an outer side surface of the corner protection portion 233 meet each other. The upper edge of the display device 10 may have a sharp angle in cross-section (e.g., sides meet at approximately 90 degrees).

The top protection portion 231 may cover an entirety of the upper surface 220u of the cover window 220. The side protection portion 232 may partially cover the side surface 220s of the cover window 220. The side protection portion 232 may be located in the non-display area NDA.

The thickness t2u (e.g., second thickness) of the cover window protection layer 230 at the top protection portion 231 may be greater than the thickness t2s (e.g., third thickness) of the cover window protection layer 230 at the side protection portion 232, but is not limited thereto. The thickness t2u of the top protection portion 231 may be less than or equal to the thickness t2s of the side protection portion 232. The thickness t2u of the top protection portion 231 and the thickness t2s of the side protection portion 232 may be greater than the thickness t1 of the cover window 220, but are not limited thereto. The thickness t2u of the top protection portion 231 and the thickness t2s of the side protection portion 232 may be less than or equal to the thickness t1 of the cover window 220. As shown in FIG. 6, respective thicknesses are taken in a direction normal to a surface on which an element is disposed.

The top protection portion 231 may be disposed on one side of the corner protection portion 233, and the side protection portion 232 may be disposed on another side of the corner protection portion 233. The corner protection portion 233 may be disposed around the top protection portion 231 in a plan view. In an embodiment, the corner protection portion 233 may be disposed to surround the top protection portion 231 in a plan view.

There may be a step defined between the lower surface of the side protection portion 232 and the lower surface 220b of the cover window 220. The lower surface of the side protection portion 232 may be recessed toward the front side, compared to the lower surface 220b of the cover window 220. That is, the lower surface of the side protection portion 232 may be further from the display panel 100 than the lower surface 220b of the cover window 220. On the contrary, the lower surface 220b of the cover window 220 may protrude toward the lower side, compared to the lower surface of the side protection portion 232. That is, the lower surface 220b of the cover window 220 may be closer to the display panel 100 than the lower surface of the side protection portion 232.

The second coupling member 252 may be disposed along the lower surface 220b of the cover window 220. The second coupling member 252 may be disposed to cover the lower surface 220b of the cover window 220 and to cover a portion of the side surface 220s. The second coupling member 252 may cover an entirety of the lower surface 220b of the cover window 220. That is to say, the lower surface 220b of the cover window 220 may overlap or correspond to the second coupling member 252.

The second coupling member 252 covering a portion of the side surface 220s of the cover window 220 may be in contact with the side protection portion 232. That is to say, a portion of the side surface 220s of the cover window 220 may be covered by the side protection portion 232, and another portion thereof of the same side surface may be covered by the second coupling member 252.

The upper surface of the second coupling member 252 may have a shape conformal to the step between the lower surface of the side protection portion 232 and the lower surface 220b of the cover window 220. In other words, the upper surface of the second coupling member 252 may have a step conforming to the step between the lower surface of the side protection portion 232 and the lower surface 220b of the cover window 220.

The polarizing member 210 may be disposed on the rear side of the second coupling member 252, and the second coupling member 252 may couple the polarizing member 210 with the cover window 220. The elements disposed on the rear side of the polarizing member 210 are identical to those described above with reference to FIGS. 3 and 4 and, therefore, the redundant descriptions will be omitted.

Figure 7:
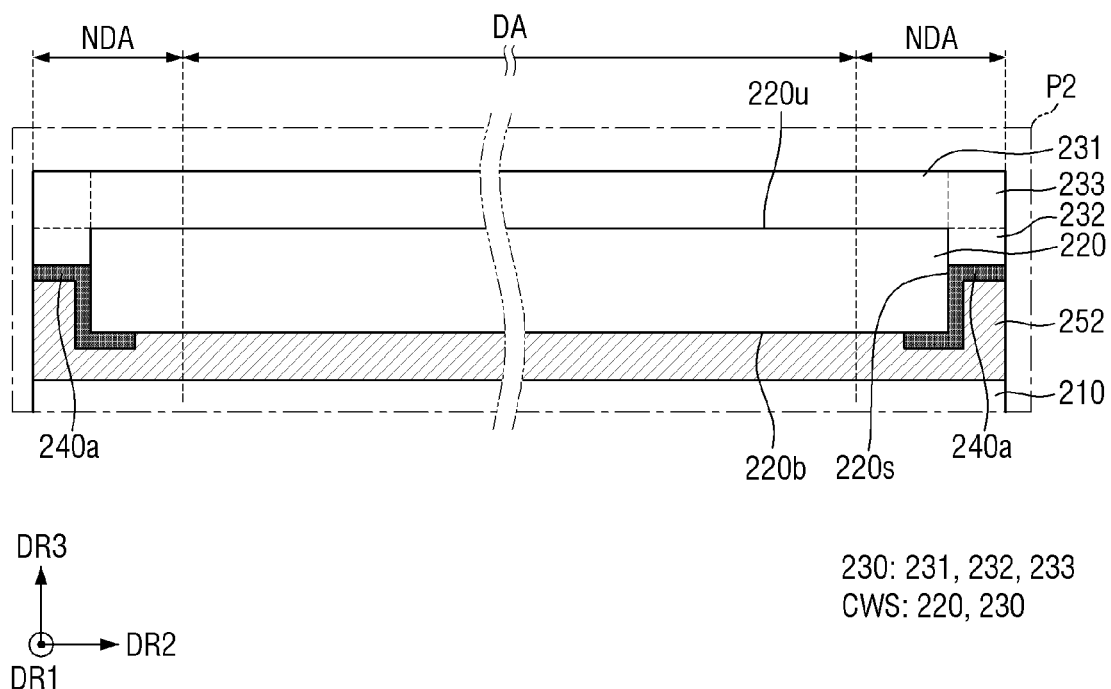
FIGS. 7 to 9 are cross-sectional views of embodiments of area P2 of FIG. 3.
Figure 8:
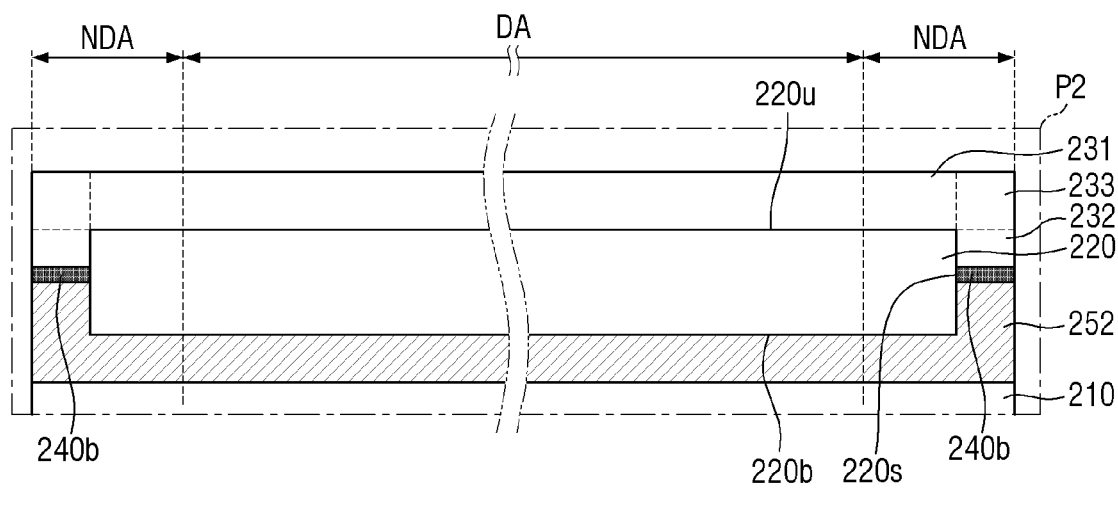
Figure 8:
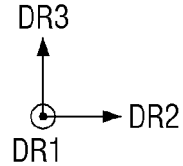
Figure 9:
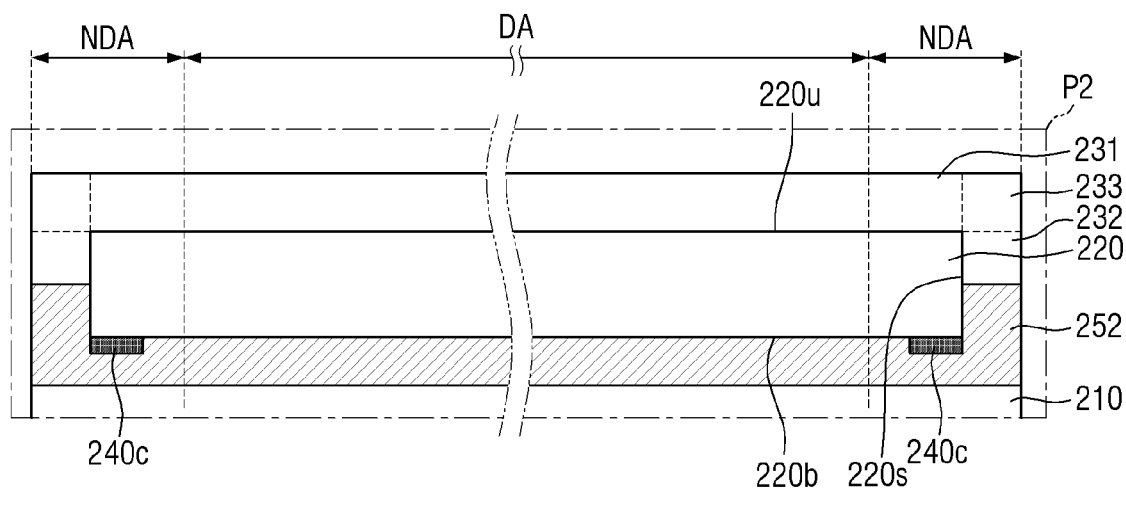

FIGS. 7 to 9 are cross-sectional views of embodiments of area P2 of FIG. 3.

Area P2 of FIG. 3, e.g., the interface respectively between the cover window protection layer 230, the cover window 220 and the second coupling member 252 may be modified in a variety of ways. In the following description, modifications of area P2 of FIG. 3 will be described, and, the redundant descriptions will be omitted.

Referring to FIG. 7 in conjunction with FIG. 3, a light-blocking member 240a that absorbs and blocks light is further disposed between the cover window protection layer 230 and the second coupling member 252 and between the cover window 220 and the second coupling member 252.

According to this embodiment, the light-blocking member 240a may overlap with or correspond to the side protection portion 232 and the cover window 220. Specifically, the light-blocking member 240a may extend along the lower surface of the side protection portion 232 and the lower surface 220b of the cover window 220. The light-blocking member 240a may be in contact with the side surface 220s of the cover window 220. The light-blocking member 240a may be disposed in the area between the lower surface of the side protection portion 232 and the lower surface 220b of the cover window 220 where a step is formed. That is to say, the light-blocking member 240a may overlap the area between the lower surface of the side protection portion 232 and the lower surface 220b of the cover window 220 where the step is formed.

Although not shown in the drawings, the light-blocking member 240a may be disposed along the edge of the cover window 220 in a plan view and may overlap the non-display area NDA of the display panel 100.

Referring to FIG. 8 in conjunction with FIG. 3, a light-blocking member 240b that absorbs and blocks light is further disposed between the cover window protection layer 230 and the second coupling member 252. According to this embodiment, the light-blocking member 240b may be disposed between the side protection portion 232 and the second coupling member 252. The light-blocking member 240b may overlap the cover window protection layer 230 but may not overlap the cover window 220 in the plan view, e.g., may be adjacent to the cover window 220 in a plan view. The upper surface of the light-blocking member 240b may be in contact with the side protection portion 232, the lower surface thereof may be in contact with the second coupling member 252, and the side surface thereof may be in contact with the side surface 220s of the cover window 220, however, is not limited thereto. The side surface 220s of the cover window 220 may include a region that is not in contact with the light-blocking member 240b. Although not shown in the drawings, the light-blocking member 240b may be disposed along the edge of the cover window 220 in the plan view and may overlap the non-display area NDA of the display panel 100.

Referring to FIG. 9 in conjunction with FIG. 3, a light-blocking member 240c that absorbs and blocks light is further disposed between the cover window 220 and the second coupling member 252. According to this embodiment, the light-blocking member 240c may be disposed between the cover window 220 and the second coupling member 252. The light-blocking member 240c may overlap the cover window 220, but may not overlap the side protection portion 232, e.g., may be adjacent to the side protection portion 232 in a plan view. That is, the second protection portion (e.g., the side protection portion 232) of the first window protection layer (e.g., the cover window protection layer 230) and an adhesive layer (e.g., second coupling member) cover an entirety of the third surface (e.g., side surface 220s) of the cover window 220, and the light-blocking member 240c is between the cover window 220 and the adhesive layer. The upper surface of the light-blocking member 240c may be in contact with the cover window 220, and the lower surface and the side surface thereof may be in contact with the second coupling member 252, however, is not limited thereto. Although not shown in the drawings, the light-blocking member 240c may be disposed along the edge of the cover window 220 in the plan view and may overlap the non-display area NDA of the display panel 100.

According to one or more embodiment, it is possible to effectively protect the cover window 220 of the display device 10 by the cover window protection layer 230 covering the upper surface 220u and at least a portion of the side surface 220s of the cover window 220. In addition, the cover window 220 and the cover window protection layer 230 may be coupled with each other via a simpler thermocompression bonding process.

Figure 10:
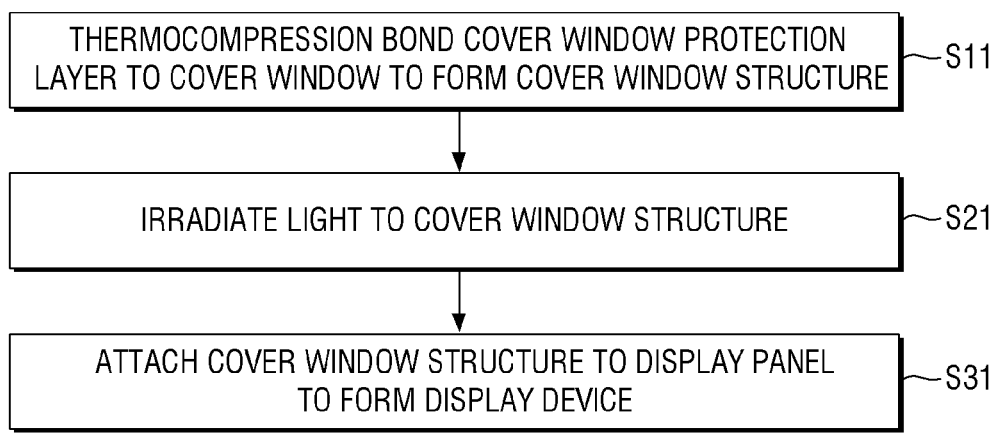
FIG. 10 is a flowchart for illustrating an embodiment of a method for providing a display device.
Figure 11:
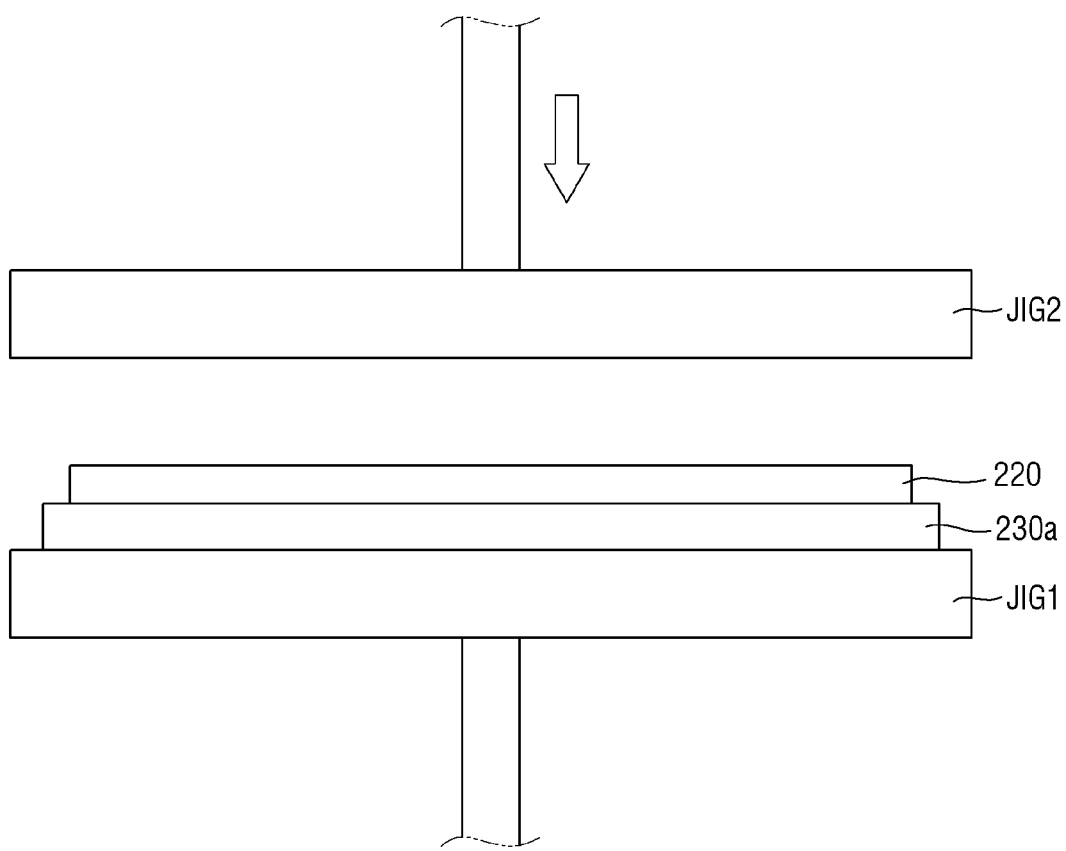
FIGS. 11 to 14 are views for illustrating embodiments of processes in the method of providing the display device according to the flowchart of FIG. 10.
Figure 12:
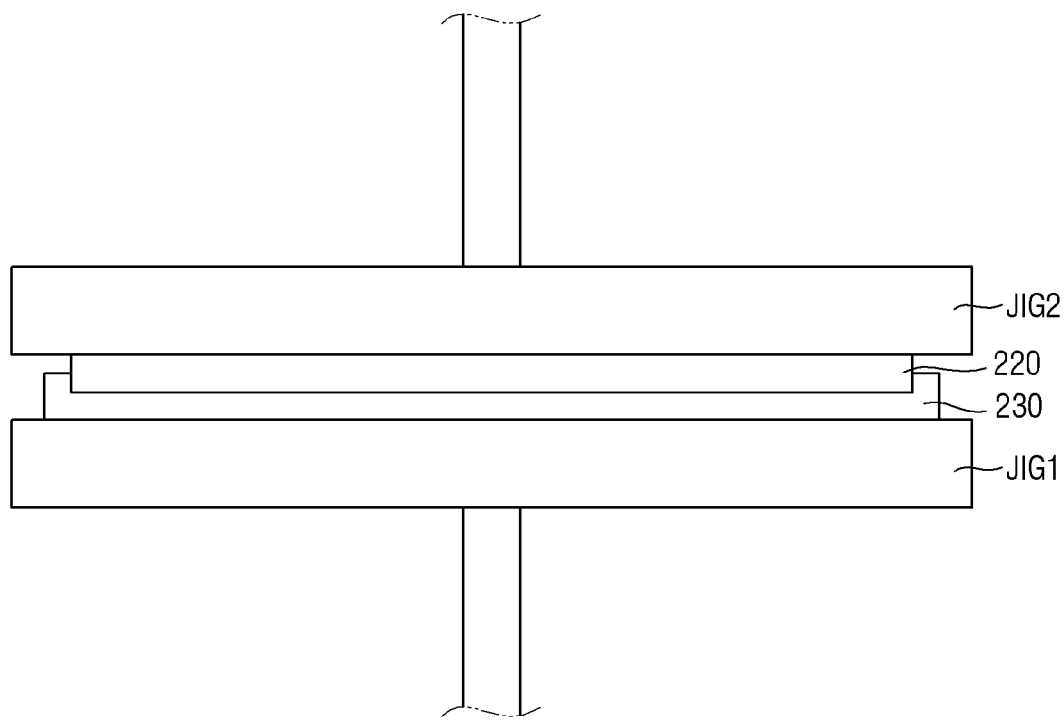
Figure 13:
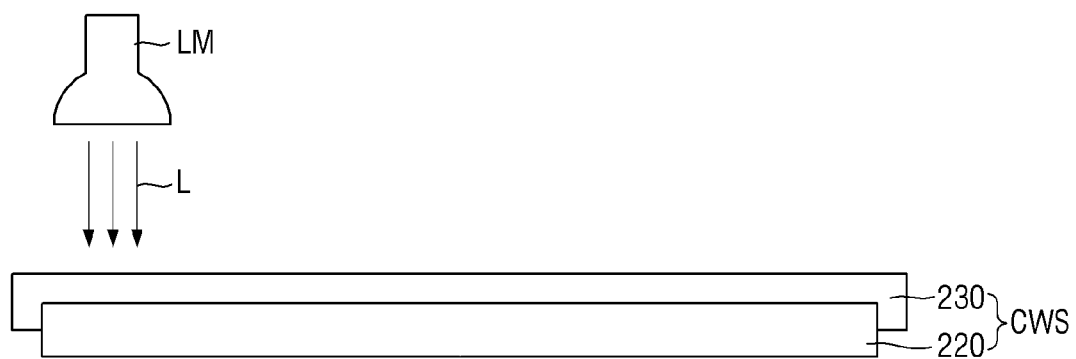
Figure 14:
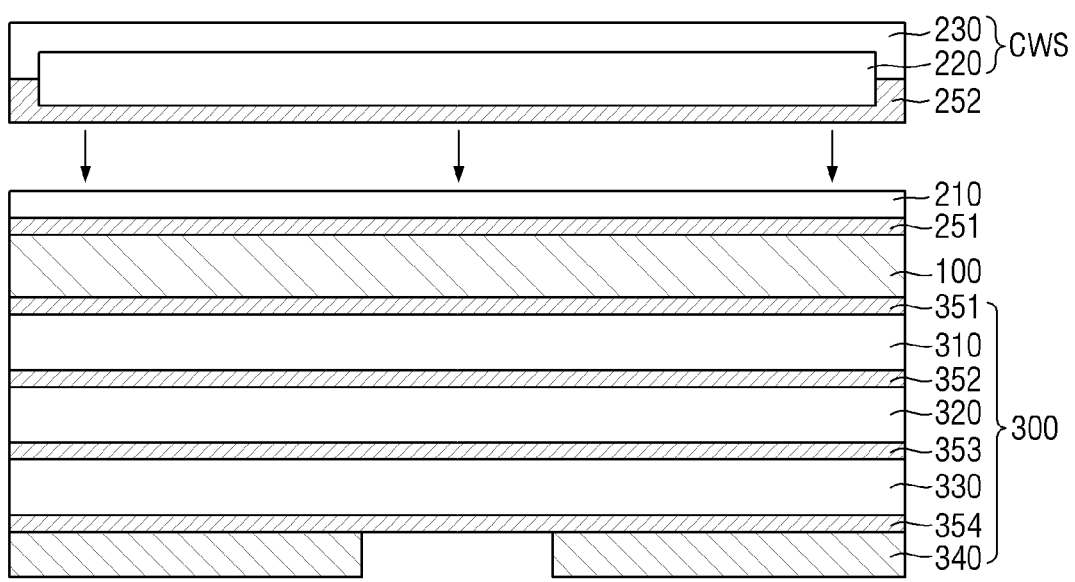

FIG. 10 is a flowchart for illustrating an embodiment of a method for providing or fabricating a display device 10. FIGS. 11 to 14 are views for illustrating processes in the method for providing or fabricating the display device 10 according to the flowchart of FIG. 10.

Referring to FIGS. 10 to 14, the method for fabricating (or providing) a display device 10 may include forming (or providing) a cover window structure CWS by thermocompression bonding of a cover window protection layer 230 to a cover window 220 (S11), irradiating light such as ultraviolet rays to the cover window structure CWS (S21), and attaching the cover window structure CWS to the display panel 100 to form (or provide) a display device 10 (S31).

In the method, the forming the cover window structure CWS by thermocompression of the bonding the cover window protection layer 230 to the cover window 220 (S11) may be initially provided or carried out.

According to an embodiment, the forming of the cover window structure CWS by performing thermocompression bonding of the cover window protection layer to the cover window 220 (S11) may be carried out by using a lower jig JIG1 and an upper jig JIG2. Each of the lower jig JIG1 and the upper jig JIG2 may include a heater to provide heat to a cover window protection material 230a and the cover window 220 during a thermocompression bonding process. The lower jig JIG1 may move upward while the upper jig JIG2 may move downward during the thermocompression bonding process. That is, the lower jig JIG1 and the upper jig JIG2 move toward each other with the cover window protection material 230a and the cover window 220 therebetween. The thermocompression bonding process may be conducted under a temperature condition in a range of approximately 100 degrees Celsius (° C.) to approximately 250° C. and a pressure condition in a range of approximately 0.1 megapascal (MPa) to approximately 10 megapascals (MPa).

The forming the cover window structure CWS by thermocompression bonding of the cover window protection layer 230 to the cover window 220 (S11) may include disposing the cover window protection material 230a on the lower jig JIG1, and disposing the cover window 220 on the cover window protection material 230a. However, the process order of disposing the cover window protection material 230a and the cover window 220 may be altered. In an embodiment, for example, the cover window 220 may be disposed on the lower jig JIG1 and then the cover window protection material 230a may be disposed on the cover window 220.

Subsequently, the forming the cover window structure CWS by thermocompression bonding of the cover window protection layer 230 to the cover window 220 (S11) may further include applying heat to the cover window protection material 230a and the cover window 220, and pressing the cover window 220 downward towards the cover window protection material 230a by using the upper jig JIG2. In this manner, the cover window protection material 230a which is heated may be attached to the cover window 220 which is heated and thermally cured simultaneously, so that the cover window protection layer 230 may be formed with the cover window 220 embedded therein.

Specifically, the upper jig JIG2 may press the cover window 220 toward the cover window protection material 230a. At this time, the lower jig JIG1 may also press the cover window protection material 230a toward the cover window 220. Each of the lower jig JIG1 and the upper jig JIG2 may generate heat by driving the heater, however, is not limited thereto. The heater may be driven in only one of the lower jig JIG1 and the upper jig JIG2, whichever is closer to the cover window protection material 230a, to generate heat.

When the cover window 220 is thermocompression-bonded to the cover window protection material 230a, the cover window protection material 230a becomes a cover window protection layer 230 that is disposed to cover one surface and a portion of the side surface of the cover window 220. As a result, the cover window structure CWS including the cover window 220 and the cover window protection layer 230 can be formed.

After the forming the cover window structure CWS by thermocompression bonding of the cover window protection layer 230 to the cover window 220 (S11), the irradiating light to the cover window structure CWS (S21) may be carried out.

The irradiating light to the cover window structure CWS (S21) is to perform additional curing by irradiating light L such as from a light source LM to the cover window protection layer 230 of the cover window structure CWS. The light L irradiated to the cover window protection layer 230 may be, for example, ultraviolet rays. It should be understood that the invention is not limited thereto. The process of S21 may be omitted depending on the material forming the cover window protection layer 230.

After the irradiating ultraviolet lays to the cover window structure CWS (S21), the attaching the cover window structure CWS to the display panel 100 to form a display device 10 (S31) may be carried out.

The process S31 may include attaching the cover window structure CWS on the polarizing member 210 disposed on the display panel 100 disposed on the rear stack structure 300. Although the cover window structure CWS is attached on the second coupling member 252 disposed on the polarizing member 210 in the example shown in FIG. 14, the invention is not limited thereto. The second coupling member 252 may be disposed on the cover window structure CWS, and then the cover window structure CWS having the second coupling member 252 attached thereto may be attached on the polarizing member 210.

According to one or more embodiment of the method for fabricating a display device 10, it is possible to fabricate the display device 10 that can effectively protect the cover window 220 by providing the cover window protection layer 230 covering the upper surface 220u and at least a portion of the side surface 220s of the cover window 220. In addition, according to one or more embodiment of the method for fabricating a display device 10, the cover window 220 and the cover window protection layer 230 can be coupled with each other via a simpler thermocompression bonding process.

Hereinafter, protective properties by the cover window protection layer 230 which is on the cover window 220 will be described in more detail based on Experimental Examples.

Experimental Example 1: Evaluation of Cover Window Protective Properties of Examples 1 to 5

TABLE 1

|  | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| Thickness of Cover Window (μm) | 25 | 30 | 30 | 30 | 30 | 25 | 30 | 50 | 80 |
| Thickness of Cover Window Protection Layer (μm) | 5 | 10 | 20 | 30 | 50 | — | — | — | — |
| Pen Drop Height (cm) Resulting in Bright Spot | 2 | 2.5 | 3 | 7 | 10 | 1 | 2 | 3 | 5 |
| Test For Checking Scattering of Cover Window | X | X | X | X | X | ○ | ○ | ○ | ○ |
| Curvature radius limit (mm) | 1 | 1.5 | 2 | 2.5 | 3 | 1 | 1.5 | 3 | 5 |
| Drop Test Results | Crack | Crack | Good | Good | Good | Breakage | Breakage | Breakage | Breakage |

Example 1

A cover window structure CWS was produced, in which the thickness t1 of the cover window 220 was 25 μm, and the thickness of the cover window protection layer 230 was 5 μm. The thickness of the cover window protection layer 230 refers to the thickness t2u of the top protection portion 231 shown in FIG. 6.

Example 2

A cover window structure CWS was produced, in which the thickness t1 of the cover window 220 was 30 μm, and the thickness of the cover window protection layer 230 was 10 μm. The thickness of the cover window protection layer 230 refers to the thickness t2u of the top protection portion 231 shown in FIG. 6.

Example 3

A cover window structure CWS was produced, in which the thickness t1 of the cover window 220 was 30 μm, and the thickness of the cover window protection layer 230 was 20 μm. The thickness of the cover window protection layer 230 refers to the thickness t2u of the top protection portion 231 shown in FIG. 6.

Example 4

A cover window structure CWS was produced, in which the thickness t1 of the cover window 220 was 30 μm, and the thickness of the cover window protection layer 230 was 30 μm. The thickness of the cover window protection layer 230 refers to the thickness t2u of the top protection portion 231 shown in FIG. 6.

Example 5

A cover window structure CWS was produced, in which the thickness t1 of the cover window 220 was 30 μm, and the thickness of the cover window protection layer 230 was 50 μm. The thickness of the cover window protection layer 230 refers to the thickness t2u of the top protection portion 231 shown in FIG. 6.

Comparative Example 1

As a comparative example, a cover window 220 having the thickness t1 of 25 μm was prepared. Comparative Example 1 is the counterpart for Example 1 in which the cover window 220 has the same thickness t1.

Comparative Example 2

As a comparative example, a cover window 220 having the thickness t1 of 30 μm was prepared. Comparative Example 2 is a counterpart for Example 1 having the same overall thickness of 30 μm, and for Examples 2 to 5 in which the cover window 220 has the same thickness t1.

Comparative Example 3

As a comparative example, a cover window 220 having the thickness t1 of 50 μm was prepared. Comparative Example 3 is the counterpart for Example 3, in which the overall thickness is 50 μm.

Comparative Example 4

As a comparative example, a cover window 220 having the thickness t1 of 80 μm was prepared. Comparative Example 4 is the counterpart for Example 5, in which the overall thickness is 80 μm.

Initially, referring to Comparative Example 1 and Example 1, the cover window 220 has the same thickness t1 of 25 μm in Comparative Example 1 and Example 1, but the cover window protection layer 230 is eliminated in Comparative Example 1 while the cover window protection layer 230 having the thickness t2u of 5 μm is disposed in the cover window structure CWS in Example 1.

A pen drop test was carried out to check the height which results in a bright spot. As a result, Example 1 exhibited a value greater than that of Comparative Example 1. The pen drop test was conducted by dropping a pen having the diameter of 8 mm, the length of 15 centimeters (cm), the weight of 10 grams (g), and the nib diameter of 0.7 mm onto the display surface of the display device 10 such that the nib was perpendicular to the display surface of the display device 10, to see the height that results in a bright spot, which is a defective pixel, in the display device 10.

In addition, a test to check whether scattering occurs when the cover window 220 is broken was carried out. No scattering occurred in Example 1 whereas scattering occurred in Comparative Example 1. The curvature radius limit showed substantially the same value in Example 1 as well as Comparative Example 1. The curvature radius limit may be defined as the minimum curvature radius that does not cause breaking, cracking, and/or delamination of the cover window structure CWS during bending or folding. A drop test was carried out. As a result of the drop test, cracks occurred in Example 1, while breakage occurred in Comparative Example 1.

The drop test was conducted by putting the display device 10 including the cover window 220 according to each of Examples and Comparative Examples in a case having the size of 130 mm in width, 150 mm in length and 15 mm in height, and then dropping the display device 10 at the height of 1 meter (m) from the ground, to see whether cracks or breakage had occurred.

Comparing Comparative Example 2 with Example 1, the cover window structures CWS have the same overall thickness of 30 μm in both Comparative Example 1 and Example 2, but the cover window protection layer 230 is eliminated in Comparative Example 1 while the cover window protection layer 230 having the thickness t2u of 5 μm is disposed in the cover window structure CWS in Example 1. In the pen drop test, Example 1 and Comparative Example 2 exhibited substantially the same value. In addition, in the test to check whether scattering occurs when the cover window 220 is broken, no scattering occurred in Example 1 whereas scattering occurred in Comparative Example 2. Comparative Example 2 exhibited the higher curvature radius limit than that of Example 1. As a result of the drop test, cracks occurred in Example 1, while breakage occurred in Comparative Example 2.

Comparing Comparative Example 2 with Examples 2 to 5, the cover windows 220 have the same thickness t1 of 30 μm in Comparative Example 2 and Examples 2 to 5, but the cover window protection layer 230 is eliminated in Comparative Example 2 while the cover window protection layers 230 having the thickness t2u of 10 μm, 20 μm, 30 μm and 50 μm are disposed in the cover window structures CWS in Examples 2 to 5, respectively. As a result of the pen drop test, Comparative Example 2 exhibited a smaller value than the values of Examples 2 to 5. In addition, in the test to check whether scattering occurs when the cover window 220 is broken, no scattering occurred in Examples 2 to 5 whereas scattering occurred in Comparative Example 2. Comparative Example 2 exhibited the curvature radius limit, which is substantially equal to that of Example 2. The curvature radius limit of Examples 2 to 5 were greater than the curvature radius limit of Comparative Example 2. As a result of the drop test, cracks occurred in Example 2, breakage occurred in Comparative Example 2. Neither cracks nor breakage occurred in Examples 3 to 5.

It can be seen from Examples 2 to 5 that the height that results in bright spots and the curvature radius limit become greater as the thickness t2u of the cover window protection layer 230 increases.

Comparing Comparative Example 3 with Example 3, the cover window structure CWS having the same overall thickness of 50 μm in both Comparative Example 3 and Example 3, but the cover window 220 has the thickness t1 of 50 μm as the cover window protection layer 230 is eliminated in Comparative Example 3 while the cover window structure CWS includes the cover window 220 having the thickness t1 of 30 μm and the cover window protection layer 230 having the thickness t2u of 20 μm in Example 3. As a result of the pen drop test, Example 3 exhibited the value greater than that of the Comparative Example 3. In addition, in the test to check whether scattering occurs when the cover window 220 is broken, no scattering occurred in Example 3 whereas scattering occurred in Comparative Example 3. Comparative Example 3 exhibited the higher curvature radius limit than that of Example 3. As a result of the drop test, neither cracks nor breakage occurred in Example 3, while breakage occurred in Comparative Example 3.

Comparing Comparative Example 4 with Example 5, the cover window structure CWS having the same overall thickness of 80 μm in both Comparative Example 4 and Example 5, but the cover window 220 has the thickness t1 of 80 μm as the cover window protection layer 230 is eliminated in Comparative Example 4 while the cover window structure CWS includes the cover window 220 having the thickness t1 of 30 μm and the cover window protection layer 230 having the thickness t2u of 50 μm in Example 5. As a result of the pen drop test, Example 5 exhibited the value greater than that of the Comparative Example 4. In addition, in the test to check whether scattering occurs when the cover window 220 is broken, no scattering occurred in Example 5 whereas scattering occurred in Comparative Example 4. Comparative Example 4 exhibited the higher curvature radius limit than that of Example 5. As a result of the drop test, neither cracks nor breakage occurred in Example 5, while breakage occurred in Comparative Example 4.

It can be seen from the results of the tests that the height that results in bright spots increases as the thickness t2u of the cover window protection layer 230 increases, with the same thickness t1 of the cover window 220. It can also be seen that the cover window 220 does not scatter even if the cover window 220 is broken when the display device 10 includes the cover window protection layer 230. The curvature radius limit is proportional to the thickness t1 of the cover window 220, and when the cover window 220 has the same thickness t1, the curvature radius limit becomes larger as the thickness t2u of the cover window protection layer 230 increases. As a result of the drop test, cracks occurred in Comparative Examples 1 to 4 in which the cover window protection layer 230 was eliminated, while in Examples 1 to 5 including the cover window protection layer 230, cracks occurred in the cover window 220 or no damage to the exterior of the display device 10 occurred. In Examples 1 to 5 where the cover window protection layer 230 has a relatively large thickness t2u, no damage to the exterior of the cover window 220 occurred in the drop test results.

Hereinafter, embodiments of the display device 10 will be described. In the following description, the same or similar elements will be denoted by the same or similar reference numerals, and redundant descriptions will be omitted or briefly described. Descriptions will be made focusing on differences from the above embodiment described with references to FIGS. 3 and 6-9.

Figure 15:
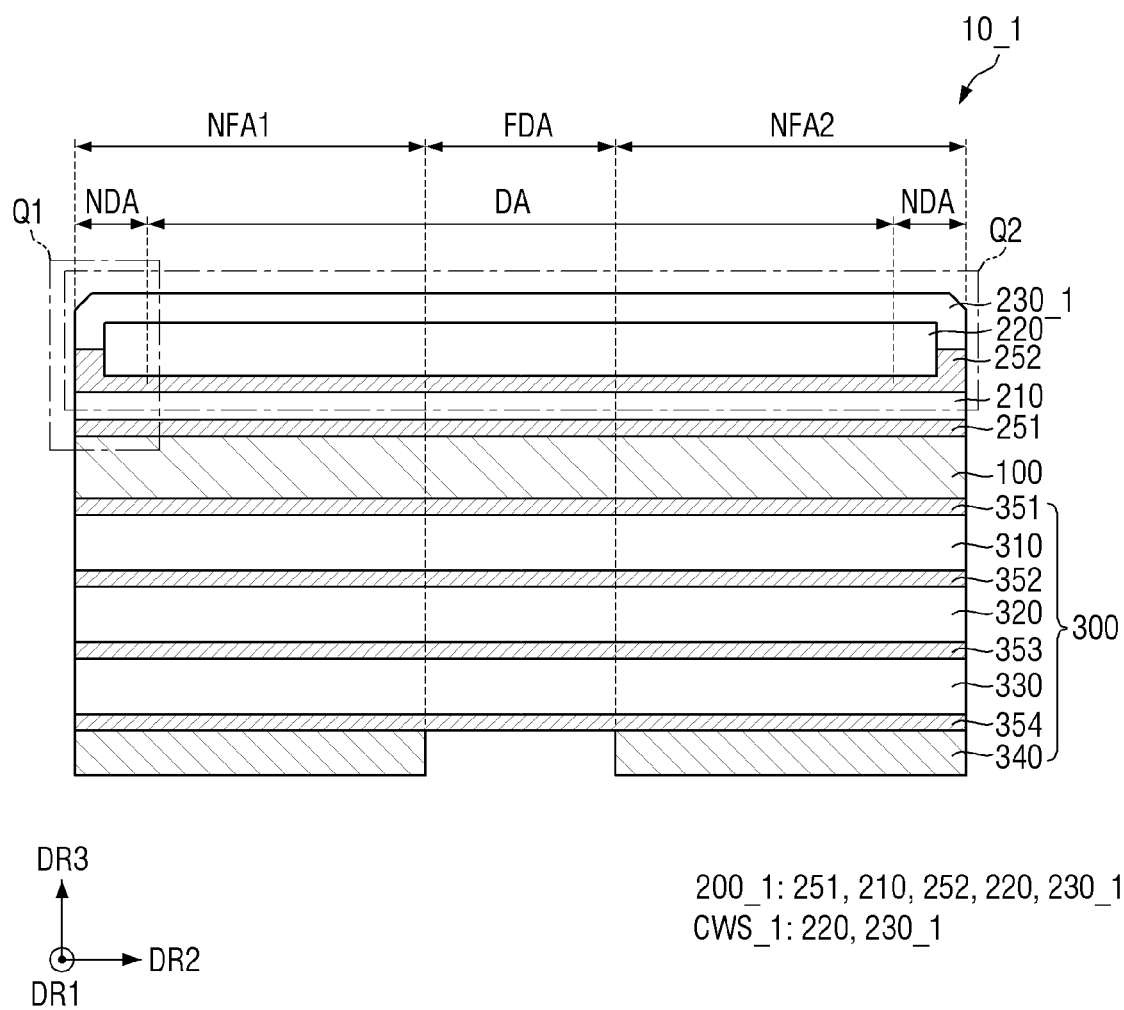
FIG. 15 is a cross-sectional view of an embodiment of a display device which is unfolded.
Figure 16:
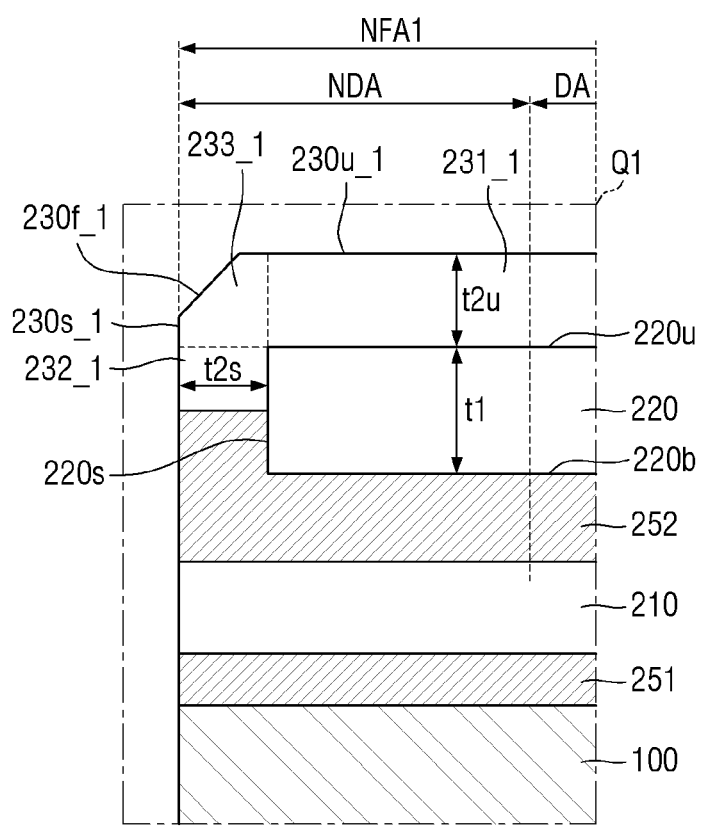
FIG. 16 is an enlarged view of an embodiment of area Q1 of FIG. 15.

FIG. 15 is a cross-sectional view of an embodiment of a display device 10_1 which is unfolded. FIG. 16 is an enlarged view of an embodiment of area Q1 of FIG. 15.

A display device 10_1 is different from the display device 10 in that the display device 10_1 includes a front stack structure 200_1 having a different structure. Specifically, a cover window protection layer 230_1 of the cover window structure CWS_1 included in the front stack structure 200_1 includes a chamfered portion 230f_1. The upper edge of the display device 10_1 may be chamfered in cross-section as defined by the chamfered portion 230f_1.

According to this embodiment, the cover window protection layer 230_1 may include an upper surface 230u_1 disposed toward the front side, a side surface 230s_1 disposed in a direction include such as perpendicular to the front side and rear side, and a chamfered portion 230f_1 connecting the upper surface 230u_1 with the side surface 230s_1. The chamfered portion 230f_1 is an inclined surface and may be disposed between the upper surface 230u_1 and the side surface 230s_1 of the cover window protection layer 230_1. The corner of the cover window protection layer 230_1 is inclined by forming the chamfered portion 230f_1 between the upper surface 230u_1 and the side surface 230s_1, to reduce or effectively prevent damage to the corner of the cover window protection layer 230_1. The corner of the cover window protection layer 230_1 may define a profile of the upper edge of the display device 10_1.

The cover window protection layer 230_1 may include a top protection portion 231_1 overlapping the upper surface 220u of the cover window 220, a side protection portion 232_1 overlapping the side surface 220s, and a corner protection portion 233_1 disposed between the top protection portion 231_1 and the side protection portion 232_1.

As shown in FIG. 16, the chamfered portion 230f_1 may be a surface included in or defined by the corner protection portion 233_1, but is not limited thereto. The chamfered portion 230f_1 may be included in both the corner protection portion 233_1 and the top protection portion 231_1, may be included in both the corner protection portion 233_1 and the side protection portion 232_1, or may be included in each of the corner protection portion 233_1, the top protection portion 231_1 and the side protection portion 232_1. That is to say, the shape of the chamfered portion 230f_1 may be variously determined depending on the shape in which the cover window protection layer 230_1 is chamfered.

Figure 17:
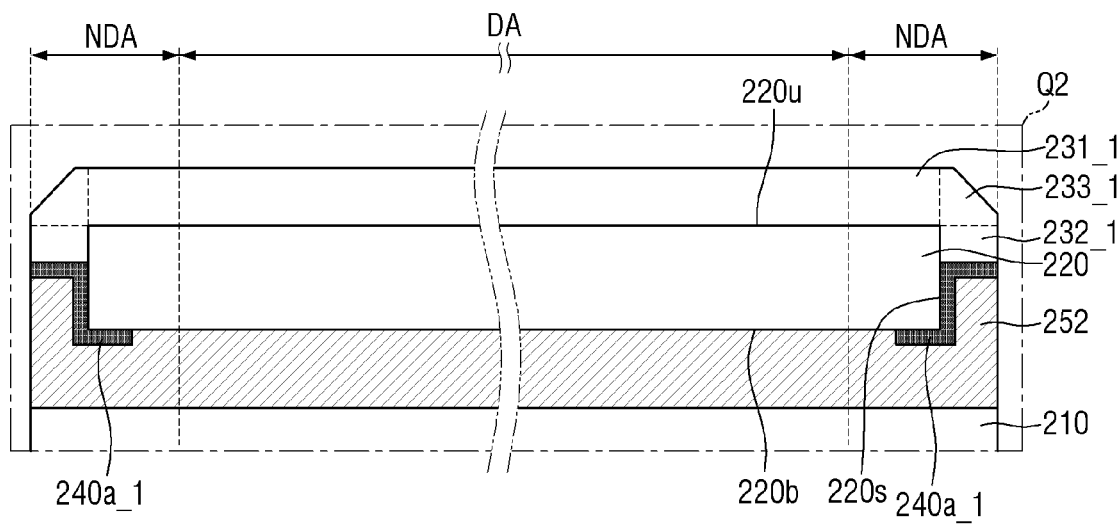
FIGS. 17 to 19 are cross-sectional views of embodiments of area Q2 of FIG. 15.
Figure 18:
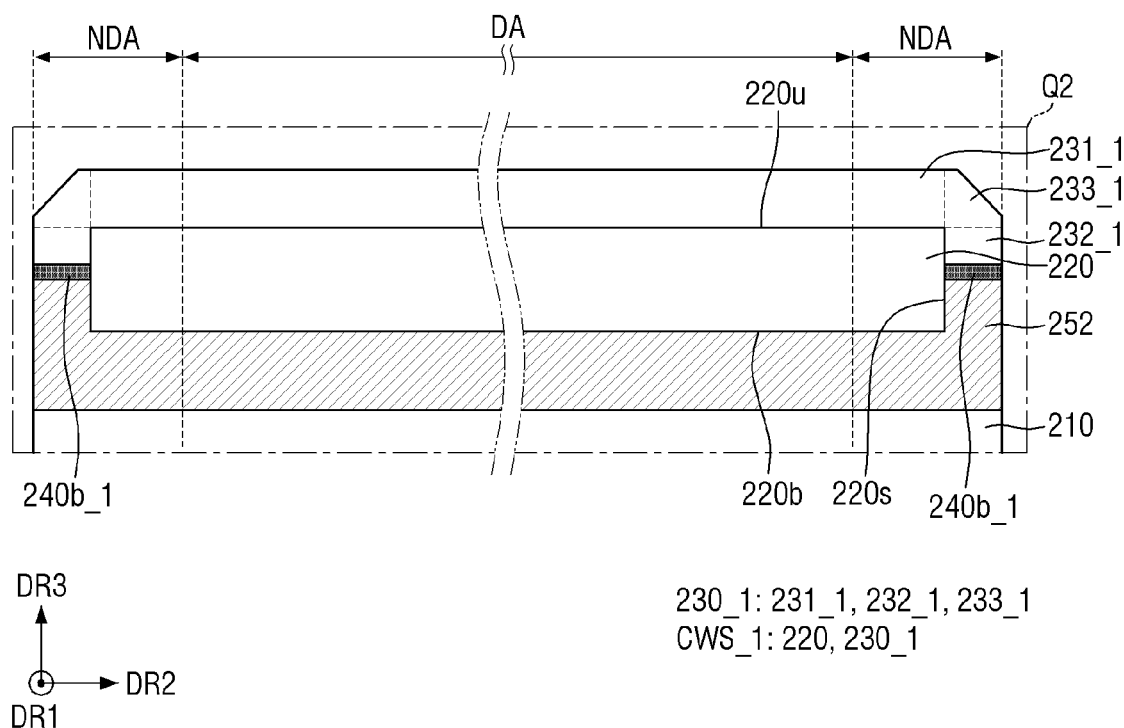
Figure 19:
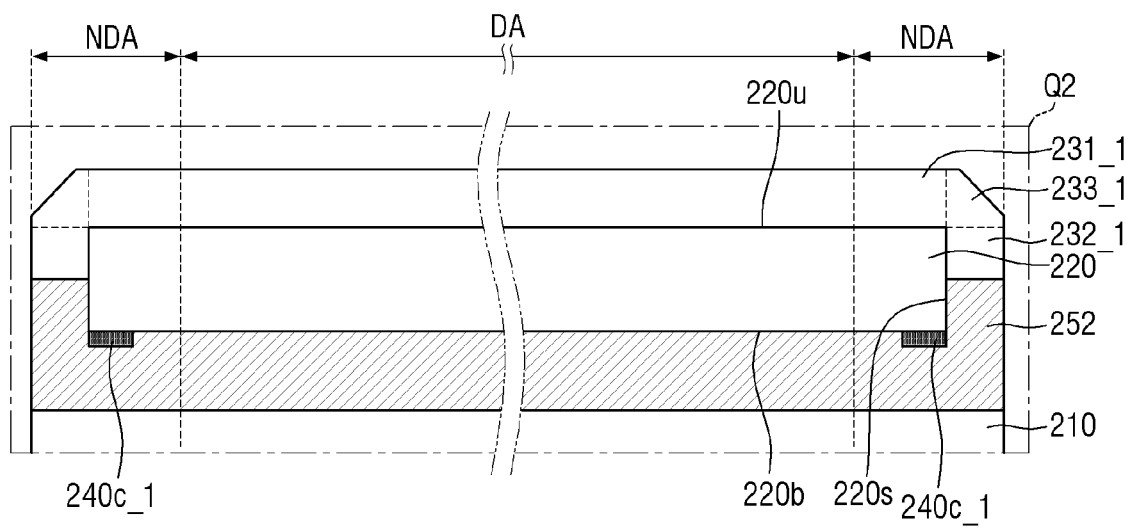

FIGS. 17 to 19 are cross-sectional views of embodiments of area Q2 of FIG. 15.

Referring to FIG. 17 in conjunction with FIG. 15, a light-blocking member 240a_1 that absorbs and blocks light is further disposed between the cover window protection layer 230_1 and the second coupling member 252 and between the cover window 220 and the second coupling member 252.

According to this embodiment, the light-blocking member 240a_1 may overlap with the side protection portion 232_1 and the cover window 220. Specifically, the light-blocking member 240a_1 may be disposed on the lower surface of the side protection portion 232_1 and the lower surface 220b of the cover window 220. The light-blocking member 240a_1 may be in contact with the side surface 220s of the cover window 220. The light-blocking member 240a_1 may be disposed in the area between the lower surface of the side protection portion 232_1 and the lower surface 220b of the cover window 220 where a step is formed. That is to say, the light-blocking member 240a_1 may overlap the area between the lower surface of the side protection portion 232_1 and the lower surface 220b of the cover window 220 where the step is formed.

Although not shown in the drawings, the light-blocking member 240a_1 may be disposed along the edge of the cover window 220 and may overlap the non-display area NDA of the display panel 100.

Referring to FIG. 18 in conjunction with FIG. 15, a light-blocking member 240b_1 that absorbs and blocks light is further disposed between the cover window protection layer 230_1 and the second coupling member 252. According to this embodiment, the light-blocking member 240b_1 may be disposed between the side protection portion 232_1 and the second coupling member 252. The light-blocking member 240b_1 may overlap the cover window protection layer 230_1 but may not overlap the cover window 220. The upper surface of the light-blocking member 240b_1 may be in contact with the side protection portion 232_1, the lower surface thereof may be in contact with the second coupling member 252, and the side surface thereof may be in contact with the side surface 220s of the cover window 220. It should be understood that the invention is not limited thereto. The side surface 220s of the cover window 220 may include a region that is not in contact with the light-blocking member 240b_1. Although not shown in the drawings, the light-blocking member 240b_1 may be disposed along the edge of the cover window 220 and may overlap the non-display area NDA of the display panel 100.

Referring to FIG. 19 in conjunction with FIG. 15, a light-blocking member 240c_1 that absorbs and blocks light is further disposed between the cover window protection layer 230_1 and the second coupling member 252. According to this embodiment, the light-blocking member 240c_1 may be disposed between the cover window 220 and the second coupling member 252. The light-blocking member 240c_1 may overlap the cover window 220, but may not overlap the side protection portion 232_1. The upper surface of the light-blocking member 240c_1 may be in contact with the cover window 220, and the lower surface and the side surface thereof may be in contact with the second coupling member 252. It should be understood that the invention is not limited thereto. Although not shown in the drawings, the light-blocking member 240c_1 may be disposed along the edge of the cover window 220 and may overlap the non-display area NDA of the display panel 100.

According to one or more embodiment, it is possible to effectively protect the cover window 220 of the display device 10_1 by the cover window protection layer 230 covering the upper surface 220u and at least a portion of the side surface 220s of the cover window 220. In addition, the cover window 220 and the cover window protection layer 230_1 may be coupled with each other via a simpler thermocompression bonding process.

In addition, according to this embodiment, the cover window protection layer 230_1 of the display device 10_1 includes the chamfered portion 230f_1, so that it is possible to effectively prevent damage that may occur at the corner of the cover window protection layer 230_1.

The chamfered portion 230f_1 included in the display device 10_1 described above with reference to FIGS. 15 to 19 may be equally applied to other display devices according to embodiments to be described later.

Figure 20:
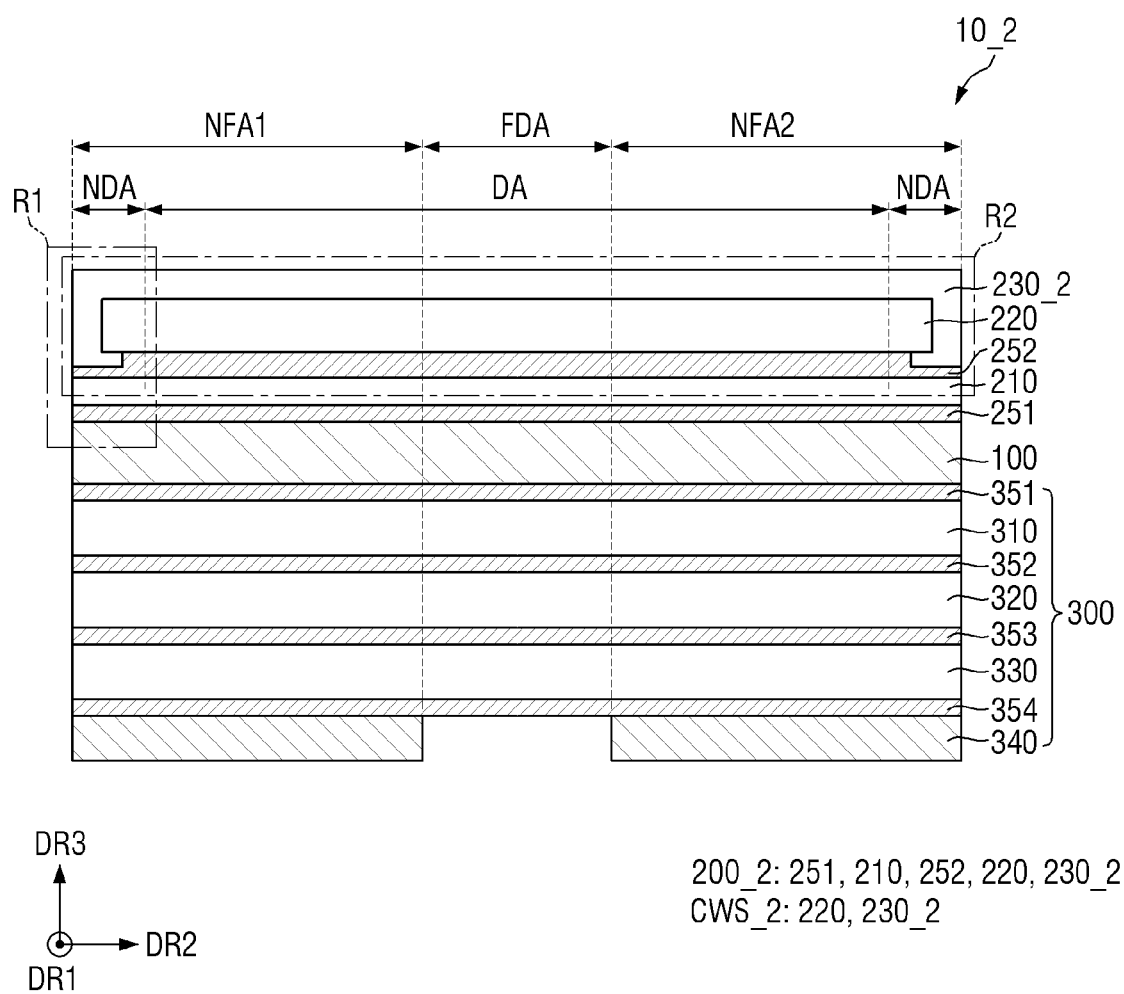
FIG. 20 is a cross-sectional view of an embodiment of a display device which is unfolded.
Figure 21:
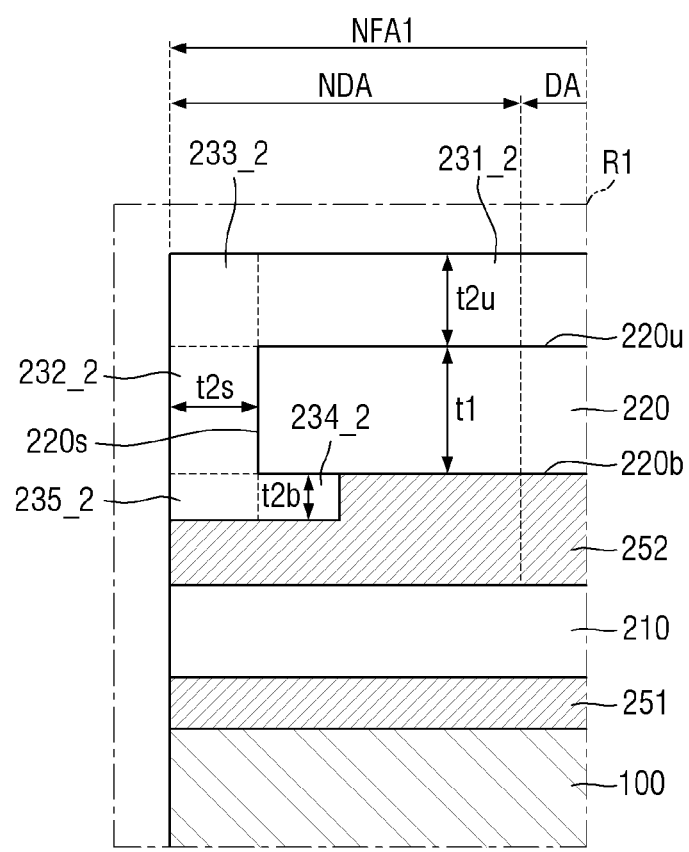
FIG. 21 is an enlarged view of an embodiment of area R1 of FIG. 20.

FIG. 20 is a cross-sectional view of an embodiment of a display device 10_2 which is unfolded. FIG. 21 is an enlarged view of an embodiment of area R1 of FIG. 20.

A display device 10_2 is different from the display device 10 in that the display device 10_2 includes a front stack structure 200_2 having a different structure. Specifically, the cover window protection layer 230_2 included in the front stack structure 200_2 may be disposed to cover a portion of a lower surface 220b as well as an upper surface 220u and a side surface 220s of the cover window 220. The cover window protection layer 230_2 may cover an entirety of the upper surface 220u and an entirety of the side surface 220s of the cover window 220, and may partially cover the lower surface 220b of the cover window 220. In other words, the cover window protection layer 230_2 may be disposed to surround the edge of the cover window 220, such as the upper edge and the lower edge of the cover window 220 in cross-section.

The cover window protection layer 230_2 may include a top protection portion 231_2 in contact with the upper surface 220u of the cover window 220, a side protection portion 232_2 in contact with the side surface 220s of the cover window 220, a bottom protection portion 234_2 in contact with a portion of the lower surface 220b of the cover window 220, a first corner protection portion 233_2 disposed between the top protection portion 231_2 and the side protection portion 232_2 along an outer surface of the cover window 220, and a second corner protection portion 235_2 disposed between the side protection portion 232_2 and the bottom protection portion 234_2 along the outer surface of the cover window 220.

The top protection portion 231_2 may cover an entirety of the upper surface 220u of the cover window 220. The side protection portion 232_2 may cover an entirety of the side surfaces 220s of the cover window 220. The bottom protection portion 234_2 may partially cover the lower surface 220b of the cover window 220. A region of the lower surface 220b of the cover window 220 that is covered by the bottom protection portion 234_2, e.g., a region overlapping the bottom protection portion 234_2, may be disposed along the edge of the cover window 220.

The thickness t2u of the top protection portion 231_2 may be greater than the thickness t2s of the side protection portions 232_2, but is not limited thereto. The thickness t2u of the top protection portion 231_2 may be less than or equal to the thickness t2s of the side protection portions 232_2. The thickness t2u of the top protection portion 231_2 and the thickness t2s of the side protection portion 232_2 may be greater than the thickness t1 of the cover window 220, but are not limited thereto. They may be less than or equal to the thickness t1 of the cover window 220.

The thickness t2b of the bottom protection portion 234_2 may be less than or equal to the thickness t2u of the top protection portion 231_2 and the thickness t2s of the side protection portion 232_2, but is not limited thereto. The thickness t2b of the bottom protection portion 234_2 may be less than or equal to the thickness t2u of the top protection portion 231_2 and may be greater than or equal to the thickness t2s of the side protection portion 232_2.

The top protection portion 231_2 may be disposed on one side of the first corner protection portion 233_2, and the side protection portion 232_2 may be disposed on another side of the first corner protection portion 233_2. The first corner protection portion 233_2 may be disposed around the top protection portion 231_2 in a plan view. Specifically, the first corner protection portion 233_2 may surround the top protection portion 231_2 in the plan view.

The bottom protection portion 234_2 may be disposed on one side of the second corner protection portion 235_2, and the side protection portion 232_2 may be disposed on another side of the second corner protection portion 235_2. The second corner protection portion 235_2 may be disposed around the bottom protection portion 234_2 in a plan view. Specifically, the second corner protection portion 235_2 may surround the bottom protection portion 234_2 in a plan view.

The bottom protection portion 234_2 may extend along the lower surface 220b of the cover window 220, such that a step may be formed between the lower surface of the bottom protection portion 234_2 and the lower surface 220b of the cover window 220. The thickness of the step formed between the lower surface of the bottom protection portion 234_2 and the lower surface 220b of the cover window 220 may be equal to the thickness t2b of the bottom protection portion 234_2.

The second coupling member 252 may be disposed on the lower surface 220b of the cover window 220. The second coupling member 252 may partially cover the lower surface 220b of the cover window 220. Specifically, the second coupling member 252 may cover an area which is not covered by the bottom protection portion 234_2 on the lower surface 220b of the cover window 220. That is to say, a portion of the lower surface 220b of the cover window 220 may be covered by the second coupling member 252, and another portion thereof may be covered by the bottom protection portion 234_2.

The upper surface of the second coupling member 252 may have a shape conformal to the step between the lower surface of the bottom protection portion 234_2 and the lower surface 220b of the cover window 220. In other words, the upper surface of the second coupling member 252 may have a step conforming to the step between the lower surface of the bottom protection portion 234_2 and the lower surface 220b of the cover window 220.

The polarizing member 210 may be disposed at the back of the second coupling member 252, and the second coupling member 252 may couple the polarizing member 210 with the cover window 220. The elements disposed on the rear side of the polarizing member 210 are identical to those of the display device 10 and, therefore, the redundant descriptions will be omitted.

Figure 22:
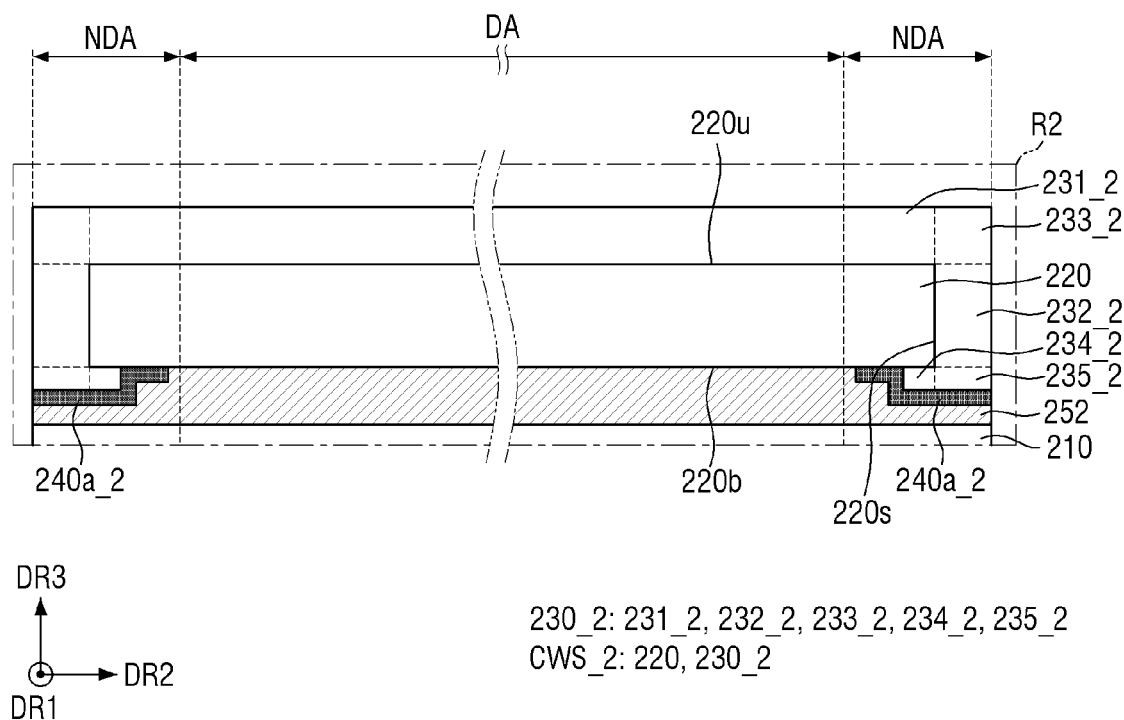
FIGS. 22 to 24 are cross-sectional views of embodiments of area R2 of FIG. 20.
Figure 23:
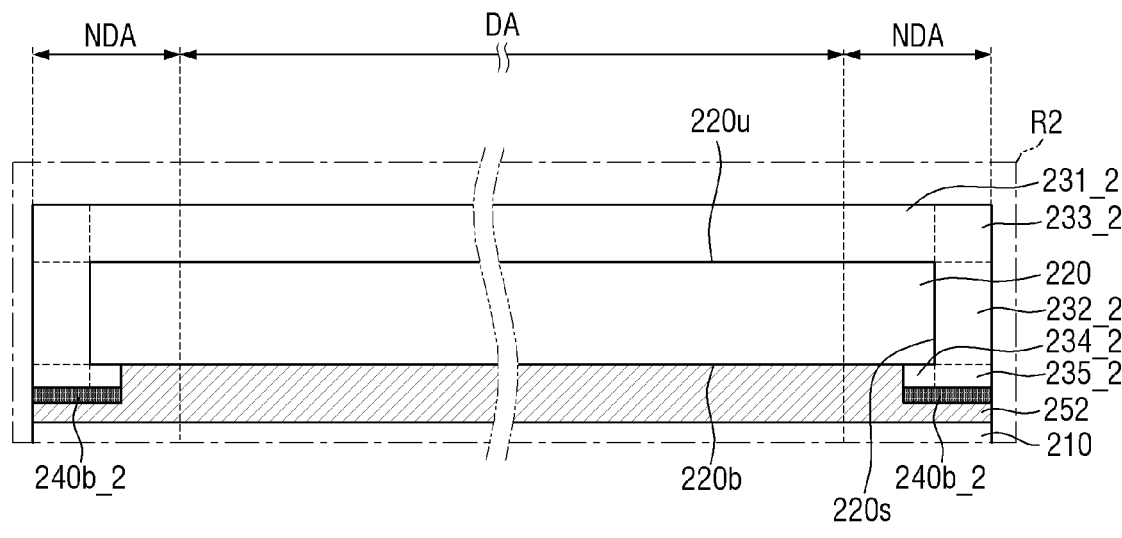
Figure 24:
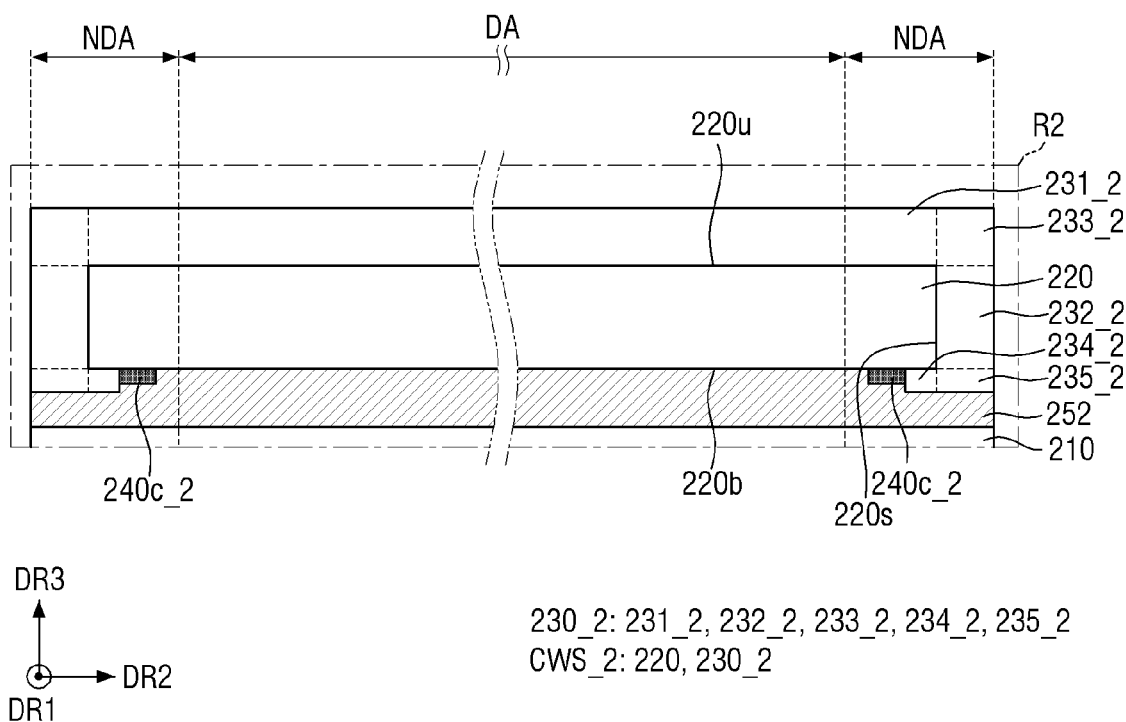

FIGS. 22 to 24 are cross-sectional views of embodiments of area R2 of FIG. 20.

Area R2 of FIG. 20, e.g., the area between the cover window protection layer 230_2 of a cover window structure CWS_2 and the second coupling member 252 may be modified in a variety of ways. In the following description, modifications of area R2 of FIG. 20 will be described, and, the redundant descriptions will be omitted.

Referring to FIG. 22 in conjunction with FIG. 20 a light-blocking member 240a_2 that absorbs and blocks light is further disposed between the cover window protection layer 230_2 and the second coupling member 252 and between the cover window 220 and the second coupling member 252.

According to this embodiment, the light-blocking member 240a_2 may overlap with the bottom protection portion 234_2 and the cover window 220. Specifically, the light-blocking member 240a_2 may be disposed on the lower surface of the bottom protection portion 234_2 and the lower surface 220b of the cover window 220. The light-blocking member 240a_2 may be disposed in the area between the lower surface of the bottom protection portion 234_2 and the lower surface 220b of the cover window 220 where a step is formed. That is to say, the light-blocking member 240a_2 may overlap the area between the lower surface of the bottom protection portion 234_2 and the lower surface 220b of the cover window 220 where the step is formed.

Although not shown in the drawings, the light-blocking member 240a_2 may be disposed along the edge of the cover window 220 and may overlap the non-display area NDA of the display panel 100.

Referring to FIG. 23 in conjunction with FIG. 20, a light-blocking member 240b_2 that absorbs and blocks light is further disposed between the cover window protection layer 230_2 and the second coupling member 252. According to this embodiment, the light-blocking member 240b_2 may be disposed between the bottom protection portion 234_2 and the second coupling member 252. The light-blocking member 240b_2 may partially overlap the cover window protection layer 230_2 and the cover window 220. The upper surface of the light-blocking member 240b_2 may be in contact with the bottom protection portion 234_2, and the lower surface and side surface thereof may be in contact with the second coupling member 252. Although not shown in the drawings, the light-blocking member 240b_2 may be disposed along the edge of the cover window 220 and may overlap the non-display area NDA of the display panel 100.

Referring to FIG. 24 in conjunction with FIG. 20, a light-blocking member 240c_2 that absorbs and blocks light is further disposed between the cover window protection layer 230_2 and the second coupling member 252. According to this embodiment, the light-blocking member 240c_2 may be disposed between the cover window 220 and the second coupling member 252. The light-blocking member 240c_2 may overlap the bottom protection portion 234_2 but may not overlap the cover window 220. The upper surface of the light-blocking member 240c_2 may be in contact with the cover window 220, and the lower surface and side surface thereof may be in contact with the second coupling member 252. Although not shown in the drawings, the light-blocking member 240c_2 may be disposed along the edge of the cover window 220 and may overlap the non-display area NDA of the display panel 100.

According to one or more embodiment of the invention, it is possible to effectively protect the cover window 220 of the display device 10_2 by the cover window protection layer 230_2 covering the upper surface 220u and at least a portion of the side surface 220s of the cover window 220. In addition, the cover window 220 and the cover window protection layer 230_2 may be coupled with each other via a simpler thermocompression bonding process.

In addition, according to this embodiment, the display device 10_2 includes the cover window protection layer 230_2 disposed to surround the edge of the cover window 220, so that it is possible to more stably protect the cover window 220 from an external shock.

Figure 25:
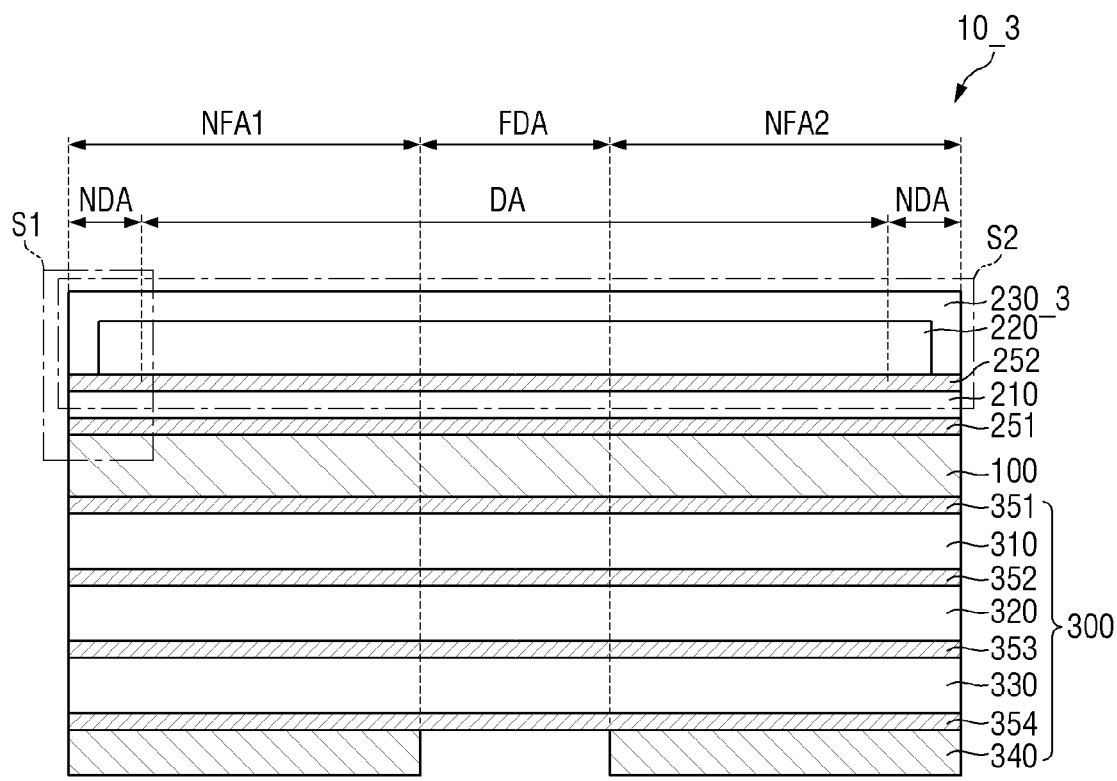
FIG. 25 is a cross-sectional view of an embodiment of a display device which is unfolded.
Figure 26:
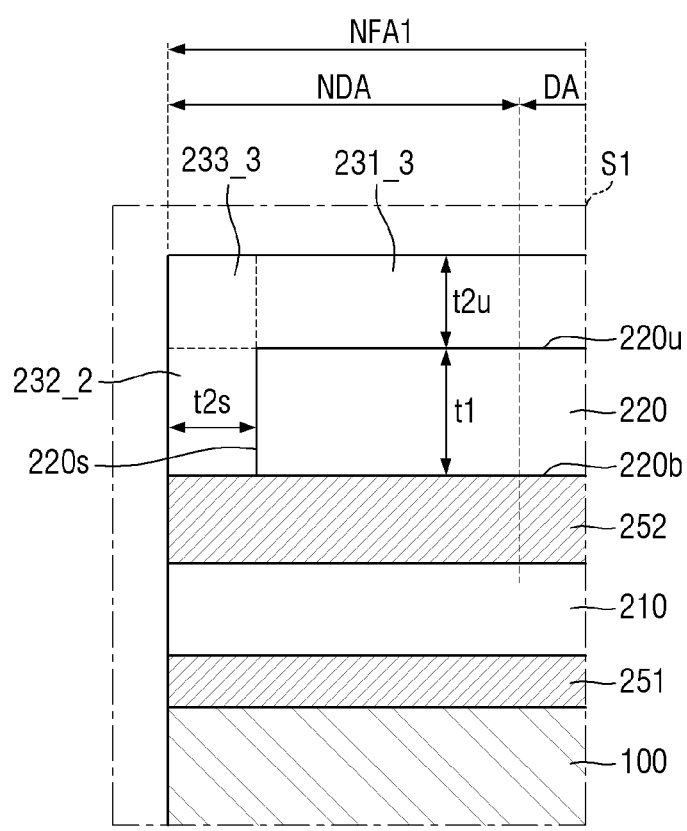
FIG. 26 is an enlarged view of an embodiment of area S1 of FIG. 25.

FIG. 25 is a cross-sectional view of an embodiment of a display device 10_3 which is unfolded. FIG. 26 is an enlarged view of an embodiment of area S1 of FIG. 25.

A display device 10_3 according to the embodiment of FIGS. 25 and 26 is different from the display device 10 in that the display device 10_3 includes a front stack structure 200_3 having a different structure. Specifically, the cover window protection layer 230_3 of the cover window structure CWS_3 included in the front stack structure 200_3 may be disposed to cover the upper surface 220u and the side surface 220s of the cover window 220. The cover window protection layer 230_3 may cover an entirety of the upper surface 220u and the side surfaces 220s of the cover window 220. In other words, the cover window protection layer 230_3 may be disposed to surround the side surface 220s of the cover window 220.

The cover window protection layer 230_3 may include a top protection portion 231_3 overlapping the upper surface 220u of the cover window 220, a side protection portion 232_3 overlapping the side surface 220s to cover window 220, and a corner protection portion 233_3 disposed between the top protection portion 231_3 and the side protection portion 232_3.

The top protection portion 231_3 may cover an entirety of the upper surface 220u of the cover window 220. The side protection portion 232_3 may cover an entirety of the side surface 220s of the cover window 220.

The lower surface of the side protection portion 232_3 may be aligned with the lower surface 220b of the cover window 220. In other words, the lower surface of the side protection portion 232_3 may be located on substantially the same plane with the lower surface 220b of the cover window 220 (e.g., coplanar with each other).

The thickness $t2u$ of the top protection portion 231_3 may be greater than the thickness $t2s$ of the side protection portion 232_3, but is not limited thereto. The thickness $t2u$ of the top protection portion 231_3 may be less than or equal to the thickness $t2s$ of the side protection portion 232_3. The thickness $t2u$ of the top protection portion 231_3 and the thickness $t2s$ of the side protection portion 232_3 may be greater than the thickness $t1$ of the cover window 220, but is not limited thereto. They may be less than or equal to the thickness $t1$ of the cover window 220.

The top protection portion 231_3 may be disposed on one side of the corner protection portion 233_3, and the side protection portion 232_3 may be disposed on another side of the corner protection portion 233_3. The corner protection portion 233_3 may be disposed around the top protection portion 231_3. Specifically, the corner protection portion 233_3 may be disposed to surround the top protection portion 231_3.

The second coupling member 252 may be disposed on the lower surface of the side protection portion 232_3 and the lower surface 220b of the cover window 220. The second coupling member 252 may cover an entirety of the lower surface 220b of the cover window 220. In addition, the second coupling member 252 may cover an entirety of the lower surface of the side protection portion 232_3. In other words, the second coupling member 252 may be disposed on the lower surface of the side protection portion 232_3 and the lower surface 220b of the cover window 220.

The upper surface of the second coupling member 252 may be in contact with the lower surface of the side protection portion 232_3 and the lower surface 220b of the cover window 220. That is to say, the upper surface of the second coupling member 252 may be located on the same plane across different regions. The second coupling member 252 may have a constant thickness across different regions, but is not limited thereto.

The polarizing member 210 may be disposed at the back of the second coupling member 252, and the second coupling member 252 may couple the polarizing member 210 with the cover window 220. The elements disposed on the rear side of the polarizing member 210 are identical to those of the display device and, therefore, the redundant descriptions will be omitted.

Figure 27:
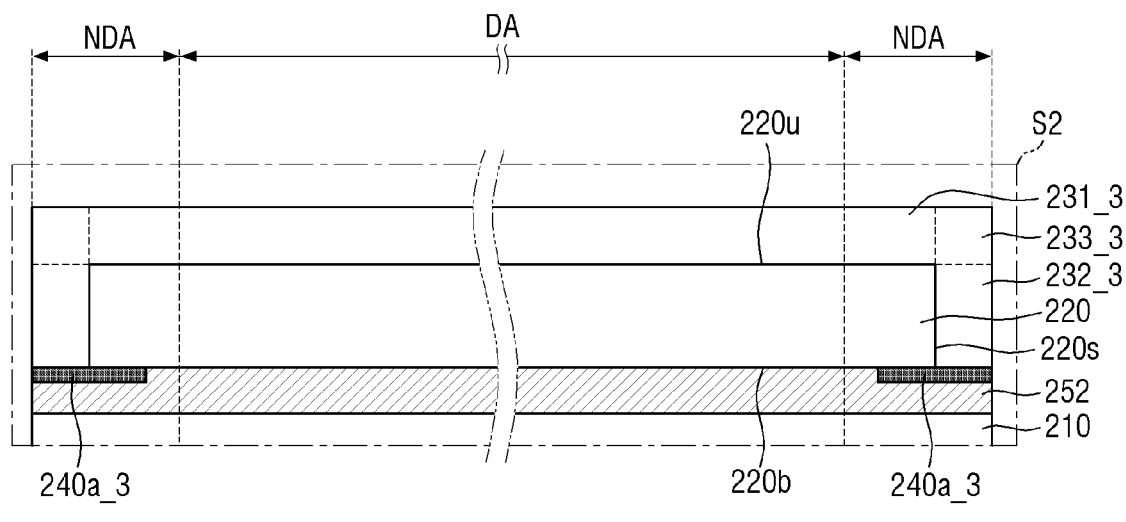
FIGS. 27 to 29 are cross-sectional views of embodiments of area S2 of FIG. 25.
Figure 27:
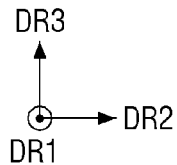
Figure 28:
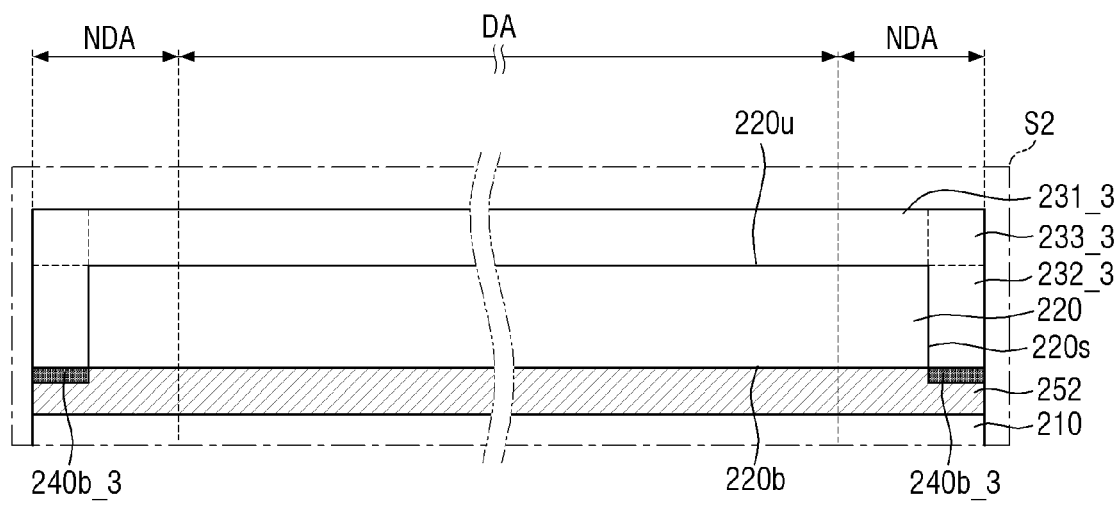
Figure 28:
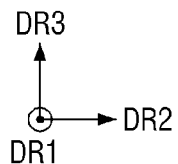
Figure 29:
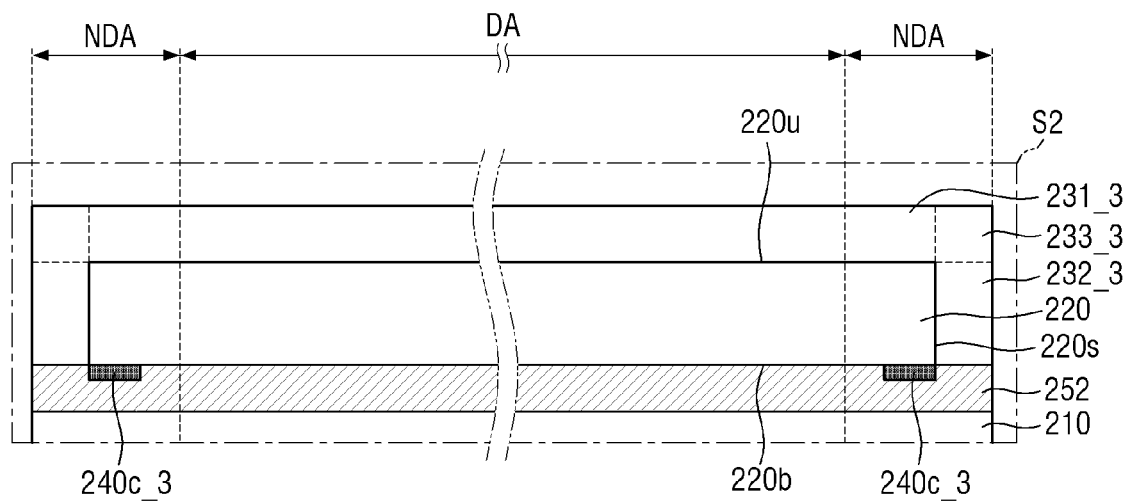

FIGS. 27 to 29 are cross-sectional views of embodiments of area S2 of FIG. 25.

Area S2 of FIG. 25, e.g., the area between the cover window protection layer 230_3 and the second coupling member 252 may be modified in a variety of ways. In the following description, modifications of area S2 of FIG. 25 will be described, and, the redundant descriptions will be omitted.

Referring to FIG. 27 in conjunction with FIG. 25, a light-blocking member 240a_3 that absorbs and blocks light is further disposed between the cover window protection layer 230_3 and the second coupling member 252 and between the cover window 220 and the second coupling member 252.

According to this embodiment, the light-blocking member 240a_3 may overlap with the side protection portion 232_3 and the cover window 220. Specifically, the light-blocking member 240a_3 may be disposed on the lower surface of the side protection portion 232_3 and the lower surface 220b of the cover window 220. The light-blocking member 240a_3 may be disposed in the area where the lower surface of the side protection portion 232_3 and the lower surface 220b of the cover window 220 are aligned with each other and meet each other.

Although not shown in the drawings, the light-blocking member 240a_3 may be disposed along the edge of the cover window 220 and may overlap the non-display area NDA of the display panel 100.

Referring to FIG. 28 in conjunction with FIG. 25, a light-blocking member 240b_3 that absorbs and blocks light is further disposed between the cover window protection layer 230_3 and the second coupling member 252. According to this embodiment, the light-blocking member 240b_3 may be disposed between the side protection portion 232_3 and the second coupling member 252. The light-blocking member 240b_3 may overlap the cover window protection layer 230_3 but may not overlap the cover window 220. The upper surface of the light-blocking member 240b_3 may be in contact with the side protection portion 232_3, and the lower surface and side surface thereof may be in contact with the second coupling member 252. Although not shown in the drawings, the light-blocking member 240b_3 may be disposed along the edge of the cover window 220 and may overlap the non-display area NDA of the display panel 100.

Referring to FIG. 29 in conjunction with FIG. 25 a light-blocking member 240c_3 that absorbs and blocks light is further disposed between the cover window protection layer 230_3 and the second coupling member 252. According to this embodiment, the light-blocking member 240c_3 may be disposed between the cover window 220 and the second coupling member 252. The light-blocking member 240c_3 may overlap the cover window 220, but may not overlap the side protection portion 232_3. The upper surface of the light-blocking member 240c_3 may be in contact with the cover window 220, and the lower surface and side surface thereof may be in contact with the second coupling member 252. Although not shown in the drawings, the light-blocking member 240c_3 may be disposed along the edge of the cover window 220 and may overlap the non-display area NDA of the display panel 100.

According to one or more embodiment of the invention, it is possible to effectively protect the cover window 220 of the display device 10_3 by the cover window protection layer 230_3 covering the upper surface 220u and at least a portion of the side surface 220s of the cover window 220. In addition, the cover window 220 and the cover window protection layer 230_3 may be coupled with each other via a simpler thermocompression bonding process.

In addition, according to this embodiment, the display device 10_3 includes the cover window protection layer 230_3 disposed to surround the side surface of the cover window 220, so that it is possible to more stably protect the side surface of the cover window 220 from an external shock.

Figure 30:
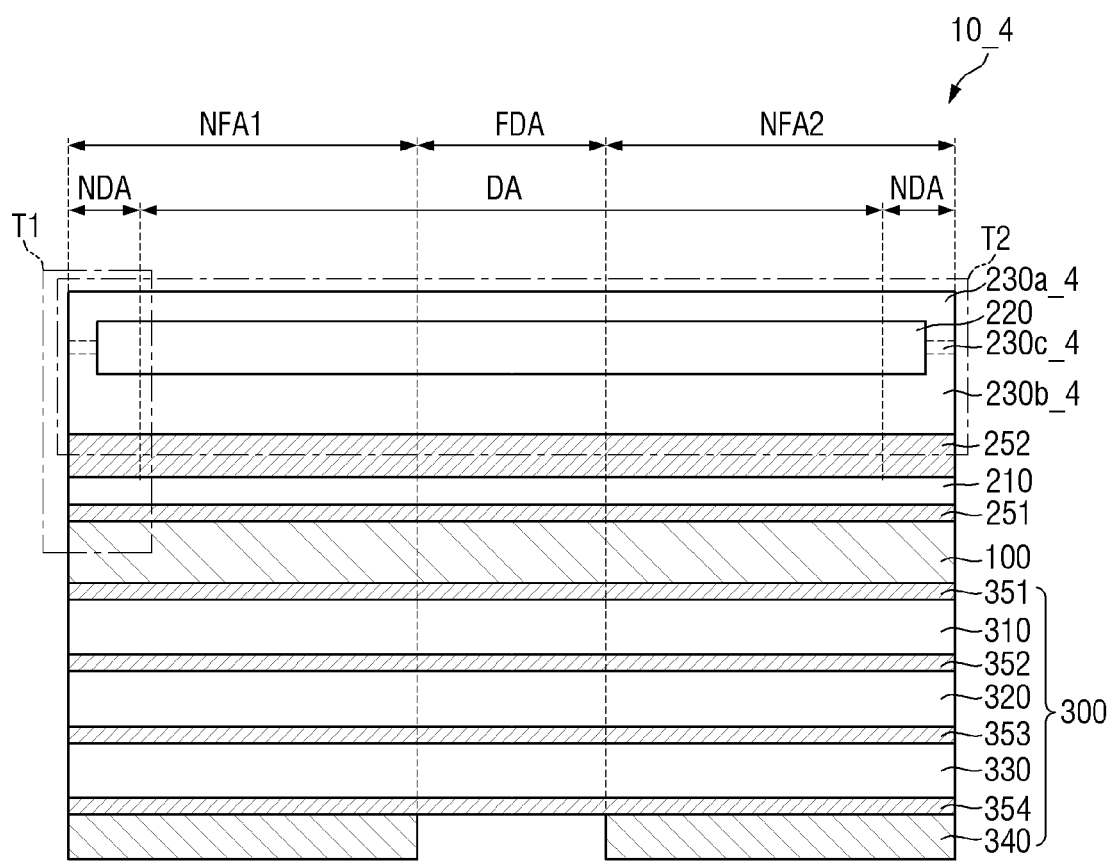
FIG. 30 is a cross-sectional view of an embodiment of a display device which is unfolded.
Figure 31:
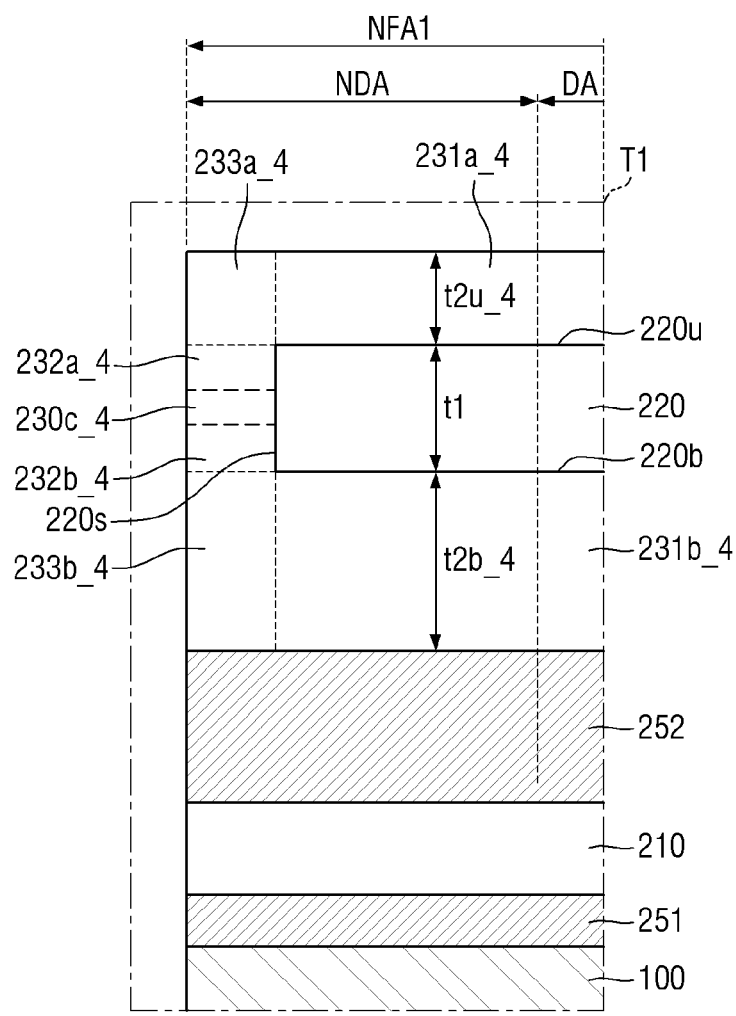
FIG. 31 is an enlarged view of an embodiment of area T1 of FIG. 30.

FIG. 30 is a cross-sectional view of an embodiment of a display device 10_4 which is unfolded. FIG. 31 is an enlarged view of an embodiment of area T1 of FIG. 30.

Referring to FIGS. 30 and 31, a display device 10_4 is different from the display device 10 in that the display device 10_4 includes a front stack structure 200_4 having a different structure. Specifically, a cover window protection layer 230_4 of a cover window structure CWS_4 included in the front stack structure 200_4 is disposed to surround the cover window 220 not only in a plan view, but also in a cross-sectional view.

According to this embodiment, the cover window protection layer 230_4 may cover an entirety of the upper surface 220u, the lower surface 220b and the side surface 220s of the cover window 220. The cover window protection layer 230_4 may include a first protection portion 230a_4 disposed on the upper surface 220u of the cover window 220, a second protection portion 230b_4 (e.g., third window protection layer) disposed on the lower surface 220b of the cover window 220, and a third protection portion 230c_4 disposed on the side surface 220s of the cover window 220.

The first protection portion 230a_4 may include a top protection portion 231a_4 overlapping the upper surface 220u of the cover window 220, a first side protection portion 232a_4 overlapping the side surface 220s of the cover window 220, and a first corner protection portion 233a_4 disposed between the top protection portion 231a_4 and the first side protection portion 232a_4.

The second protection portion 230b_4 may include a bottom protection portion 231b_4 overlapping the lower surface 220b of the cover window 220, a second side protection portion 232b_4 overlapping the side surface 220s of the cover window 220, and a second corner protection portion 233b_4 disposed between the bottom protection portion 231b_4 and the second side protection portion 232b_4.

The thickness t2u_4 of the top protection portion 231a_4 may be smaller than the thickness t2b_4 of the bottom protection portion 231b_4. In an embodiment, for example, the thickness t2u_4 of the top protection portion 231a_4 may be in the range of approximately 5 μm to approximately 50 μm, and the thickness t2b_4 of the bottom protection portion 231b_4 may be in the range of approximately 5 μm to approximately 100 μm.

The third protection portion 230c_4 may be disposed between the first side protection portion 232a_4 and the second side protection portion 232b_4. The third protection portion 230c_4 may be formed by partially melting the first protection portion 230a_4 and the second protection portion 230b_4 together. That is, the third protection portion 230c_4 is a melted portion including portions of both the first protection portion 230a_4 and the second protection portion 230b_4 together. Accordingly, the third protection portion 230c_4 may have properties between that of the first protection portion 230a_4 and that of the second protection portion 230b_4. More detailed description thereon will be described given later.

The first protection portion 230a_4 and the second protection portion 230b_4 may include the same material or may include different materials. When the first protection portion 230a_4 and the second protection portion 230b_4 include or are made of the same material, the composition of the material included in the first protection portion 230a_4 may be different from the composition of the material of the second protection portion 230b_4.

When the first protection portion 230a_4 and the second protection portion 230b_4 include or are made of the same material, the third protection portion 230c_4 may have an intermediate composition of the first protection portion 230a_4 and the second protection portion 230b_4. In an embodiment, for example, if a material is contained in the first protection portion 230a_4 more than in the second protection portion 230b_4 (e.g., higher density, higher concentration, higher amount, etc.), the material may be contained in the third protection portion 230c_4 less than in the first protection portion and more than in the second protection portion 230b_4.

If the first protection portion 230a_4 and the second protection portion 230b_4 contain different materials, the third protection portion 230c_4 as a melted portion of the first protection portion 230a_4 and the second protection portion 230b_4 may contain the material contained in the first protection portion 230a_4 as well as the material contained in the second protection portion 230b_4. In an embodiment, for example, the material that is contained only in the first protection portion 230a_4 but not in the second protection portion 230b_4, or the material that is contained only in the second protection portion 230b_4 but not in the first protection portion 230a_4 may be contained in the third protection portion 230c_4.

In an embodiment, for example, if the first protection portion 230a_4 contains a first material and the second protection portion 230b_4 contains a second material which is different from the first material, the third protection portion 230c_4 may include a first region containing the first material but not the second material (e.g., excluding the second material), a second region containing the second material but not the first material (e.g., excluding the first material), and a third region located between the first region and the second region and containing both the first material and the second material.

Each of the first protection portion 230a_4 and the second protection portion 230b_4 may have a Young's modulus. The Young's modulus of the first protection portion 230a_4 may be greater than the Young's modulus of the second protection portion 230b_4. In an embodiment, for example, the Young's modulus of the first protection portion 230a_4 may be approximately 3 GPa to approximately 10 GPa, and the Young's modulus of the second protection portion 230b_4 may be approximately 1 GPa to approximately 2 GPa. The Young's modulus of the third protection portion 230c_4 may be smaller than the Young's modulus of the first protection portion 230a_4 and greater than the Young's modulus of the second protection portion 230b_4.

In addition, each of the first protection portion 230a_4 and the second protection portion 230b_4 may have an elongation percentage. The elongation percentage of the first protection portion 230a_4 may be smaller than the elongation percentage of the second protection portion 230a_4. In an embodiment, for example, the elongation percentage of the first protection portion 230a_4 may be approximately 50% to approximately 100%, and the elongation percentage of the second protection portion 230b_4 may be approximately 300% to approximately 500%. The elongation percentage of the third protection portion 230c_4 may be greater than the elongation percentage of the first protection portion 230a_4 and may be smaller than the elongation percentage of the second protection portion 230b_4.

Each of the first protection portion 230a_4 and the second protection portion 230b_4 may include a transparent polymer film. The transparent polymer film may include at least one of an epoxy resin, polyurethane, polyester, polyethylene terephthalate, polyethylene naphthalate, polyimide, polyarylate, polycarbonate, polymethyl methacrylate, ethyl vinyl acetate, and polyamide resin.

The second coupling member 252 may be disposed on the rear side of the cover window protection layer 230_4. In addition, the polarizing member 210 may be disposed on the rear side of the second coupling member 252, and the second coupling member 252 may couple the polarizing member 210 with the cover window protection layer 230_4. The elements disposed on the rear side of the polarizing member 210 are identical to those of the display device 10 according to the above-described embodiment; and, therefore, the redundant descriptions will be omitted.

Figure 32:
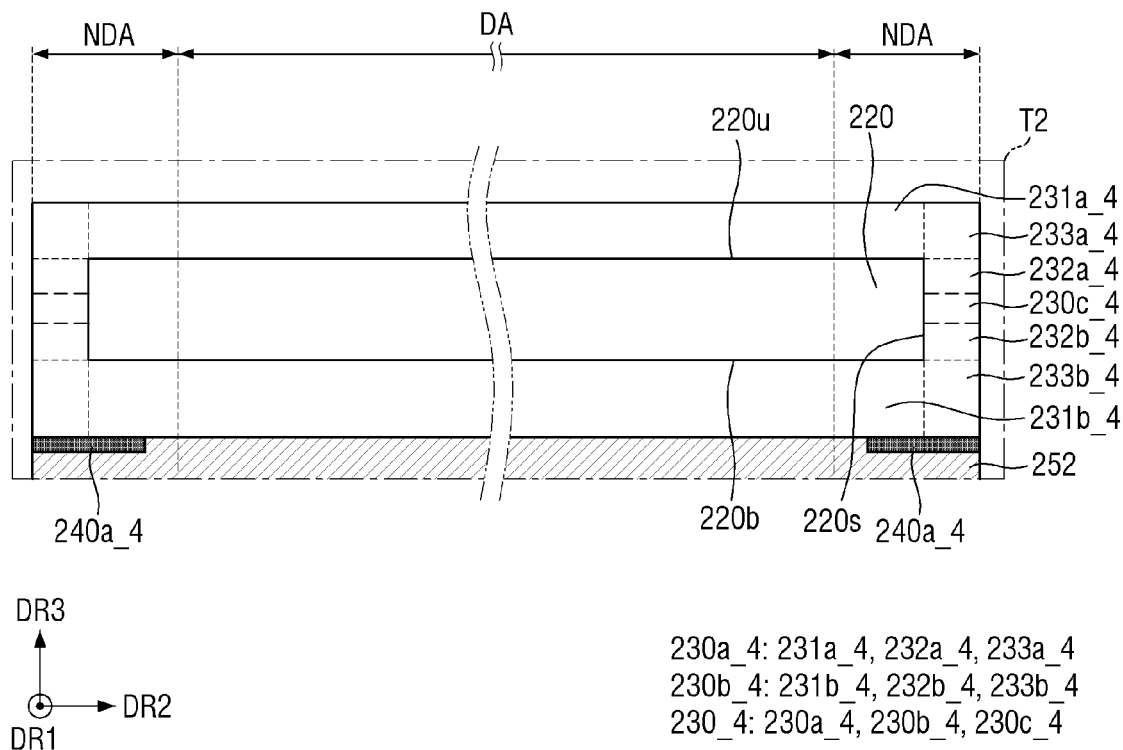
FIGS. 32 to 34 are cross-sectional views of embodiments of area T2 of FIG. 30.
Figure 33:
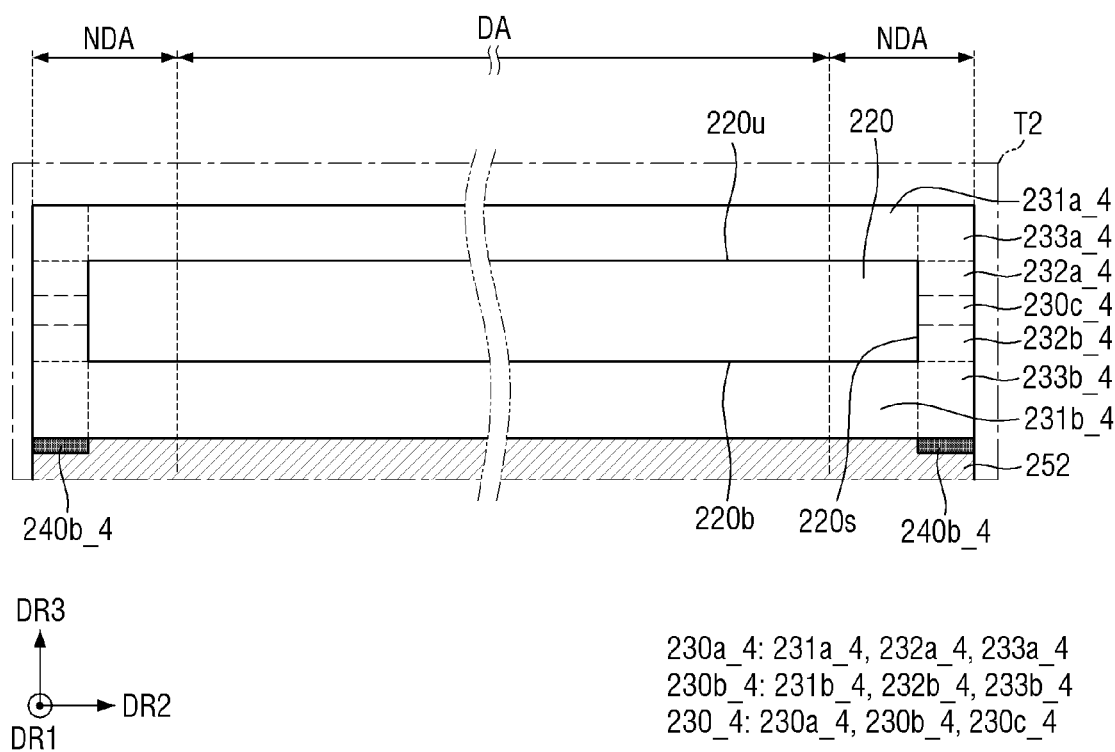
Figure 34:
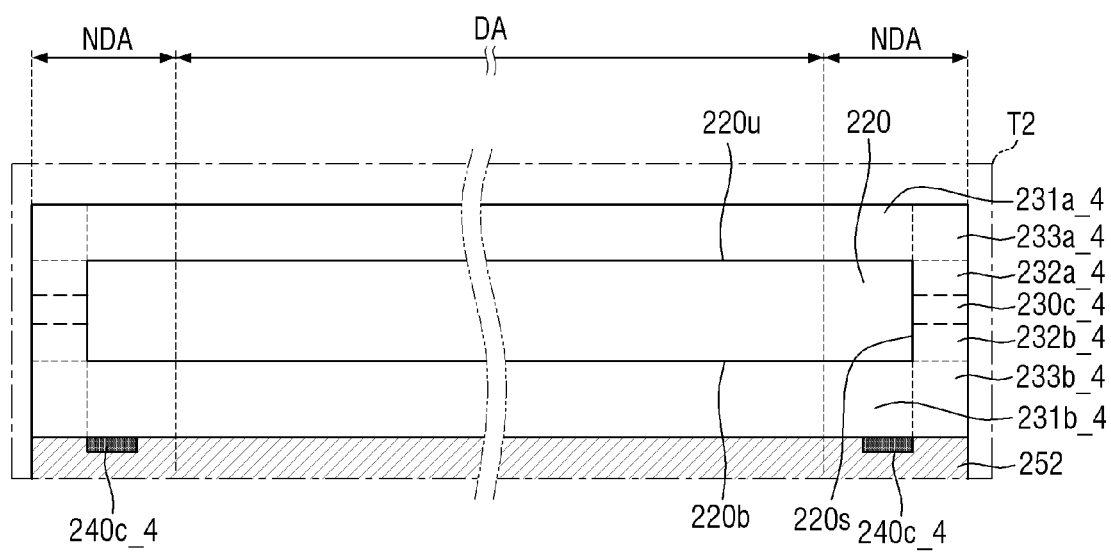

FIGS. 32 to 34 are cross-sectional views of embodiments of area T2 of FIG. 30.

Area T2 of FIG. 30, e.g., the area between the cover window protection layer 230_4 and the second coupling member 252 may be modified in a variety of ways. In the following description, modifications of area T2 of FIG. 30 will be described, and, the redundant descriptions will be omitted.

Referring to FIG. 32 in conjunction with FIG. 30, a light-blocking member 240a_4 that absorbs and blocks light is further disposed between the cover window protection layer 230_4 and the second coupling member 252.

According to this embodiment, the light-blocking member 240a_4 may be disposed on the lower surface of the second protection portion 230b_4. The light-blocking member 240a_4 may overlap the cover window protection layer 230_4 and the cover window 220. Specifically, the light-blocking member 240a_4 may be disposed to overlap the first side protection portion 232a_4, the first corner protection portion 233a_4, the second side protection portion 232b_4, the second corner protection portion 233b_4, the third protection portion 230c_4 and the bottom protection portion 231b_4 in the cover window protection layer 230_4.

Although not shown in the drawings, the light-blocking member 240a_4 may be disposed along the edge of the cover window 220 and may overlap the non-display area NDA of the display panel 100.

Referring to FIG. 33 in conjunction with FIG. 30 a light-blocking member 240b_4 that absorbs and blocks light is further disposed between the cover window protection layer 230_4 and the second coupling member 252.

According to this embodiment, the light-blocking member 240b_4 may be disposed on the lower surface of the second protection portion 230b_4. The light-blocking member 240b_4 may overlap a portion of the cover window protection layer 230_4 but may not overlap the cover window 220. Specifically, the light-blocking member 240b_4 may be disposed to overlap the first side protection portion 232a_4, the first corner protection portion 233a_4, the second side protection portion 232b_4, the second corner protection portion 233b_4, and the third protection portion 230c_4 in the cover window protection layer 230_4.

Although not shown in the drawings, the light-blocking member 240b_4 may be disposed along the edge of the cover window 220 and may overlap the non-display area NDA of the display panel 100.

Referring to FIG. 34 in conjunction with FIG. 30, a light-blocking member 240c_4 that absorbs and blocks light is further disposed between the cover window protection layer 230_4 and the second coupling member 252.

According to this embodiment, the light-blocking member 240c_4 may be disposed on the lower surface of the second protection portion 230b_4. Specifically, the light-blocking member 240b_4 may be disposed on the lower surface of the bottom protection portion 231b_4. The light-blocking member 240c_4 may overlap the cover window 220 but may not overlap a portion of the cover window protection layer 230_4. Specifically, the light-blocking member 240c_4 may be disposed to not overlap the first side protection portion 232a_4, the first corner protection portion 233a_4, the second side protection portion 232b_4, the second corner protection portion 233b_4 and the third protection portion 230c_4 in the cover window protection layer 230_4.

Although not shown in the drawings, the light-blocking member 240c_4 may be disposed along the edge of the cover window 220 and may overlap the non-display area NDA of the display panel 100.

According to one or more embodiments of the invention, it is possible to effectively protect the cover window 220 of the display device 10_4 by the cover window protection layer 230_4 covering the upper surface 220u and at least a portion of the side surface 220s of the cover window 220. In addition, the cover window 220 and the cover window protection layer 230_4 may be coupled with each other via a simpler thermocompression bonding process.

In addition, according to this embodiment, the display device 10_4 includes the cover window protection layer 230_4 disposed to surround an entirety of the cover window 220, so that it is possible to more stably protect the cover window 220 from an external shock.

Figure 35:
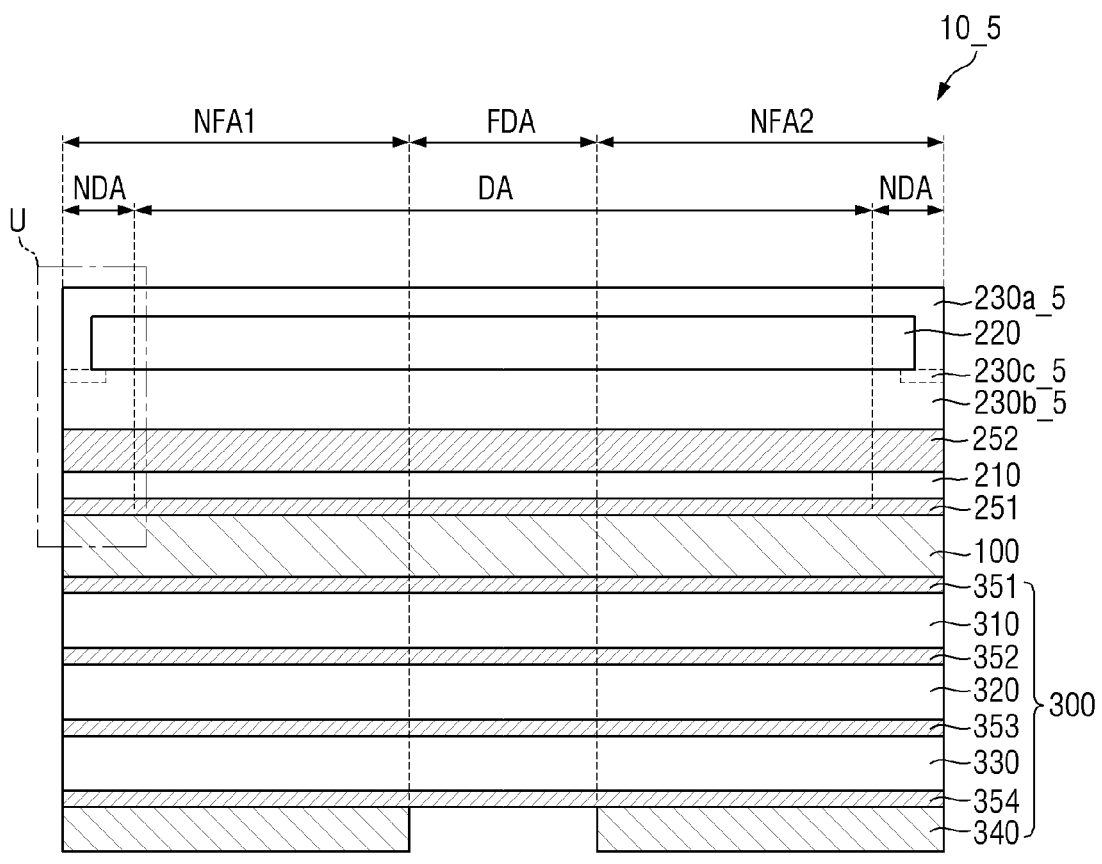
FIG. 35 is a cross-sectional view of an embodiment of a display device which is unfolded.
Figure 36:
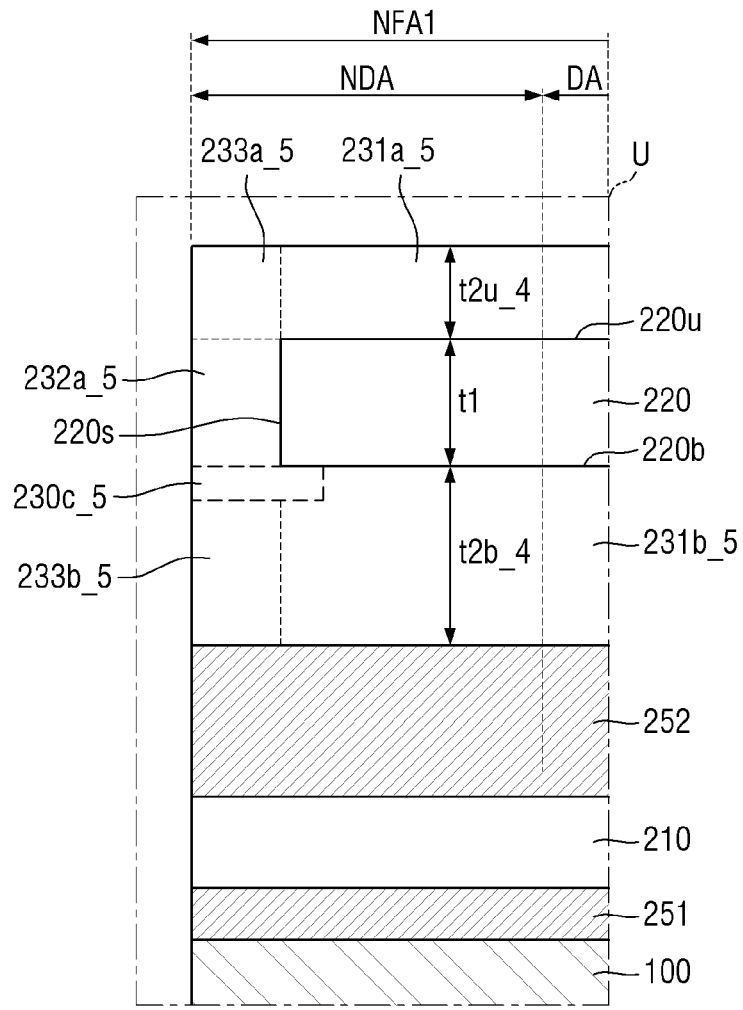
FIG. 36 is an enlarged view of an embodiment of area U of FIG. 35.

FIG. 35 is a cross-sectional view of an embodiment of a display device 10_5 which is unfolded. FIG. 36 is an enlarged view of an embodiment of area U of FIG. 35.

Referring to FIGS. 35 and 36, a display device 10_5 is different from the display device 10_4 described above with reference to FIGS. 30 and 31 in that a third protection portion 230c_5 is located at the rear side of the lower surface 220b of the cover window 220 instead of at a respective side surface thereof.

The cover window protection layer 230_5 may cover an entirety of the upper surface 220u, the side surface 220s and a portion of the lower surface 220b and of the cover window 220. The cover window protection layer 230_5 may include a first protection portion 230a_5 disposed on the upper surface 220u of the cover window 220, a second protection portion 230b_5 disposed on the lower surface 220b of the cover window 220, and a third protection portion 230c_5 disposed on the side surface 220s of the cover window 220.

The first protection portion 230a_5 may include a top protection portion 231a_5 overlapping the upper surface 220u of the cover window 220, a first side protection portion 232a_5 overlapping the side surface 220s of the cover window 220, and a first corner protection portion 233a_5 disposed between the top protection portion 231a_5 and the first side protection portion 232a_5.

The second protection portion 230b_5 may include a bottom protection portion 231b_5 overlapping the lower surface 220b of the cover window 220, and a second corner protection portion 233b_5 disposed between the bottom protection portion 231b_5 and the third protection portion 230c_5.

A cover window structure CWS_5 included in the display device 10_5 may be produced by forming the cover window structure CWS_2 included in the display device 10_2 described above with reference to FIGS. 20 and 21, and then additionally thermocompression bonding a new cover window protection material (not shown) to an exposed surface of the cover window 220 in the cover window structure CWS_2. Accordingly, the third protection portion 230c_5 included in the display device 10_5 may be formed as the bottom protection portion 234_2 and the second corner protection portion 235_2 are thermocompression bonded with a new cover window protection material (not shown) in the cover window structure CWS_2 described above with reference to FIGS. 20 and 21. The third protection portion 230c_5 may be disposed between the first side protection portion 232a_5 and the second corner protection portion 233b_5. The third protection portion 230c_5 may be formed by partially melting the first protection portion 230a_5 and the second protection portion 230b_5 together.

According to this, it is possible to effectively protect the cover window 220 of the display device 10_5 by the cover window protection layer 230_5 covering the upper surface 220u and at least a portion of the side surface 220s of the cover window 220. In addition, the cover window 220 and the cover window protection layer 230_5 may be coupled with each other via a simpler thermocompression bonding process.

In addition, according to this embodiment, the display device 10_5 includes the cover window protection layer 230_5 disposed to surround an entirety of the cover window 220, so that it is possible to more stably protect the cover window 220 from an external shock.

Figure 37:
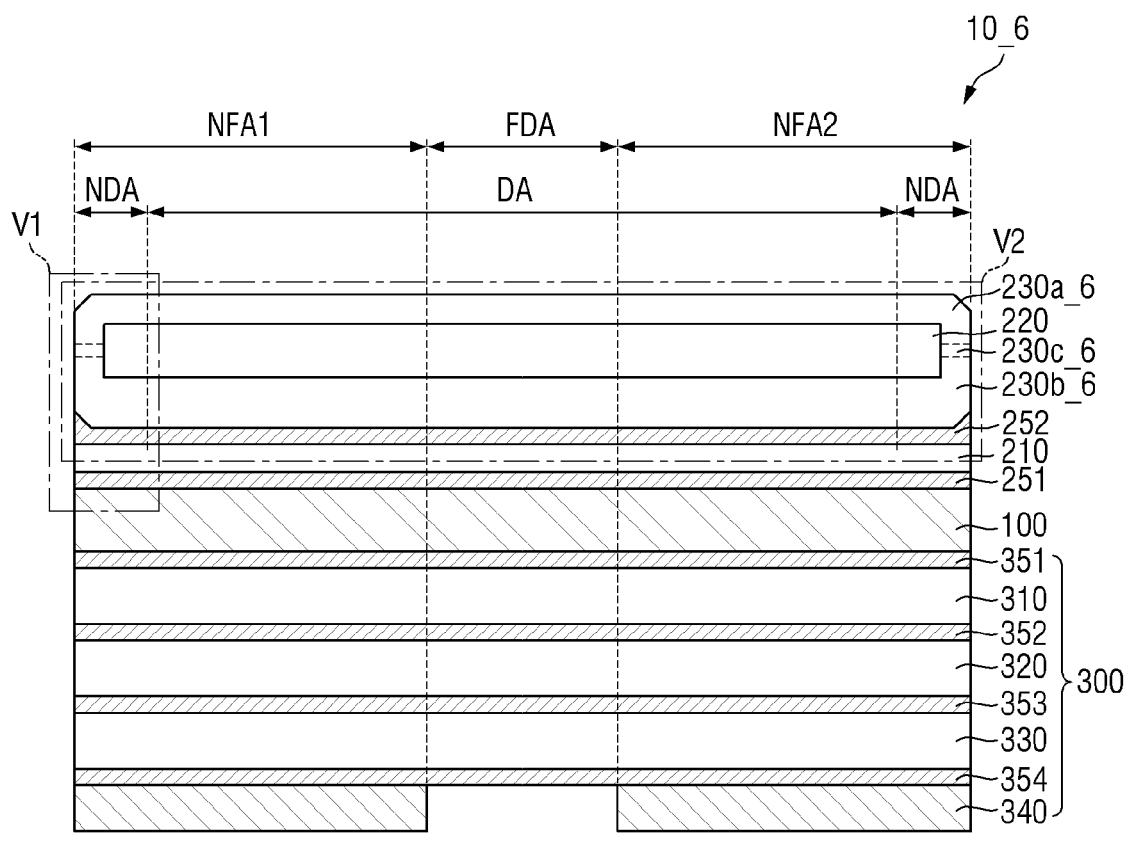
FIG. 37 is a cross-sectional view of an embodiment of a display device which is unfolded.
Figure 38:
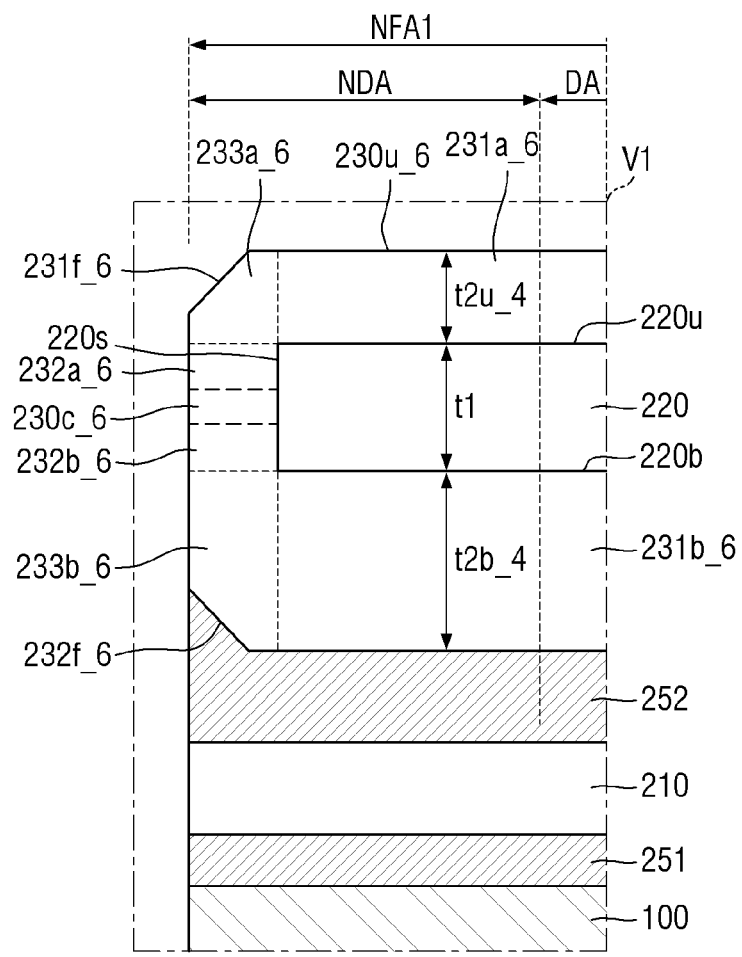
FIG. 38 is an enlarged view of an embodiment of area V1 of FIG. 37.

FIG. 37 is a cross-sectional view of an embodiment of a display device 10_6 which is unfolded. FIG. 38 is an enlarged view of an embodiment of area V1 of FIG. 37.

Referring to FIGS. 37 and 38, a display device 10_6 is different from the display device 10_4 described above with reference to FIGS. 30 and 31 in that the display device 10_6 includes a front stack structure 200_6 having a different structure. Specifically, a cover window protection layer 230_6 included in the front stack structure 200_6 is different from the display device 10_4 described above with reference to FIGS. 30 and 31 in that it further includes partially chamfered portions 231f_6 and 232f_6.

The chamfered portions 231f_6 and 232f_6 may include a first chamfered portion 231f_6 disposed on the front side and a second chamfered portion 232f_6 disposed on the rear side.

The first chamfered portion 231f_6 defines an inclined surface, and may be disposed between the upper surface 230u_6 and the side surface of the first protection portion 230a_6. The second chamfered portion 232f_6 defines an inclined surface, and may be disposed between the lower surface and the side surface of the second protection portion 230b_6.

The cover window protection layer 230_6 has inclined corners of the cover window protection layer 230_6 by forming the chamfered portions 231f_6 and 232f_6, to prevent damage to the corners of the cover window protection layer 230_6.

The shape of the chamfered portions 231f_6 and 232f_6 may be variously determined depending on the shape in which the cover window protection layer 230_6 is chamfered.

The cover window protection layer 230_6 may cover an entirety of the upper surface 220u, the side surface 220s and the portion of the lower surface 220b and of the cover window 220. The cover window protection layer 230_6 may include a first protection portion 230a_6 disposed on the upper surface 220u of the cover window 220, a second protection portion 230b_6 disposed on the lower surface 220b of the cover window 220, and a third protection portion 230c_6 disposed on the side surface 220s of the cover window 220.

The first protection portion 230a_6 may include a top protection portion 231a_6 overlapping the upper surface 220u of the cover window 220, a first side protection portion 232a_6 overlapping the side surface 220s of the cover window 220, and a first corner protection portion 233a_6 disposed between the top protection portion 231a_6 and the first side protection portion 232a_6.

The second protection portion 230b_6 may include a bottom protection portion 231b_6 overlapping the lower surface 220b of the cover window 220, a second side protection portion 232b_6 overlapping the side surface 220s of the cover window 220 and a second corner protection portion 233b_6 disposed between the bottom protection portion 231b_6 and the second side protection portion 232b_6.

Figure 39:
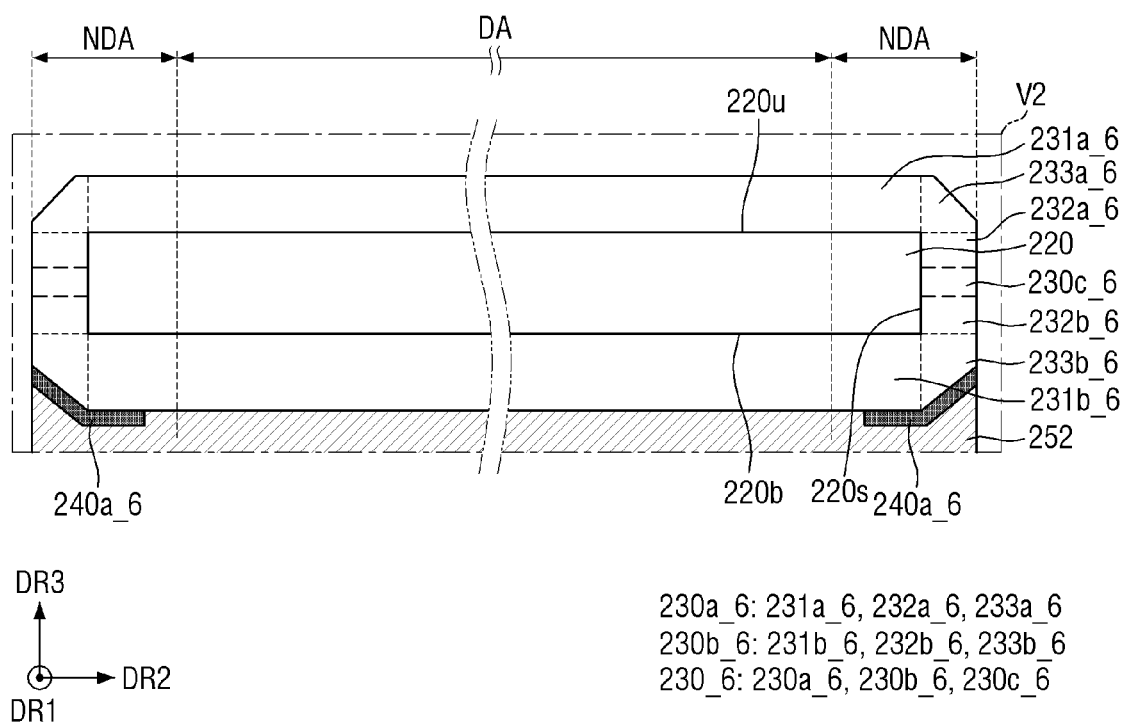
FIGS. 39 to 41 are cross-sectional views of embodiments of area V2 of FIG. 37.
Figure 40:
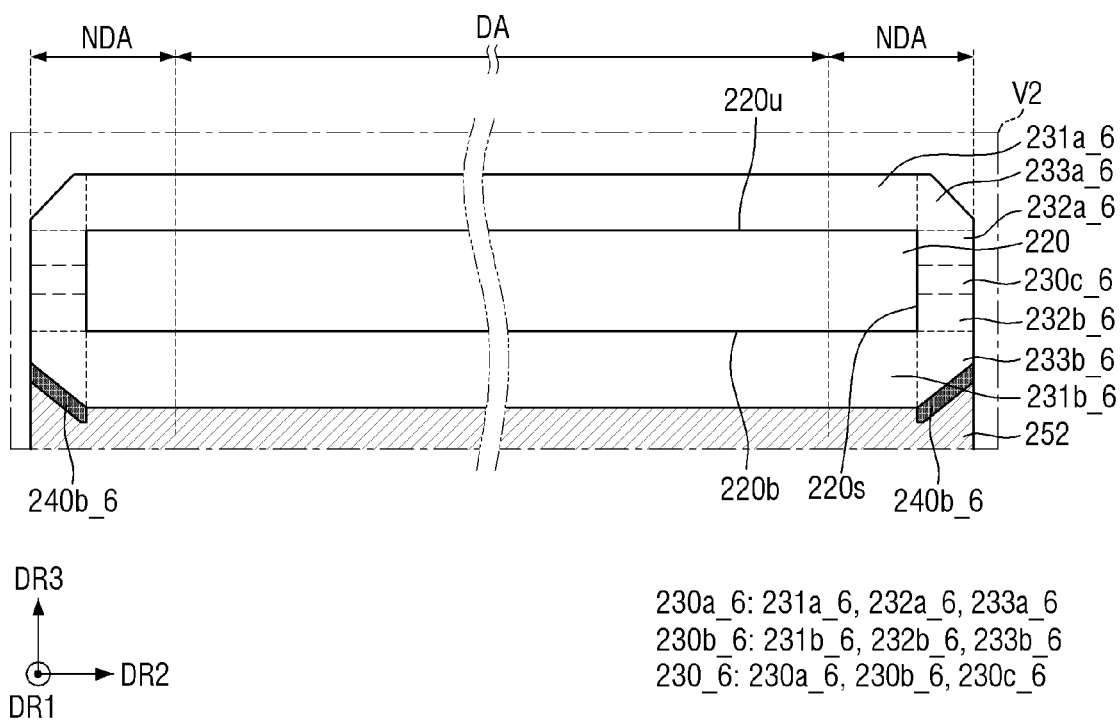
Figure 41:
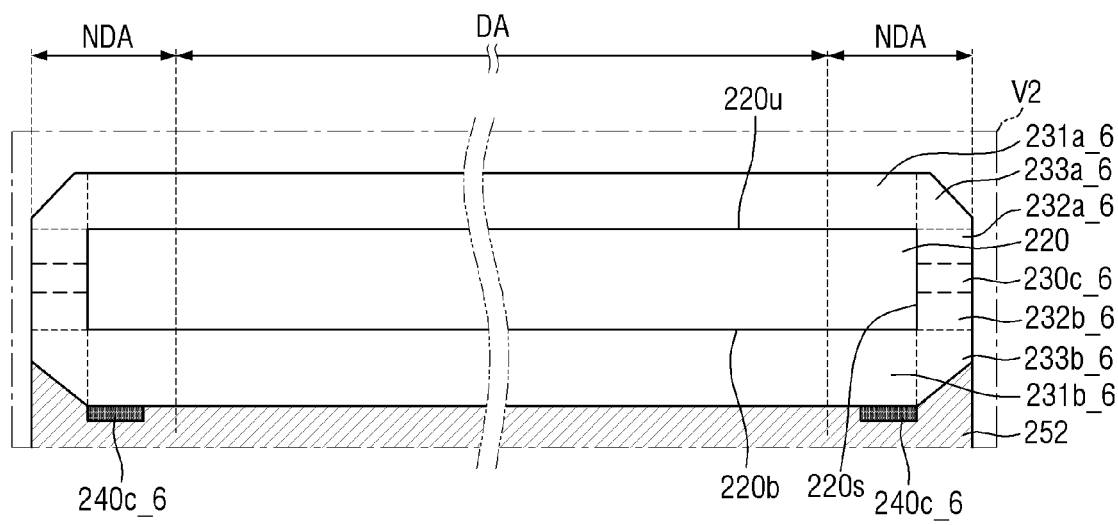

FIGS. 39 to 41 are cross-sectional views of embodiments of area V2 of FIG. 37.

Area V2 of FIG. 37, e.g., the area between the cover window protection layer 230_6 and the second coupling member 252 may be modified in a variety of ways. In the following description, modifications of area V2 of FIG. 37 will be described, and, the redundant descriptions will be omitted.

Referring to FIG. 39 in conjunction with FIG. 37, a light-blocking member 240a_6 that absorbs and blocks light is further disposed between the cover window protection layer 230_6 and the second coupling member 252.

According to this embodiment, the light-blocking member 240a_6 may be disposed on the lower surface of the second chamfered portion 232f_6 and the bottom protection portion 231b_6. The light-blocking member 240a_6 may overlap the cover window protection layer 230_6 and the cover window 220.

Although not shown in the drawings, the light-blocking member 240a_6 may be disposed along the edge of the cover window 220 and may overlap the non-display area NDA of the display panel 100.

Referring to FIG. 40 in conjunction with FIG. 37, a light-blocking member 240b_6 that absorbs and blocks light is further disposed between the cover window protection layer 230_6 and the second coupling member 252.

According to this embodiment, the light-blocking member 240b_6 may be disposed on the second chamfered portion 232f_6 but may not be disposed on the lower surface of the bottom protection portion 231b_6. The light-blocking member 240b_6 may not overlap the cover window 220. It should be understood that the invention is not limited thereto. When the second chamfered portion 232f_6 partially overlaps the cover window 220, the light-blocking member 240b_6 may partially overlap the cover window 220.

Although not shown in the drawings, the light-blocking member 240b_6 may be disposed along the edge of the cover window 220 and may overlap the non-display area NDA of the display panel 100.

Referring to FIG. 41 in conjunction with FIG. 37, a light-blocking member 240c_6 that absorbs and blocks light is further disposed between the cover window protection layer 230_6 and the second coupling member 252.

According to this embodiment, the light-blocking member 240c_6 may be disposed on the lower surface of the bottom protection portion 231b_6 but may not be disposed on the second chamfered portion 232f_6. The light-blocking member 240c_6 may overlap the cover window 220.

Although not shown in the drawings, the light-blocking member 240c_6 may be disposed along the edge of the cover window 220 and may overlap the non-display area NDA of the display panel 100.

According to one or more embodiment, it is possible to effectively protect the cover window 220 of the display device 10_6 by the cover window protection layer 230_6 covering the upper surface 220u and at least a portion of the side surface 220s of the cover window 220. In addition, the cover window 220 and the cover window protection layer 230_6 may be coupled with each other via a simpler thermocompression bonding process.

In addition, according to this embodiment, the display device 10_6 includes the cover window protection layer 230_6 disposed to surround an entirety of the cover window 220, so that it is possible to more stably protect the cover window 220 from an external shock.

In addition, according to this embodiment, the cover window protection layer 230_6 of the display device 10_6 includes the chamfered portions 231f_6 and 232f_6, so that it is possible to reduce or effectively prevent damage that may occur at the corner of the cover window protection layer 230_6.

Figure 42:
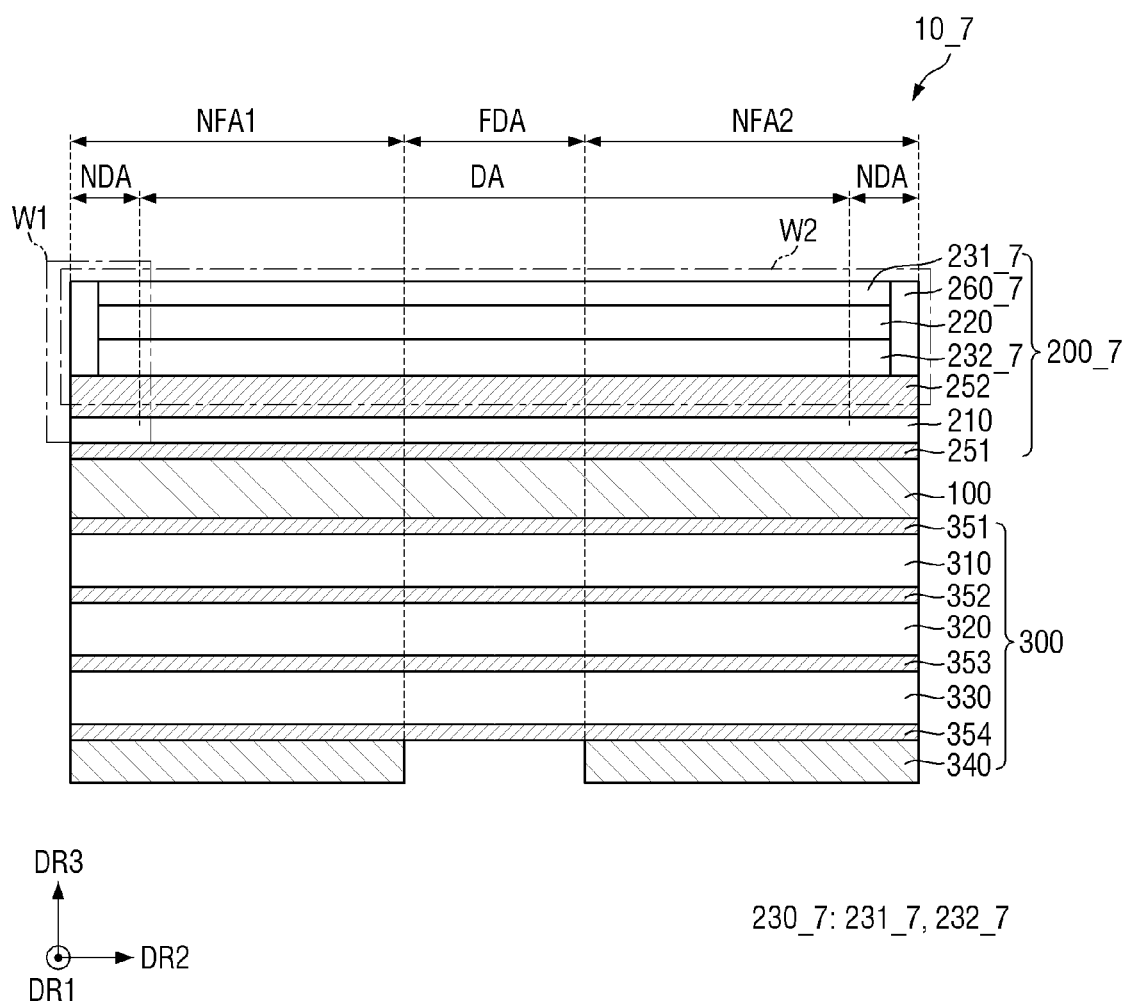
FIG. 42 is a cross-sectional view of an embodiment of a display device which is unfolded.
Figure 43:
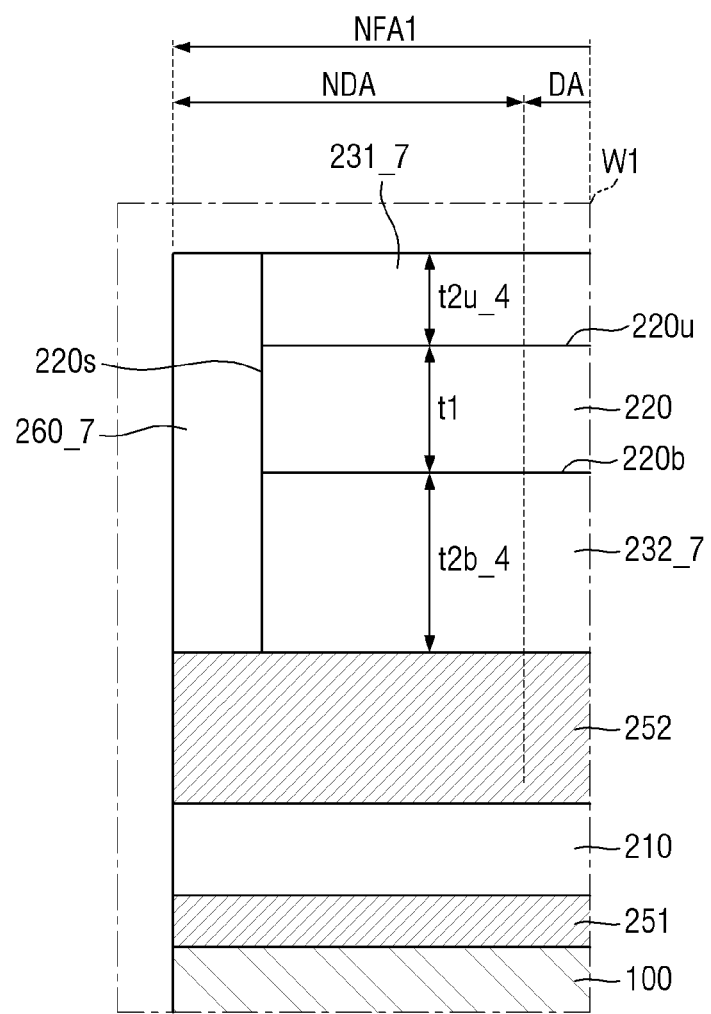
FIG. 43 is an enlarged view of an embodiment of area W1 of FIG. 42.

FIG. 42 is a cross-sectional view of an embodiment of a display device 10_7 which is unfolded. FIG. 43 is an enlarged view of an embodiment of area W1 of FIG. 42.

A display device 10_7 of FIGS. 42 and 43 is different from the display device 10 in that the display device 10_7 includes a front stack structure 200_7 having a different structure. Specifically, a cover window protection layer 230_7 included in the front stack structure 200_7 is disposed to surround to cover window 220.

According to this embodiment, the cover window protection layer 230_7 may include a first protection portion 231_7 in contact with the upper surface 220u of the cover window 220 and a second protection portion 232_7 in contact with the lower surface 220b of the cover window 220. According to this embodiment, the display device 10_7 may include an auxiliary cover window protection layer 260_7 (e.g., second window protection layer) disposed on the side surface 220s of the cover window 220. The side surface of the first protection portion 231_7 and the side surface of the second protection portion 232_7 may be aligned with the side surface 220s of the cover window 220 (e.g., coplanar with each other). The auxiliary cover window protection layer 260_7 may be disposed along each of the side surface of the first protection portion 231_7, the side surface of the second protection portion 232_7, and the side surface 220s of the cover window 220. That is to say, the auxiliary cover window protection layer 260_7 may be in contact with each of the first protection portion 231_7, the second protection portion 232_7, and the cover window 220. The auxiliary cover window protection layer 260_7 may be formed after forming the first protection portion 231_7 and the second protection portion 232_7 on the upper surface 220u and the lower surface 220b of the cover window 220, respectively. The auxiliary cover window protection layer 260_7 may be formed by, but is not limited to, injection molding.

The Young's modulus of the first protection portion 231_7 may be greater than the Young's modulus of the second protection portion 232_7. In an embodiment, for example, the Young's modulus of the first protection portion 231_7 may be approximately 3 GPa to approximately 10 GPa, and the Young's modulus of the second protection portion 232_7 may be approximately 1 GPa to approximately 2 GPa. The Young's modulus of the auxiliary cover window protection layer 260_7 may be smaller than the Young's modulus of the first protection portion 231_7 and the Young's modulus of the second protection portion 232_7.

In addition, the elongation percentage of the first protection portion 231_7 may be smaller than the elongation percentage of the second protection portion 232_7. In an embodiment, for example, the elongation percentage of the first protection portion 231_7 may be approximately 50% to approximately 100%, and the elongation percentage of the second protection portion 232_7 may be approximately 300% to approximately 500%. The elongation percentage of the auxiliary cover window protection layer 260_7 may be greater than the elongation percentage of the first protection portion 231_7 and the elongation percentage of the second protection portion 232_7.

The second coupling member 252 may be disposed on the rear side of the cover window protection layer 230_7. In addition, the polarizing member 210 may be disposed on the rear side of the second coupling member 252, and the second coupling member 252 may couple the polarizing member 210 with the cover window protection layer 230_7. The elements disposed on the rear side of the polarizing member 210 are identical to those of the display device 10 according to the above-described embodiment; and, therefore, the redundant descriptions will be omitted.

Figure 44:
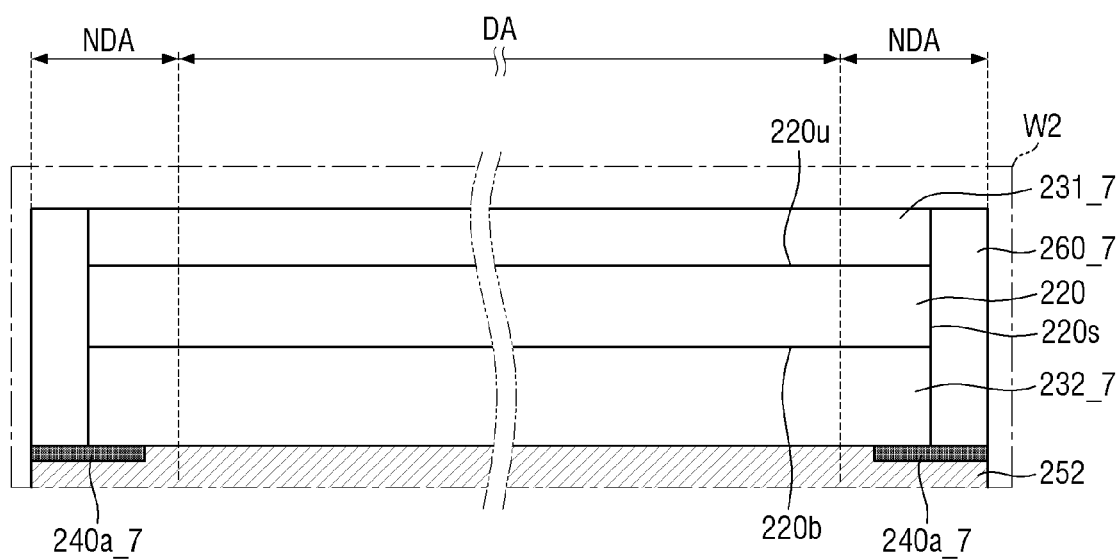
FIGS. 44 to 46 are cross-sectional views of embodiments area W2 of FIG. 42.
Figure 44:
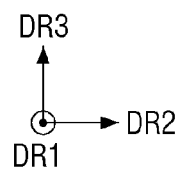
Figure 45:
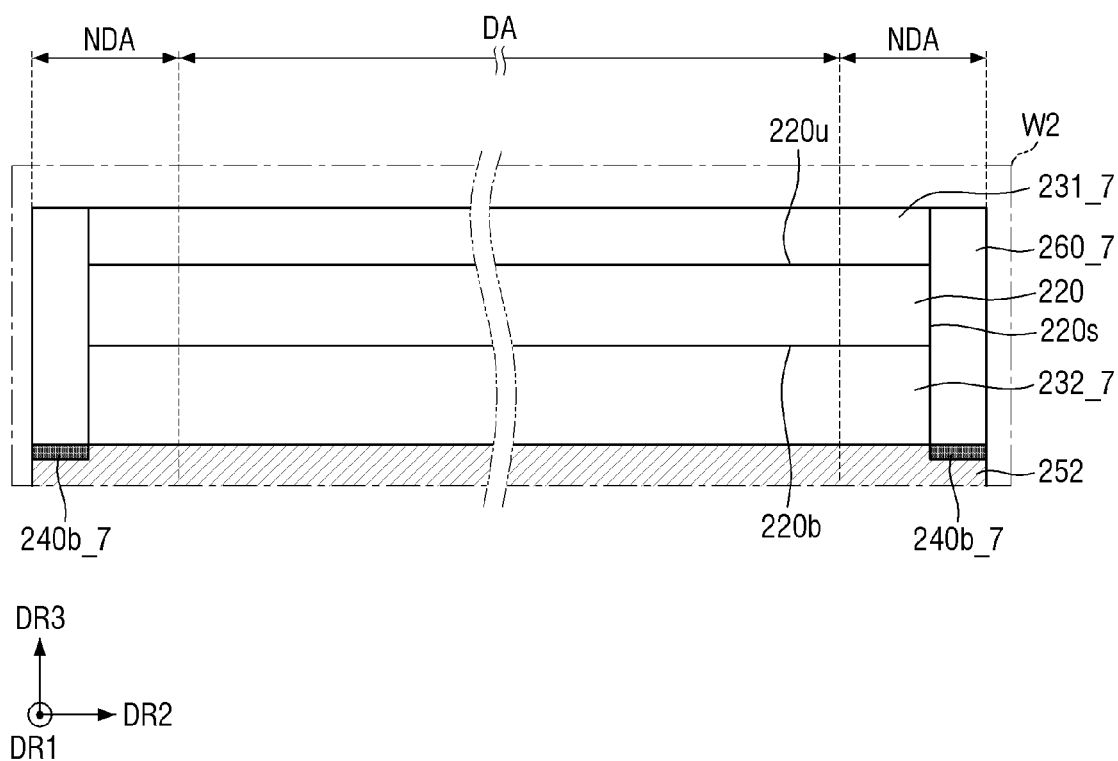
Figure 46:
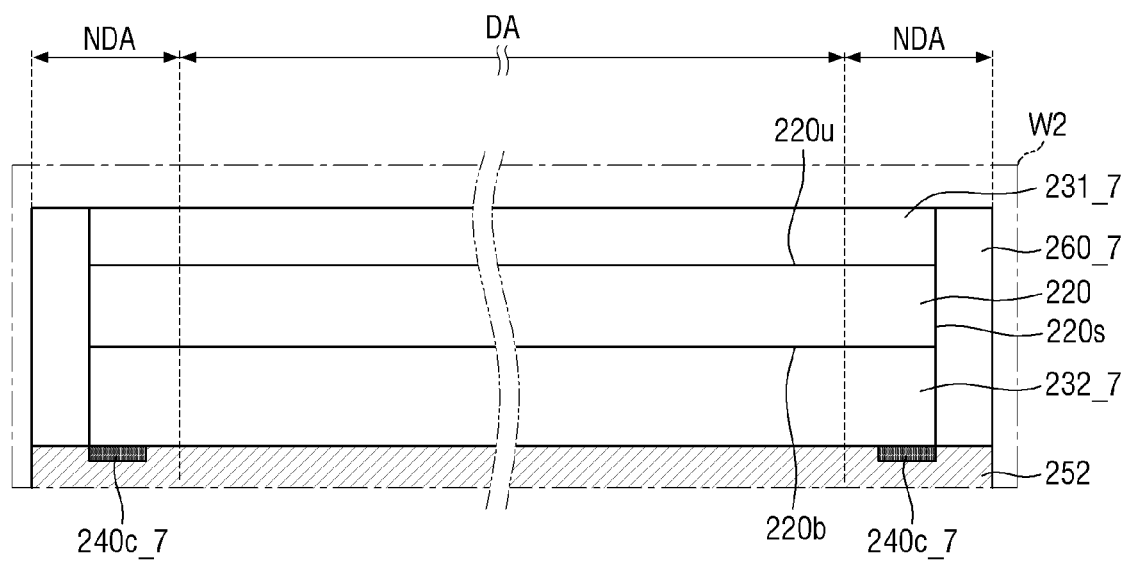

FIGS. 44 to 46 are cross-sectional views of embodiments of area W2 of FIG. 42.

Area W2 of FIG. 42, e.g., the area between the cover window protection layer 230_7 and the second coupling member 252 may be modified in a variety of ways. In the following description, modifications of area W2 of FIG. 42 will be described, and, the redundant descriptions will be omitted.

Referring to FIG. 44 in conjunction with FIG. 42, a light-blocking member 240a_7 that absorbs and blocks light is further disposed between the cover window protection layer 230_7 and the second coupling member 252.

According to this embodiment, the light-blocking member 240a_7 may be disposed on the lower surface of the second protection portion 232_7 and the auxiliary cover window protection layer 260_7. The light-blocking member 240a_7 may overlap the cover window protection layer 230_7 and the cover window 220. Specifically, the light-blocking member 240a_7 may be in contact with the second protection portion 232_7 and the auxiliary cover window protection layer 260_7 in the cover window protection layer 230_7. Although not shown in the drawings, the light-blocking member 240a_7 may be disposed along the edge of the cover window 220 and may overlap the non-display area NDA of the display panel 100.

Referring to FIG. 45 in conjunction with FIG. 42, a light-blocking member 240b_7 that absorbs and blocks light is further disposed between the cover window protection layer 230_7 and the second coupling member 252.

According to this embodiment, the light-blocking member 240b_7 may be disposed on the lower surface of the auxiliary cover window protection layer 260_7. The light-blocking member 240b_7 may overlap the auxiliary cover window protective layer 260_7 in the cover window protection layer 230_7 but may not overlap the first protection portion 231_7 and the second protection portion 232_7. In addition, the light-blocking member 240b_7 may not overlap the cover window 220. Although not shown in the drawings, the light-blocking member 240b_7 may be disposed along the edge of the cover window 220 and may overlap the non-display area NDA of the display panel 100.

Referring to FIG. 46 in conjunction with FIG. 42, a light-blocking member 240c_7 that absorbs and blocks light is further disposed between the cover window protection layer 230_7 and the second coupling member 252.

According to this embodiment, the light-blocking member 240c_7 may be disposed on the lower surface of the second protection portion 232_7. The light-blocking member 240c_7 may overlap the cover window 220, the first protection portion 231_7 and the second protection portion 232_7 but may not overlap the auxiliary cover window protection layer 260_7. Although not shown in the drawings, the light-blocking member 240c_7 may be disposed along the edge of the cover window 220 and may overlap the non-display area NDA of the display panel 100.

According to one or more embodiment, it is possible to effectively protect the cover window 220 of the display device 10_7 by the cover window protection layer 230_7 covering the upper surface 220u and at least a portion of the side surface 220s of the cover window 220. In addition, the cover window 220 and the cover window protection layer 230_7 may be coupled with each other via a simpler thermocompression bonding process.

In addition, according to this embodiment, the display device 10_7 includes the cover window protection layer 230_7 which includes the first protection portion 231_7 and the second protection portion 232_7 disposed to surround an entirety of the cover window 220 and the auxiliary cover window protection layer 260_7, so that it is possible to more stably protect the cover window 220 from an external shock.

Figure 47:
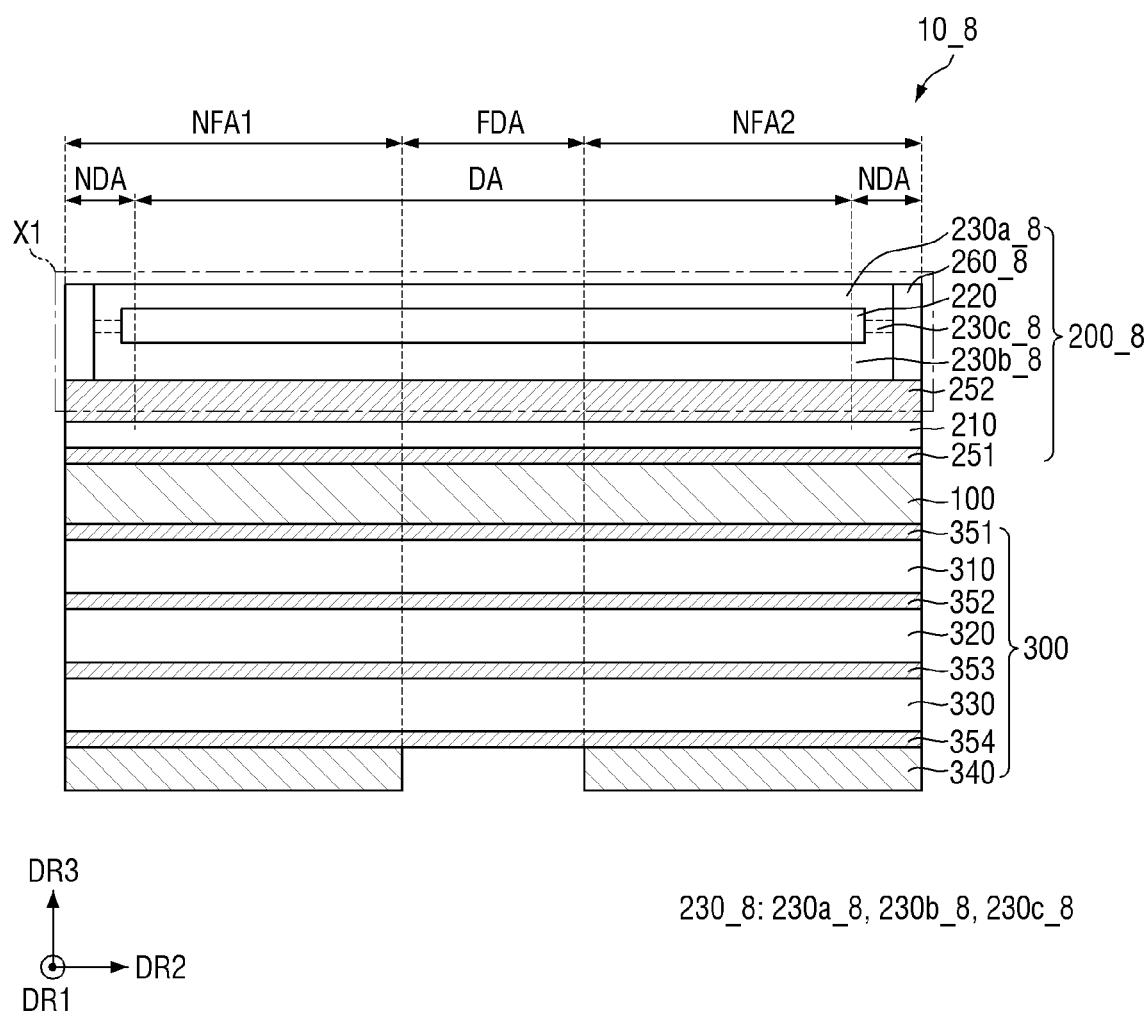
FIG. 47 is a cross-sectional view of an embodiment of a display device which is unfolded.

FIG. 47 is a cross-sectional view of an embodiment of a display device 10_8 which is unfolded.

Referring to FIG. 47, the display device 10_8 is different from the display device 10_4 with reference to FIGS. 30 and 31 in that an auxiliary cover window protection layer 260_8 disposed around the cover window protection layer 230_4 is further included in the display device 10_4 with reference to FIGS. 30 and 31.

According to this embodiment, the lower surface of the auxiliary cover window protection layer 260_8 may be in contact with the second coupling member 252, and the inner surface thereof may be in contact with the cover window protection layer 230_8. The auxiliary cover window protection layer 260_8 may be formed by, but is not limited to, injection molding.

Figure 48:
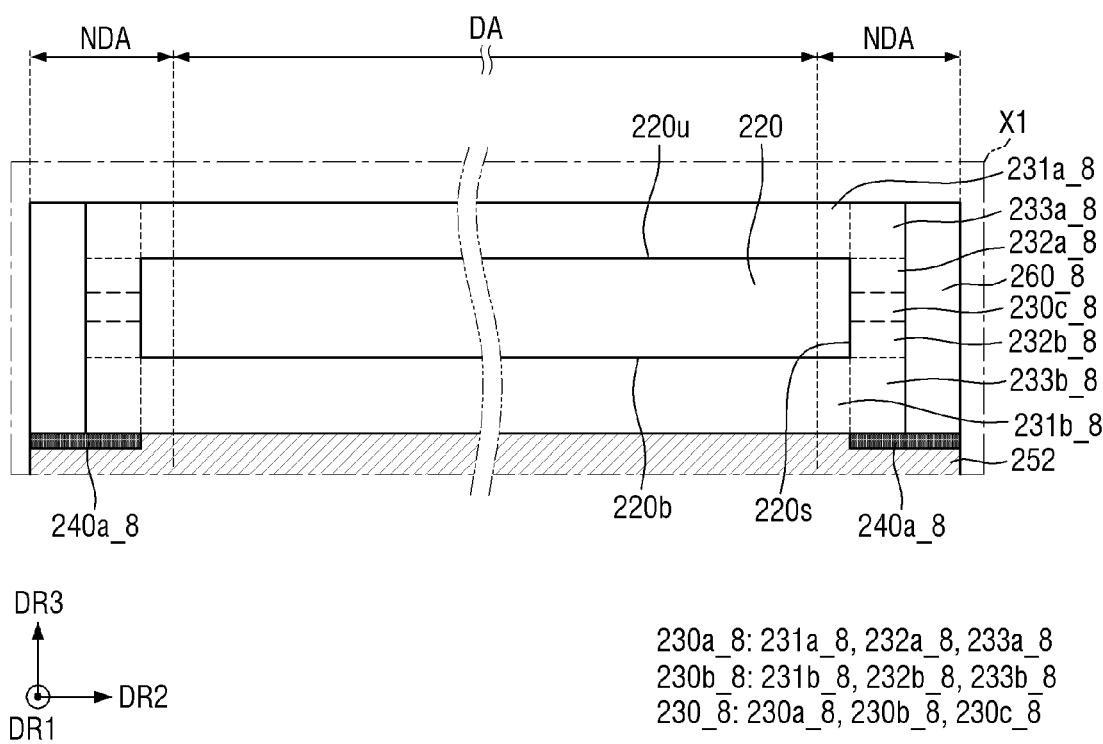
FIGS. 48 to 50 are cross-sectional views of embodiments of area X1 of FIG. 47.
Figure 49:
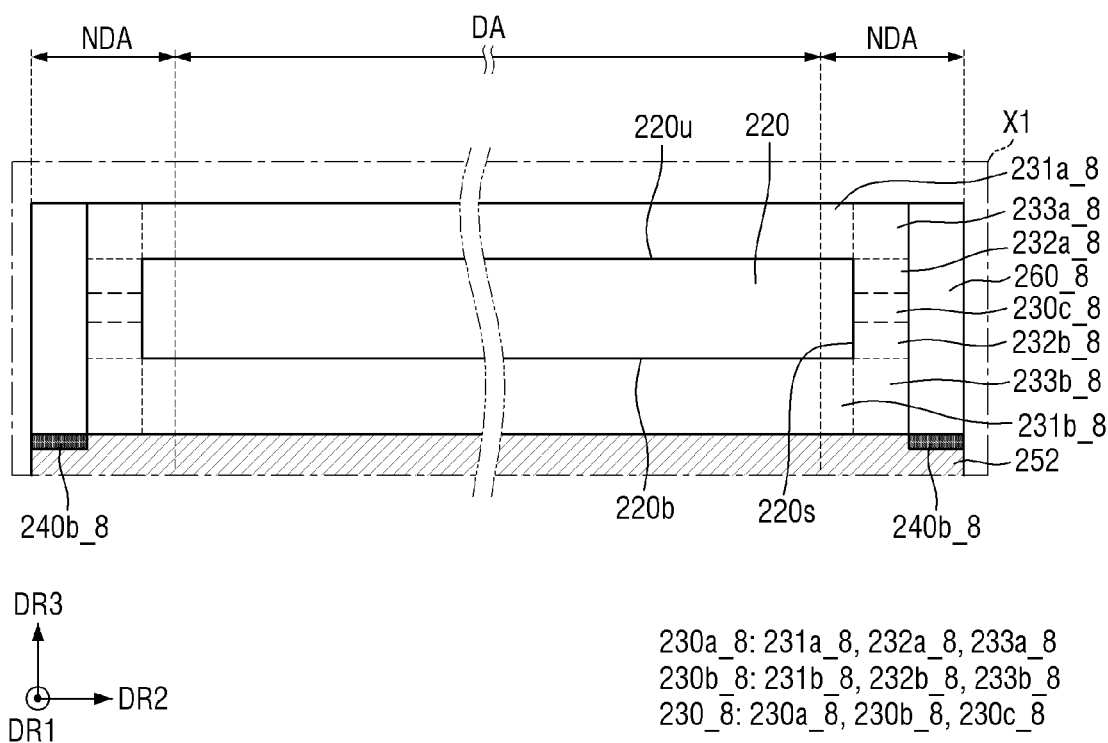
Figure 50:
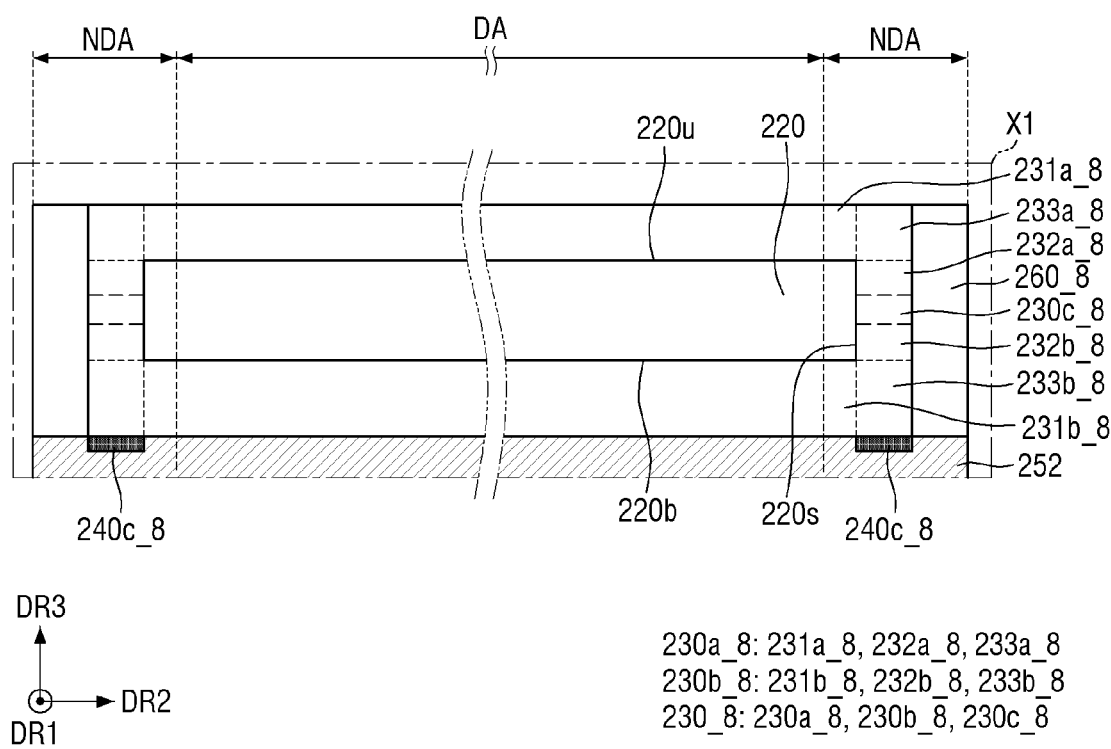

FIGS. 48 to 50 are cross-sectional views of embodiments of area X1 of FIG. 47.

The cover window protection layer 230_8 may cover an entirety of the upper surface 220u, the side surface 220s and the portion of the lower surface 220b and of the cover window 220. The cover window protection layer 230_8 may include a first protection portion 230a_8 disposed on the upper surface 220u of the cover window 220, a second protection portion 230b_8 disposed on the lower surface 220b of the cover window 220, and a third protection portion 230c_8 disposed on the side surface 220s of the cover window 220.

The first protection portion 230a_8 may include a top protection portion 231a_8 overlapping the upper surface 220u of the cover window 220, a first side protection portion 232a_8 overlapping the side surface 220s of the cover window 220, and a first corner protection portion 233a_8 disposed between the top protection portion 231a_8 and the first side protection portion 232a_8.

The second protection portion 230b_8 may include a bottom protection portion 231b_8 overlapping the lower surface 220b of the cover window 220, a second side protection portion 232b_8 overlapping the side surface 220s of the cover window 220 and a second corner protection portion 233b_8 disposed between the bottom protection portion 231b_8 and the second side protection portion 232b_8.

Area X1 of FIG. 47, e.g., the area between the cover window protection layer 230_8 and the second coupling member 252 may be modified in a variety of ways. In the following description, modifications of area X1 of FIG. 47 will be described, and, the redundant descriptions will be omitted.

Referring to FIG. 48 in conjunction with FIG. 47, a light-blocking member 240a_8 that absorbs and blocks light is further disposed between the cover window protection layer 230_8 and the second coupling member 252.

According to this embodiment, the light-blocking member 240a_8 may be disposed on the second protection portion 230b_8 and the lower surface of the auxiliary cover window protection layer 260_8. The light-blocking member 240a_8 may overlap the cover window protection layer 230_8 and the cover window 220, but is not limited thereto. The light-blocking member 240a_8 may not overlap the cover window 220. Specifically, the light-blocking member 240a_8 may be in contact with the second protection portion 230b_8 and the auxiliary cover window protection layer 260_8 in the cover window protection layer 230_8. Although not shown in the drawings, the light-blocking member 240a_8 may be disposed along the edge of the cover window 220 and may overlap the non-display area NDA of the display panel 100.

Referring to FIG. 49 in conjunction with FIG. 47, a light-blocking member 240b_8 that absorbs and blocks light is further disposed between the cover window protection layer 230_8 and the second coupling member 252.

According to this embodiment, the light-blocking member 240b_8 may be disposed on the lower surface of the auxiliary cover window protection layer 260_8. The light-blocking member 240b_8 may overlap the auxiliary cover window protective layer 260_8 in the cover window protection layer 230_8 but may not overlap the first protection portion 230a_8 and the second protection portion 230b_8. In addition, the light-blocking member 240b_8 may not overlap the cover window 220. Although not shown in the drawings, the light-blocking member 240b_8 may be disposed along the edge of the cover window 220 and may overlap the non-display area NDA of the display panel 100.

Referring to FIG. 50 in conjunction with FIG. 47, a light-blocking member 240c_8 that absorbs and blocks light is further disposed between the cover window protection layer 230_8 and the second coupling member 252.

According to this embodiment, the light-blocking member 240c_8 may be disposed on the lower surface of the second protection portion 230b_8. The light-blocking member 240c_8 may overlap the cover window 220, the first protection portion 230a_8 and the second protection portion 230a_8 but may not overlap the auxiliary cover window protection layer 260_8. Although not shown in the drawings, the light-blocking member 240c_8 may be disposed along the edge of the cover window 220 and may overlap the non-display area NDA of the display panel 100.

According to one or more embodiment, it is possible to effectively protect the cover window 220 of the display device 10_8 by the cover window protection layer 230_8 covering the upper surface 220u and at least a portion of the side surface 220s of the cover window 220. In addition, the cover window 220 and the cover window protection layer 230_8 may be coupled with each other via a simpler thermocompression bonding process.

In addition, according to this embodiment, the display device 10_8 includes the cover window protection layer 230_8 which includes the first protection portion 230a_8 and the second protection portion 230b_8 disposed to surround an entirety of the cover window 220 and the auxiliary cover window protection layer 260_8, so that it is possible to more stably protect the cover window 220 from an external shock.

The effects of the invention are not limited by the foregoing, and other various effects are anticipated herein.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
a display area and a non-display area which is adjacent to the display area;
a folding area and a non-folding area which is adjacent to the folding area;
a display panel in both the display area and the non-display area; and
a cover window structure facing the display panel, the cover window structure in both the display area and the non-display area and comprising:
a cover window comprising a first surface, a second surface which is opposite to the first surface and closer to the display panel than the first surface, and a third surface which is in the non-display area and connects the first surface with the second surface; and
a first window protection layer on the cover window, wherein
the first window protection layer comprises:
a first protection portion on the first surface of the cover window, and
a second protection portion on the third surface of the cover window which is in the non-display area,
the cover window structure extends across both the folding area and the non-folding area.

2. The display device of claim 1, wherein the third surface of the cover window is in direct contact with the second protection portion of the first window protection layer.

3. The display device of claim 2, further comprising:
an adhesive layer between the display panel and the cover window and coupling the display panel to the cover window,
wherein the second protection portion of the first window protection layer and the adhesive layer each extend along the third surface of the cover window and are in contact with the third surface of the cover window.

4. The display device of claim 3, further comprising in the non-display area:
a light-blocking member which is between the display panel and the first window protection layer and in contact with the adhesive layer.

5. The display device of claim 4, wherein the light-blocking member is in contact with the third surface of the cover window.

6. The display device of claim 4, wherein
the second protection portion of the first window protection layer and the adhesive layer covers an entirety of the third surface of the cover window, and
the light-blocking member is between the cover window and the adhesive layer.

7. The display device of claim 1, wherein
the second surface and the third surface of the cover window meet at an edge of the cover window, and
the first window protection layer further comprises a third protection portion which is extended from the second protection portion, along the second surface of the cover window and along the edge of the cover window.

8. The display device of claim 1, wherein the first window protection layer further comprises:
a corner protection portion which connects the first protection portion with the second protection portion, and
the corner protection portion including a chamfered portion which defines an edge of the first window protection layer.

9. The display device of claim 1, further comprising:
an adhesive layer between the display panel and the cover window and coupling the display panel to the cover window,
wherein the adhesive layer is in contact with the first window protection layer.

10. A display device comprising:
a display area and a non-display area which is adjacent to the display area;
a display panel in both the display area and the non-display area; and
a cover window structure facing the display panel, the cover window structure in both the display area and the non-display area and comprising:
a cover window comprising a first surface, a second surface which is opposite to the first surface and closer to the display panel than the first surface, and a third surface which is in the non-display area and connects the first surface with the second surface; and
a first window protection layer on the cover window, wherein the first window protection layer comprises:
a first protection portion on the first surface of the cover window,
a second protection portion on the third surface of the cover window which is in the non-display area,
a third protection portion facing the first protection portion with the cover window therebetween,
each of the third protection portion and the first protection portion having a Young's modulus, and
the Young's modulus of the third protection portion being smaller than the Young's modulus of the first protection portion.

11. The display device of claim 10, wherein the second protection portion comprises:
a first region extended from the first protection portion and having a Young's modulus which is the same Young's modulus as the first protection portion,
a second region extended from the third protection portion and having a Young's modulus which is the same Young's modulus as the third protection portion, and
a third region between the first region and the second region and having a Young's modulus which is smaller than the Young's modulus of the first protection portion and is greater than the Young's modulus of the third protection portion.

12. The display device of claim 11, wherein the first window protection layer further comprises:
a first chamfered portion including an inclined surface extended between the first protection portion and the second protection portion, and
a second chamfered portion including an inclined surface extended between the second protection portion and the third protection portion.

13. The display device of claim 10, wherein
each of the third protection portion and the first protection portion has a thickness, and
the thickness of the third protection portion is greater than the thickness of the first protection portion.

14. The display device of claim 10, further comprising in the non-display area:
a second window protection layer which surrounds the first window protection layer in a plan view.

15. The display device of claim 10, wherein
the first protection portion comprises a first material and the third protection portion comprises a second material which is different from the first material, and
the second protection portion is between the first protection portion and the third protection portion and comprises:
a first region comprising the first material but excluding the second material;
a second region comprising the second material but excluding the first material; and
a third region between the first region and the second region and comprising both the first material and the second material.

16. An electronic device comprising:
a display device comprising:
a display area and a non-display area which is adjacent to the display area;
a folding area and a non-folding area which is adjacent to the folding area;
a display panel in both the display area and the non-display area; and
a cover window structure facing the display panel, the cover window structure in both the display area and the non-display area and comprising:
a cover window comprising a first surface, a second surface which is opposite to the first surface and closer to the display panel than the first surface, and a third surface which is in the non-display area and connects the first surface with the second surface; and
a first window protection layer on the cover window, wherein
the first window protection layer comprises:
a first protection portion on the first surface of the cover window, and
a second protection portion on the third surface of the cover window which is in the non-display area, and
the cover window structure extends across both the folding area and the non-folding area.

* * * * *